United States Patent
Lee et al.

(10) Patent No.: US 8,877,626 B2
(45) Date of Patent: Nov. 4, 2014

(54) NONVOLATILE MEMORY DEVICE, METHOD OF MANUFACTURING THE NONVOLATILE MEMORY DEVICE, AND MEMORY MODULE AND SYSTEM INCLUDING THE NONVOLATILE MEMORY DEVICE

(71) Applicants: Jae-goo Lee, Suwon-si (KR);
Young-woo Park, Seoul (KR);
Byung-kwan You, Seoul (KR);
Dong-sik Lee, Yongin-si (KR);
Sang-yong Park, Seongnam-si (KR)

(72) Inventors: Jae-goo Lee, Suwon-si (KR);
Young-woo Park, Seoul (KR);
Byung-kwan You, Seoul (KR);
Dong-sik Lee, Yongin-si (KR);
Sang-yong Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/896,819

(22) Filed: May 17, 2013

(65) Prior Publication Data
US 2013/0252391 A1    Sep. 26, 2013

Related U.S. Application Data

(63) Continuation of application No. 13/100,488, filed on May 4, 2011, now Pat. No. 8,455,940.

(30) Foreign Application Priority Data

May 24, 2010 (KR) .......................... 10-2010-0048188
Aug. 20, 2010 (KR) .......................... 10-2010-0080886

(51) Int. Cl.
*H01L 21/3205* (2006.01)
*H01L 27/115* (2006.01)
*H01L 29/66* (2006.01)
*H01L 29/792* (2006.01)

(52) U.S. Cl.
CPC .... *H01L 29/66477* (2013.01); *H01L 27/11582* (2013.01); *H01L 27/11565* (2013.01); *H01L 27/11578* (2013.01); *H01L 29/7926* (2013.01)
USPC .................. 438/591; 257/288; 257/E29.309; 257/E29.262; 257/324; 438/216; 438/268

(58) Field of Classification Search
USPC ......................................................... 257/324
See application file for complete search history.

(56) References Cited

U.S. PATENT DOCUMENTS

| 7,679,133 B2 | 3/2010 | Son et al. |
| 8,236,650 B2 | 8/2012 | Son et al. |
| 8,455,940 B2 * | 6/2013 | Lee et al. .................... 257/324 |

(Continued)

FOREIGN PATENT DOCUMENTS

| CN | 101483194 A | 7/2009 |
| JP | 2009-088446 | 4/2009 |
| KR | 1020100001547 A | 1/2010 |

*Primary Examiner* — Victor A Mandala
*Assistant Examiner* — Christopher Johnson
(74) *Attorney, Agent, or Firm* — Myers Bigel Sibley & Sajovec, PA

(57) ABSTRACT

A nonvolatile memory device includes a substrate, a channel layer protruding from the substrate, a gate conductive layer surrounding the channel layer, a gate insulating layer disposed between the channel layer and the gate conductive layer, and a first insulating layer spaced apart from the channel layer and disposed on the top and bottom of the gate conductive layer. The gate insulating layer extends between the gate conductive layer and the first insulating layer.

10 Claims, 66 Drawing Sheets

(56) References Cited

U.S. PATENT DOCUMENTS

| | | |
|---|---|---|
| 8,492,828 B2 | 7/2013 | Son et al. |
| 2006/0001073 A1* | 1/2006 | Chen et al. .................... 257/314 |
| 2006/0214219 A1* | 9/2006 | Choi et al. .................... 257/315 |
| 2009/0242966 A1 | 10/2009 | Son et al. |
| 2009/0250762 A1 | 10/2009 | Liu et al. |
| 2010/0019310 A1 | 1/2010 | Sakamoto |
| 2010/0109065 A1 | 5/2010 | Oh et al. |
| 2011/0049606 A1 | 3/2011 | Ramaswamy et al. |

* cited by examiner

Inverse zigzag pattern   Zigzag pattern

NONVOLATILE MEMORY DEVICE, METHOD OF MANUFACTURING THE NONVOLATILE MEMORY DEVICE, AND MEMORY MODULE AND SYSTEM INCLUDING THE NONVOLATILE MEMORY DEVICE

REFERENCE TO PRIORITY APPLICATIONS

This application is a continuation of U.S. patent application Ser. No. 13/100,488, filed May 4, 2011, which claims the benefit of Korean Patent Application Nos. 10-2010-0048188, filed May 24, 2010, and 10-2010-0080886, filed Aug. 20, 2010, the disclosures of which are hereby incorporated herein by reference in their entireties.

BACKGROUND

The inventive concept relates to nonvolatile memory devices and methods of manufacturing the nonvolatile memory devices, and more particularly, to vertical nonvolatile memory devices, wherein a striation phenomenon in a channel layer is improved, a method of manufacturing the vertical nonvolatile memory device, and a memory module and system including the vertical nonvolatile memory device.

While manufacturing nonvolatile memory devices, methods of improving integrity by vertically stacking cell transistors included in each unit chip are being studied. Specifically a flash memory device may be highly integrated by vertically stacking cell transistors.

SUMMARY

The inventive concept provides a nonvolatile memory device, wherein a striation phenomenon in a channel layer is improved, and a method of manufacturing the nonvolatile memory device.

According to an aspect of the inventive concept, there is provided a nonvolatile memory device including: a substrate; a channel layer protruding from the substrate; a gate conductive layer surrounding the channel layer; a gate insulating layer disposed between the channel layer and the gate conductive layer; and a first insulating layer spaced apart from the channel layer and disposed on a top and bottom of the gate conductive layer, wherein the gate insulating layer may extend between the gate conductive layer and the first insulating layer.

The nonvolatile memory device may further include a second insulating layer directly contacting a top of the channel layer. Here, the second insulating layer may be disposed between the first insulating layer and the channel layer.

A thickness of the first insulating layer may be thicker than a thickness of the second insulating layer, in a direction perpendicular to the substrate.

The second insulating layer may surround the channel layer.

The nonvolatile memory device may further include: a separating insulating layer protruding from the substrate; and a supporting insulating layer protruding from the substrate and disposed between the channel layer and the separating insulating layer.

The gate insulating layer may be further formed between the first insulating layer and the channel layer.

The nonvolatile memory device may further include an air gap disposed between the first insulating layer and the channel layer.

The gate insulating layer may include a tunneling insulating layer, a charge storage layer, and a blocking insulating layer, which are sequentially stacked on a side wall of the channel layer.

The channel layer may be a pillar type channel layer. Alternatively, the channel layer may have a macaroni shape (hereinafter referred to as a macaroni type channel layer), and the nonvolatile memory device may further include an insulating layer filling inside the macaroni type channel layer.

The channel layer may include a lower channel layer tapered toward the substrate, and an upper channel layer tapered toward the lower channel layer. The lower and upper channel layers may be a continuously connected single body.

According to another aspect of the inventive concept, there is provided a nonvolatile memory device including: a substrate; a channel layer protruding from the substrate; a gate conductive layer surrounding the channel layer; a gate insulating layer disposed between the channel layer and the gate conductive layer; a first insulating layer spaced apart from the channel layer and disposed on a top and bottom of the gate conductive layer; a separating insulating layer protruding from the substrate and connected to the first insulating layer; and a supporting insulating layer protruding from the substrate and disposed between the channel layer and the separating insulating layer.

The gate insulating layer may extend between the gate conductive layer and the first insulating layer.

The nonvolatile memory device may further include a gate separation insulating layer formed between the gate insulating layer and the channel layer, wherein the gate separation insulating layer may extend between the gate conductive layer and the first insulating layer.

The separating insulating layer may be disposed between the channel layer and the supporting insulating layer.

The channel layer may be disposed in a zigzag pattern when viewed as a plan view. Here, the supporting insulating layer may be disposed in an inverse zigzag pattern in a space between the channel layer and the separating insulating layer when viewed as a plan view.

According to another aspect of the inventive concept, there is provided a memory module including a nonvolatile memory device, wherein the nonvolatile memory device includes: a substrate; a channel layer protruding from the substrate; a gate conductive layer surrounding the channel layer; a gate insulating layer disposed between the channel layer and the gate conductive layer; and a first insulating layer spaced apart from the channel layer and disposed on a top and bottom of the gate conductive layer, wherein the gate insulating layer may extend between the gate conductive layer and the first insulating layer.

According to another aspect of the inventive concept, there is provided a system that transmits or receives data to or from outside the system, the system including: a nonvolatile memory device, a memory component configured to store the data, an input/output device configured to input or output the data; and a controller configured to control the memory component and the input/output device. The nonvolatile memory device includes: a substrate; a channel layer protruding from the substrate; a gate insulating layer disposed between the channel layer and the gate conductive layer; and a first insulating layer spaced apart from the channel layer and disposed on a top and bottom of the gate conductive layer, wherein the gate insulating layer may extend between the gate conductive layer and the first insulating layer.

The system may be a personal digital assistant (PDA), a portable computer, a web tablet, a wireless phone, a mobile phone, a digital music player, a memory card, a navigation, a portable multimedia player (PMP), a solid state disk (SSD), or a household appliance.

According to another aspect of the inventive concept, there is provided a method of manufacturing a nonvolatile memory device, the method including: alternately stacking a plurality of sacrificial insulating layers and a plurality of first insulating layers on a substrate; forming a plurality of channel holes by etching the plurality of sacrificial insulating layers and the plurality of first insulating layers; forming sacrificial spacers on each side wall of the plurality of channel holes; forming channel layers contacting the sacrificial spacers; forming a plurality of wordline recesses by etching the plurality of sacrificial insulating layers and the plurality of first insulating layers; etching the plurality of sacrificial insulating layers and the sacrificial spacers so that side walls of the channel layers are exposed; forming a gate insulating layer on the side walls of the channel layers; and forming a gate conductive layer on the gate insulating layer.

The method may further include, between the forming of the channel layers and the forming of the wordline recess: forming a dummy hole by etching the plurality of sacrificial insulating layers and the plurality of first insulating layers; and forming a supporting insulating layer filling the dummy hole.

The method may further include, after the forming of the channel layers, forming a second insulating layer on the channel layers.

The forming of the second insulating layer may include: etching a part of a top of the sacrificial spacers so that top side walls of the channel layers are exposed; and forming the second insulating layer contacting a top of the channel layers and the top side walls of the channel layers.

According to another aspect of the inventive concept, there is provided a nonvolatile memory device including: a substrate, lower gate conductive layers stacked on the substrate; upper gate conductive layers stacked on the lower gate conductive layers; a channel layer penetrating through the lower and upper gate conductive layers; a gate insulating layer disposed between the lower and upper gate conductive layers and the channel layer; and a mask layer formed between the lower gate conductive layers and the upper gate conductive layers.

The mask layer may include silicon (Si) or silicon germanium (SiGe).

The nonvolatile memory device may further include a stopping layer directly on the substrate. The stopping layer may include aluminum oxide (Al2O3), tantalum nitride (TaN), or silicon carbide (SiC).

The channel layer may include a lower channel layer tapered toward the substrate, and an upper channel layer tapered toward the lower channel layer. The lower and upper channel layers may be a continuously connected single body.

According to another aspect of the inventive concept, there is provided a method of manufacturing a nonvolatile memory device, the method including: alternately stacking a plurality of lower sacrificial insulating layers and a plurality of lower insulating layers on a substrate; forming at least one lower channel hole by etching the plurality of lower sacrificial insulating layers and the plurality of lower insulating layers; closing the lower channel holes; alternately stacking a plurality of upper sacrificial insulating layers and a plurality of upper insulating layers on the lower channel layer; forming at least one upper channel hole by etching the plurality of upper sacrificial insulating layers and the plurality of upper insulating layers; opening the lower channel hole; and simultaneously forming a lower channel layer and an upper channel layer respectively filling the lower channel hole and the upper channel hole.

The closing of the lower channel hole may include forming a closed insulating layer filling the lower channel hole.

The closing of the lower channel hole may further include, before the forming of the closed insulating layer, forming a sacrificial spacer on a side wall of the lower channel hole. Here, the opening of the lower channel hole may include exposing the substrate by etching the lower insulating layer filled in the lower channel hole.

The closing of the lower channel hole may include closing the lower channel hole via a selective growth process of the mask layer formed on the top side wall of the lower channel hole.

An air gap may be formed between the mask layer and the substrate by closing the lower channel hole.

The mask layer may include Si or SiGe, and the lower channel hole may be closed via a selective epitaxial growth process of the mask layer.

The closing of the lower channel hole may further include oxidizing the mask layer.

The opening of the lower channel hole may include exposing the substrate by etching the mask layer.

The nonvolatile memory device may further include a stopping layer disposed directly on the substrate, wherein the stopping layer may prevent the substrate from growing during the selective epitaxial growth.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
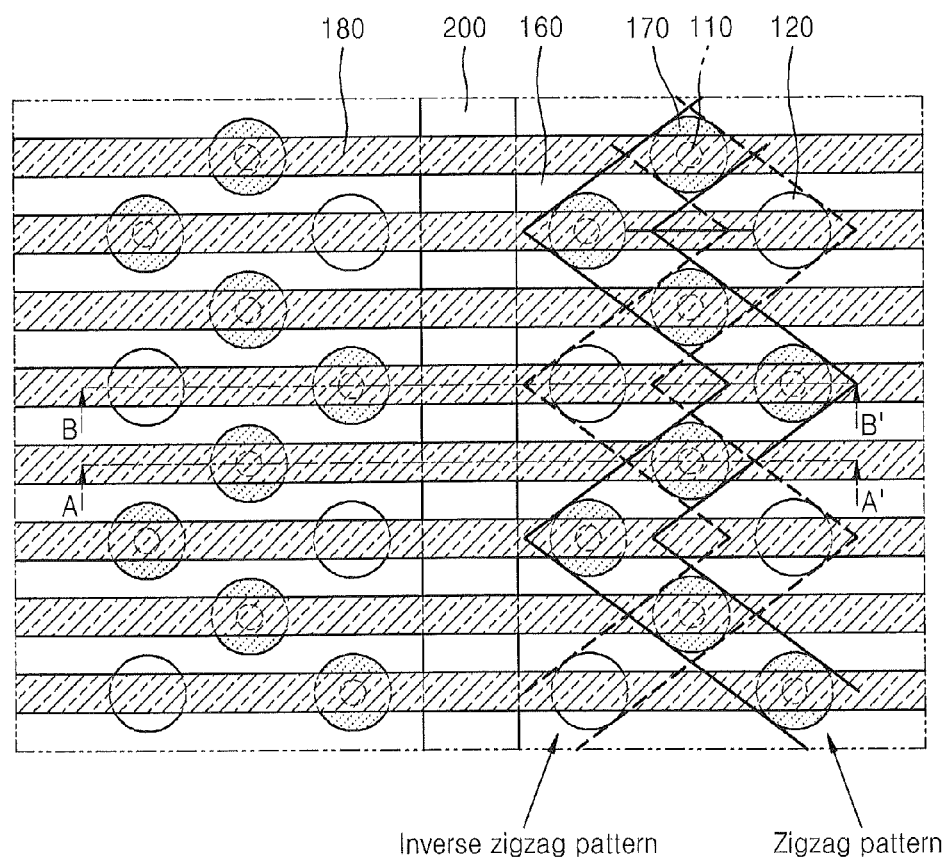
FIG. 1 is a plan view schematically illustrating a nonvolatile memory device according to an exemplary embodiment of the inventive concept.

The attached drawings for illustrating exemplary embodiments of the inventive concept are referred to in order to gain a sufficient understanding of the exemplary embodiments, the merits thereof, and the objectives accomplished by the implementation of the exemplary embodiments.

Hereinafter, the exemplary embodiments will be described in detail with reference to the attached drawings. Like reference numerals in the drawings denote like elements, and shapes of elements may vary.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Embodiments of the inventive concept are described herein with reference to cross-sectional illustrations that are schematic illustrations of idealized embodiments (and intermediate structures) of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing.

Figure 2:
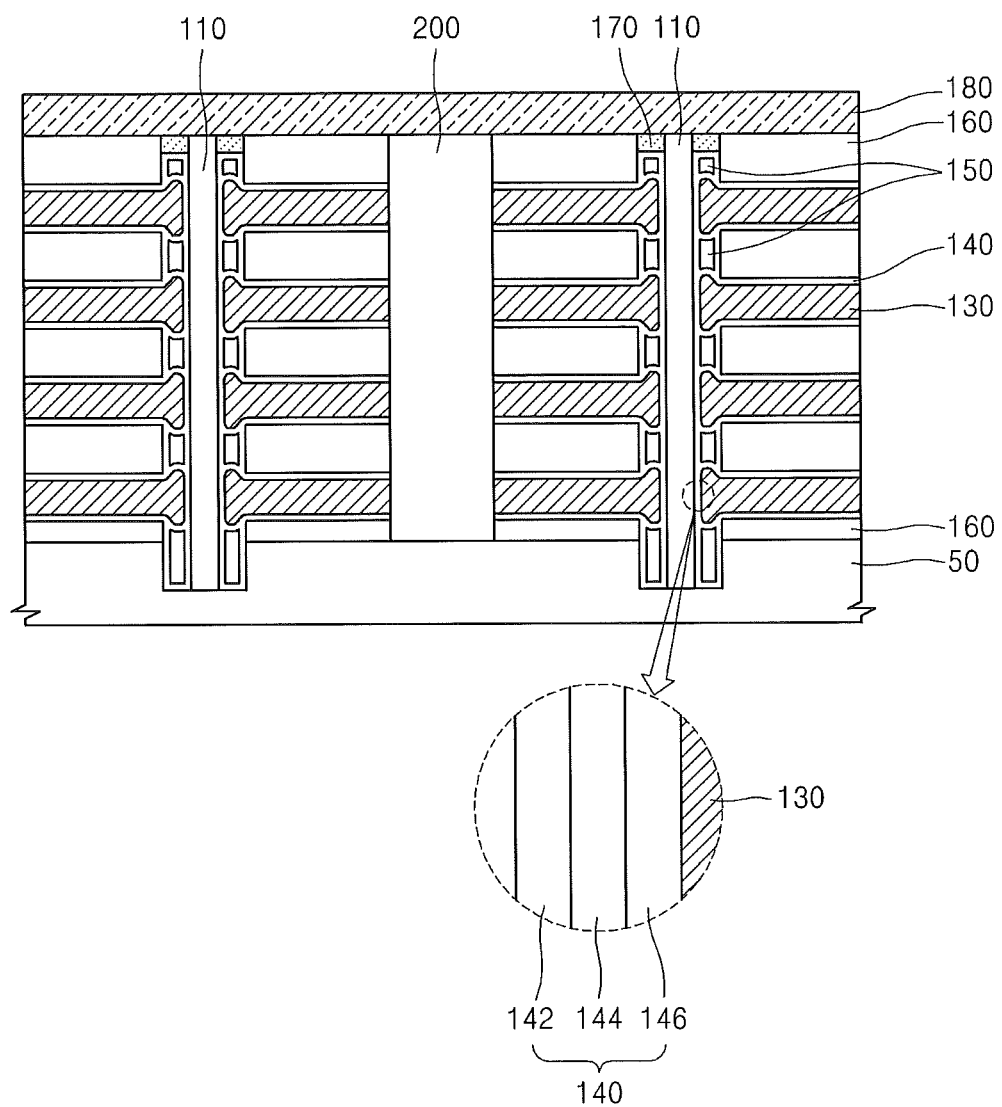
FIG. 2 is a cross-sectional view taken along a line A-A' of FIG. 1.
Figure 3:
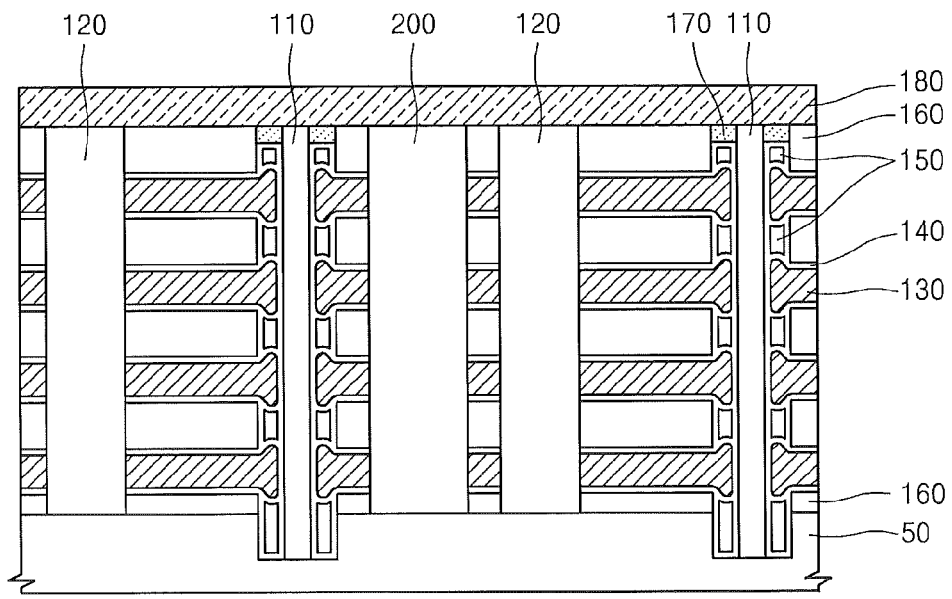
FIG. 3 is a cross-sectional view taken along a line B-B' of FIG. 1.

FIG. 1 is a plan view schematically illustrating a nonvolatile memory device according to an exemplary embodiment of the inventive concept, FIG. 2 is a cross-sectional view taken along a line A-A' of FIG. 1, and FIG. 3 is a cross-sectional view taken along a line B-B' of FIG. 1.

Referring to FIGS. 1 through 3, the nonvolatile memory device may include a substrate 50, channel layers 110, supporting insulating layers 120, gate conductive layers 130, gate insulating layers 140, air gaps 150, separating insulating layers 200, first insulating layers 160, second insulating layers 170, and bitline conductive layers 180.

Referring to FIG. 1, the channel layers 110 may be disposed in zigzag patterns. Such channel layers 110 may be disposed to surround the supporting insulating layer 120. In detail, the channel layers 110 and the supporting insulating layers 120 may be disposed between the separating insulating layers 200, and the channel layers 110 between the separating insulating layers 200 may be disposed in zigzag patterns. The supporting insulating layer 120 may be disposed in a space between the channel layer 110 and the separating insulating layer 200. In other words, each of the supporting insulating layers 120 may be disposed to be surrounded by the separating insulating layer 200 and the channel layers 110, and thus the supporting insulating layers 120 between the separating insulating layers 200 may be disposed in inverse zigzag patterns.

Referring to FIGS. 2 and 3, the substrate 50 may include a semiconductor material, such as a IV group semiconductor, a III-V group compound semiconductor, or a II-VI group oxide semiconductor. For example, the IV group semiconductor may include silicon, germanium, or silicon-germanium. The substrate 50 may include a bulk wafer, an epitaxial layer, a silicon-on-insulator (SOI) layer, and/or a semiconductor-on-insulator (SEOI) layer.

The channel layer 110 may protrude from the substrate 50 perpendicular to the substrate 50. For example, the channel layers 110 may be an epitaxial layer having a multi or single crystal structure. Also, the channel layers 110 may include a silicon material or a silicon-germanium material. In FIGS. 1 through 3, the channel layer 110 is a pillar type channel layer, but a type of the channel layer 110 is not limited thereto. In other words, the channel layer 110 may be a macaroni type channel layer, and at this time, the nonvolatile memory device may further include a pillar insulating layer (not shown) filling the macaroni type channel layer. A structure of the macaroni type channel layer will be described later with reference to FIG. 75.

The gate conductive layers 130 may be stacked on a side of the channel layer 110. In detail, the first insulating layers 160 and the gate conductive layers 130 may be alternately stacked on the side of the channel layer 110 while surrounding the channel layer 110. The gate conductive layer 130 may include at least one material selected from the group consisting of polysilicon, aluminum (Al), ruthenium (Ru), tantalum nitride (TaN), titanium nitride (TiN), tungsten (W), tungsten nitride (WN), hafnium nitride (HfN), and tungsten silicide (WSi).

The first insulating layer 160 is spaced apart from the channel layer 110, and may be disposed on a top and bottom of the gate conductive layer 130. In detail, the first insulating layer 160 may be disposed between the gate conductive layers 130, and on the gate conductive layers 130. A thickness of a topmost first insulating layer from among the first insulating layers 160 may be thicker than thicknesses of remaining first insulating layers. Moreover, a thickness of a bottommost first insulating layer from among the first insulating layers 160 may be thicker than thicknesses of remaining first insulating layers.

The second insulating layer 170 may directly contact a top of the channel layer 110. In detail, the second insulating layer 170 may be directly disposed in an area between the first insulating layer 160 and the channel layer 110. For example, the second insulating layer 170 may be disposed between the topmost first insulating layer of the first insulating layers 170 and the channel layer 110. Also, the second insulating layer 170 may be disposed between the gate insulating layer 140 and the bitline conductive layer 180. The first insulating layer 160 and the second insulating layer 170 may substantially have the same etch selectivity. A thickness of the first insulating layer 160 may be thicker than a thickness of the second insulating layer 170. In detail, the thickness of the second insulating layer 170 may be thinner than the thickness of the first insulating layer 160 in a direction perpendicular to the substrate 50. When the second insulating layer 170 is viewed in a plan view as FIG. 1, the second insulating layer 170 may be seen to have a ring structure surrounding the channel layer 110.

The gate insulating layers 140 may be disposed between the gate conductive layers 130 and the channel layer 110. In detail, each of the gate insulating layers 140 may surround the gate conductive layer 130. Accordingly, each of the gate insulating layers 140 may be disposed between the gate conductive layer 130 and the first insulating layer 160, and between the gate conductive layer 130 and the channel layer 110. Also, the gate insulating layer 140 may surround a side of the channel layer 110.

The gate insulating layer 140 may include a tunneling insulating layer 142, a charge storage layer 144, and a blocking insulating layer 146, which are sequentially stacked on the side of the channel layer 110. The tunneling insulating layer 142, the charge storage layer 144, and the blocking insulating layer 146 may form a storage medium.

Each of the tunneling insulating layer 142, the charge storage layer 144, and the blocking insulating layer 146 may include at least one material selected from the group consisting of a silicon oxide ($SiO_2$) layer, a silicon oxynitride (SiON) layer, a silicon nitride ($Si_3N_4$) layer, an aluminum oxide ($Al_2O_3$) layer, an aluminum nitride (AlN) layer, a hafnium oxide ($HfO_2$) layer, a hafnium silicon oxide (HfSiO) layer, a hafnium silicon oxynitride (HfSiON) layer, a hafnium oxynitride (HfON) layer, a hafnium aluminum oxide (HfAlO) layer, a zirconium oxide ($ZrO_2$) layer, a tantalum oxide ($Ta_2O_3$) layer, a hafnium tantalum oxide ($HfTa_xO_y$) layer, a lanthanum oxide (LaO) layer, a lanthanum aluminum oxide (LaAlO) layer, a lanthanum hafnium oxide (LaHfO) layer, and a hafnium aluminum oxide (HfAlO) layer. For example, the tunneling insulating layer 142 may include a silicon oxide layer, the charge storage layer 144 may include a silicon nitride layer, and the blocking insulating layer 146 may include a metal oxide layer.

In a direction perpendicular to the substrate 50, the air gaps 150 may be disposed between the gate conductive layers 130, or between a topmost gate conductive layer from among the gate conductive layers 130 and the second insulating layer 170. The air gaps 150 may be formed by depositing the gate insulating layer 140 having poor step coverage while manufacturing the nonvolatile memory device. In a direction parallel to the substrate 50, the air gaps 150 may be disposed between the first insulating layers 160 and the channel layer 110. Also, the gate insulating layer 140 may be formed between the air gaps 150 and the channel layer 110 and/or between the air gaps 150 and the first insulating layer 160.

The separating insulating layer 200 may be disposed between the channel layers 110, and may protrude in a direction perpendicular to the substrate 50. The separating insulating layer 200 may be connected to the first insulating layer 160. The bitline conductive layer 180 may be formed on the channel layer 110, or may extend in a direction parallel to the substrate 50. The bitline conductive layer 180 may contact the first insulating layer 160, the second insulating layer 170, and the separating insulating layer 200.

The supporting insulating layer 120 may be disposed between the channel layer 110 and the separating insulating layer 200, and may protrude in a direction perpendicular to the substrate 50. The supporting insulating layer 120 may be connected to the first insulating layer 160. In detail, only the first insulating layer 160 may be disposed between the supporting insulating layer 120 and the separating insulating layer 200. The bitline conductive layer 180 may contact the first insulating layer 160, the second insulating layer 170, the separating insulating layer 200, and the supporting insulating layer 120. The supporting insulating layer 120 and the first insulating layer 160 may substantially have the same etch selectivity.

Figure 4:
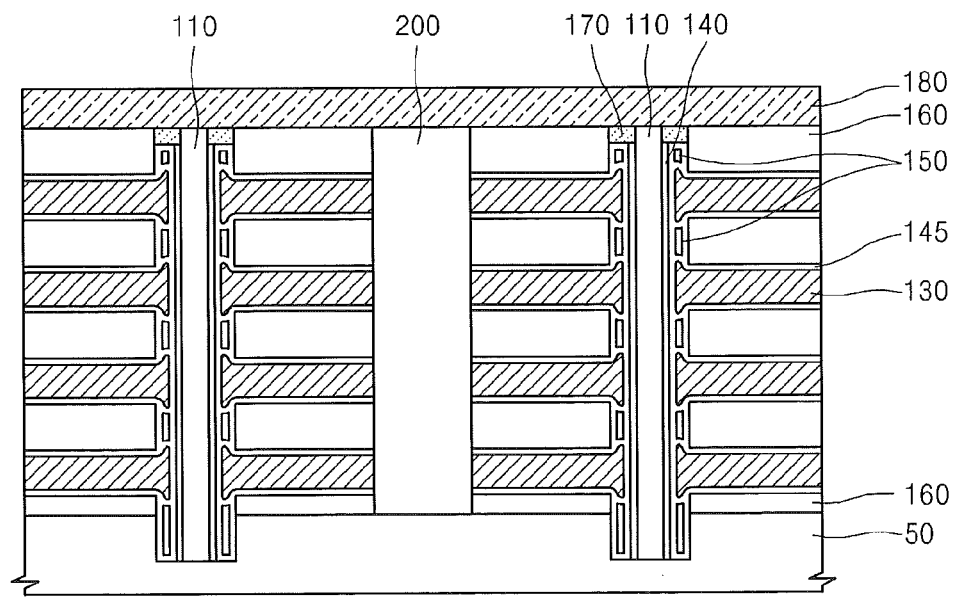
FIG. 4 is a cross-sectional view schematically illustrating a nonvolatile memory device according to an exemplary embodiment of the inventive concept.

FIG. 4 is a cross-sectional view schematically illustrating a nonvolatile memory device according to an exemplary embodiment of the inventive concept. The nonvolatile memory device according to the current embodiment is a partial modification of the nonvolatile memory device of FIG. 2. Overlapping descriptions thereof will not be repeated.

Referring to FIG. 4, the gate insulating layer 140 may extend in a direction perpendicular to the substrate 50, between the second insulating layer 170 and the substrate 50. Accordingly, the gate insulating layer 140 is not only formed between the gate conductive layer 130 and the channel layer 110, but also between the first insulating layers 160 and the channel layer 110. In detail, the gate insulating layer 140 may have a ring structure surrounding the channel layer 110.

The nonvolatile memory device may further include a gate separation insulating layer 145 surrounding the gate conductive layer 130. The gate separation insulating layer 145 may be formed between the gate conductive layer 130 and the channel layer 110. Also, the gate separation insulating layer 145 may extend between the gate conductive layer 130 and the first insulating layer 160.

The gate separation insulating layer 145 may include aluminum oxide ($Al_2O_3$) or titanium nitride (TiN). Selectively, a storage medium may be formed by the gate insulating layer 140 and the gate separation insulating layer 145. In addition, the air gap 150 may be formed between the first insulating layers 160 and the gate insulating layer 140 when forming the gate separation insulating layer 145.

FIGS. 5 through 14B are cross-sectional views for describing a method of manufacturing a nonvolatile memory device, according to an exemplary embodiment of the inventive concept. The method is used to manufacture the nonvolatile memory device of FIG. 2, and thus overlapping descriptions thereof will not be repeated.

Figure 5:
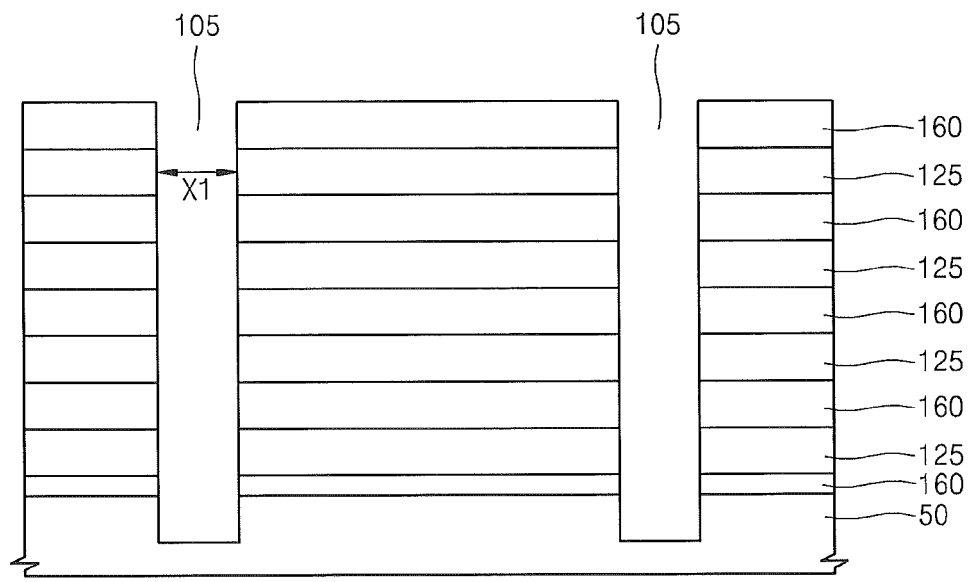
FIGS. 5 through 14B are cross-sectional views for describing a method of manufacturing a nonvolatile memory device, according to an exemplary embodiment of the inventive concept.

Referring to FIG. 5, a plurality of sacrificial insulating layers 125 and the plurality of first insulating layers 160 are alternately stacked on the substrate 50. For example, the sacrificial insulating layers 125 may include a silicon nitride, and at this time, the first insulating layers 160 may include a silicon oxide or silicon germanium to have an etch selectivity with the sacrificial insulating layers 125. Alternatively, the sacrificial insulating layers 125 may include silicon germanium, and at this time, the first insulating layers 160 may include a silicon oxide or a silicon nitride. However, materials included in the sacrificial insulating layers 125 and the first insulating layers 160 are not limited thereto, and the sacrificial insulating layers 125 may include a material having a different etch selectivity from the first insulating layers 160.

Although not illustrated in FIG. 5, thicknesses of a topmost sacrificial insulating layer and bottommost sacrificial insulating layer of the sacrificial insulating layers 125 may be thicker than thicknesses of remaining sacrificial insulating layers of the sacrificial insulating layers 125. As will be described later with reference to FIG. 74, the thicknesses of the topmost and bottommost sacrificial insulating layers respectively determine thicknesses of a string selection transistor SST of FIG. 74 and a ground selection transistor GST of FIG. 74. Accordingly, the topmost and bottommost sacrificial insulating layers may be thicker than the other sacrificial insulating layers so that a sufficient current is supplied to a memory cell string 11 of FIG. 74.

Then, a plurality of channel holes 105 are formed by etching the sacrificial insulating layers 125 and the first insulating layers 160. In detail, the sacrificial insulating layers 125 and the first insulating layers 160 may be etched by using an anisotropy etching process, such as a reactive ion etching process. Over-etching may occur by excessively performing the anisotropy etching process, and as a result, a part of the substrate 50 may be etched. The channel hole 150 may have a cylindrical shape having a diameter X1 in the range from 30 nm to 350 nm. Although not illustrated in FIG. 5, the channel holes 105 may be tapered toward the substrate 50.

Figure 6:
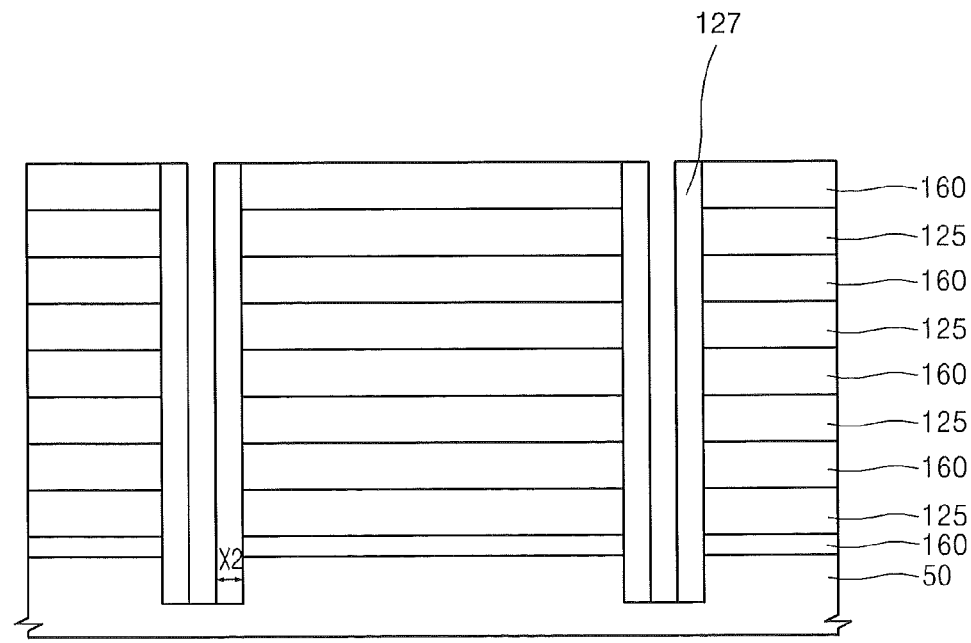

Referring to FIG. 6, a sacrificial spacer 127 is formed on each side wall of the channel holes 105. The sacrificial spacer 127 surrounds the side wall of the channel hole 105, and may be formed of a material having a same etch selectivity as the sacrificial insulating layer 125. Also, the sacrificial spacer 127 may have a thickness X2 in the range from 5 nm to 50 nm.

The sacrificial spacer 127 may be formed of the same material as the sacrificial insulating layer 125. For example, the sacrificial spacer 127 and the sacrificial insulating layer 125 may include a silicon nitride, a silicon oxide, silicon carbide, or silicon germanium.

Figure 7:
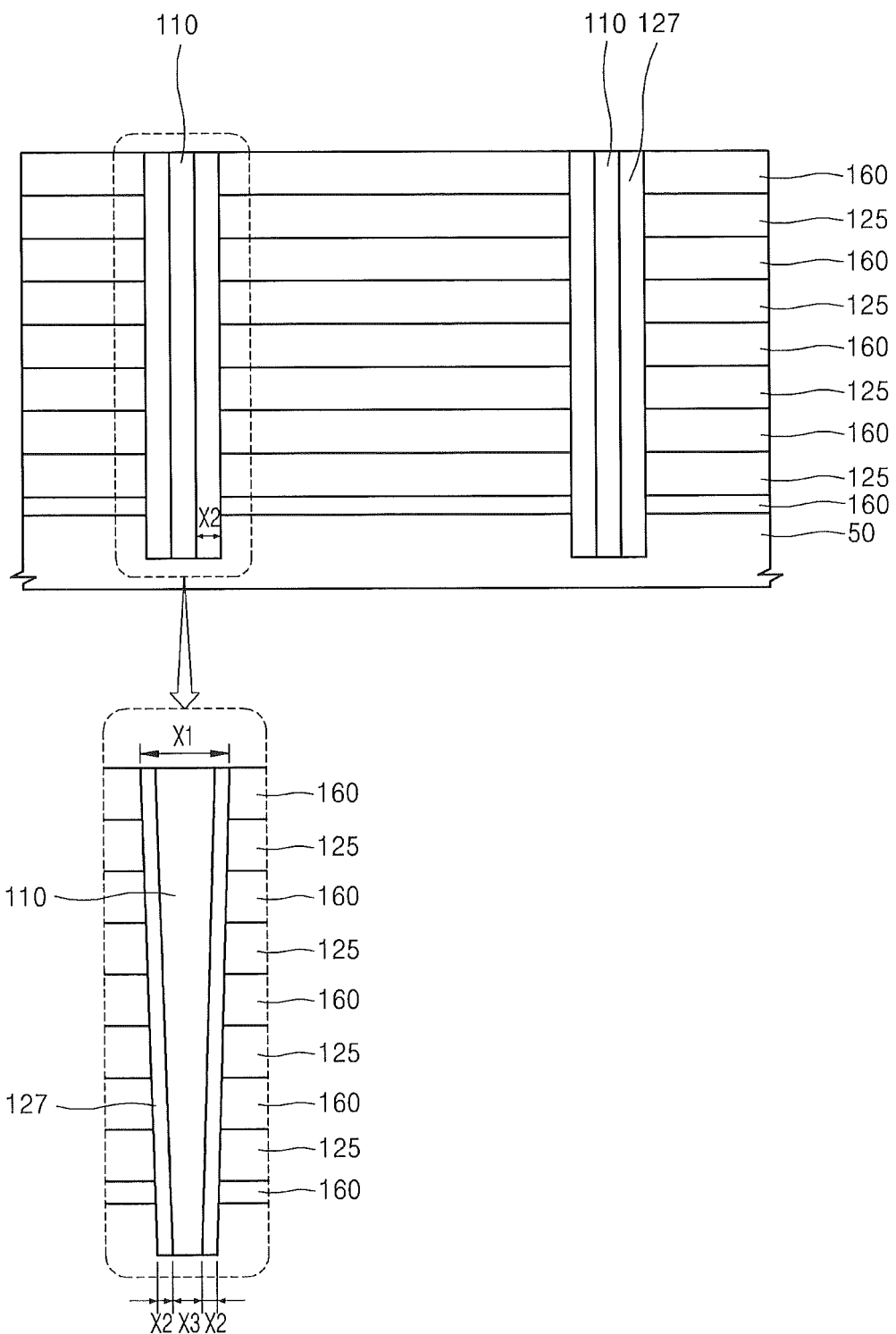

Referring to FIG. 7, the channel layer 110 contacting the sacrificial spacer 127 is formed. The channel layer 110 may have a cylindrical shape having a diameter X3 in the range from 20 nm to 150 nm, or a tapered conical shape. In detail, for example, when the channel hole 105 is tapered, the channel hole 105 may have a conical shape having the diameter X1 from 30 nm to 350 nm. Here, the sacrificial spacer 127 may have the thickness X2 from 5 nm to 50 nm, and thus the channel layer 110 may have a conical shape having the diameter X3 from 20 nm to 150 nm.

The channel layer 110 may be formed in the sacrificial spacer 127 having a single layer structure. Accordingly, a striation phenomenon, which may occur during a conventional process of forming a channel layer from a double layer structure, may be prevented.

In FIG. 7, the channel layer 110 is a pillar type channel layer, but as described above, the channel layer 110 may be a macaroni type channel layer. When the channel layer 110 is a macaroni type channel layer, the channel layer 110 contacting the sacrificial spacer 127 is formed, and then a pillar insulating layer (not shown) filling inside the channel layer 110 may be additionally formed.

Figure 8:
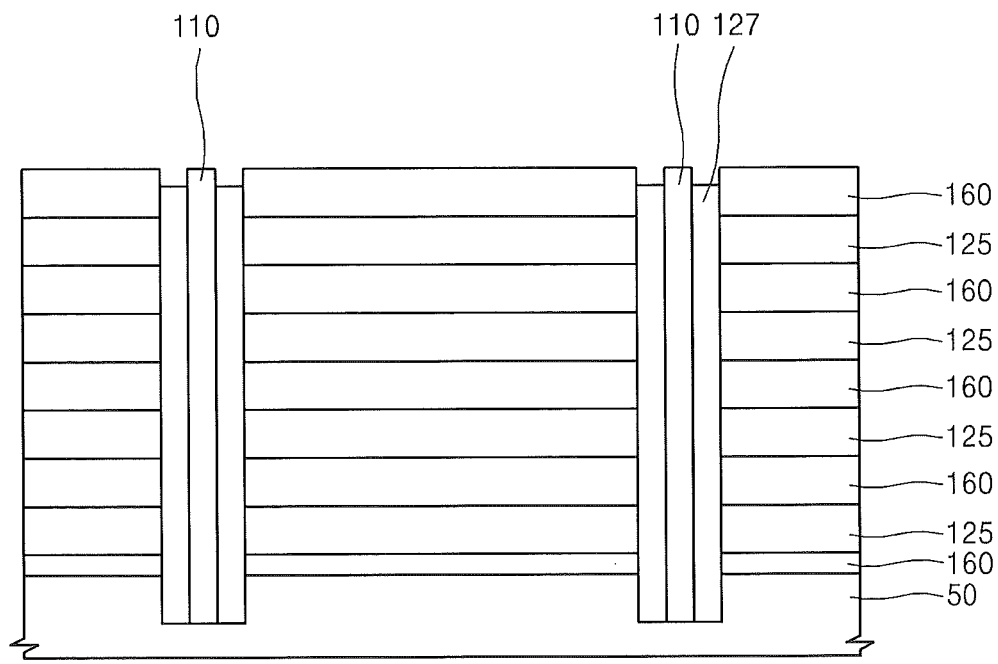

Referring to FIG. 8, the side wall of the topmost first insulating layer 160 and the side wall of the channel layer 110 are exposed by etching a part of a top of the sacrificial spacer 127 to a first depth. The first depth may be smaller than a depth of the topmost first insulating layer 160 in a direction perpendicular to the substrate 50.

Figure 9:
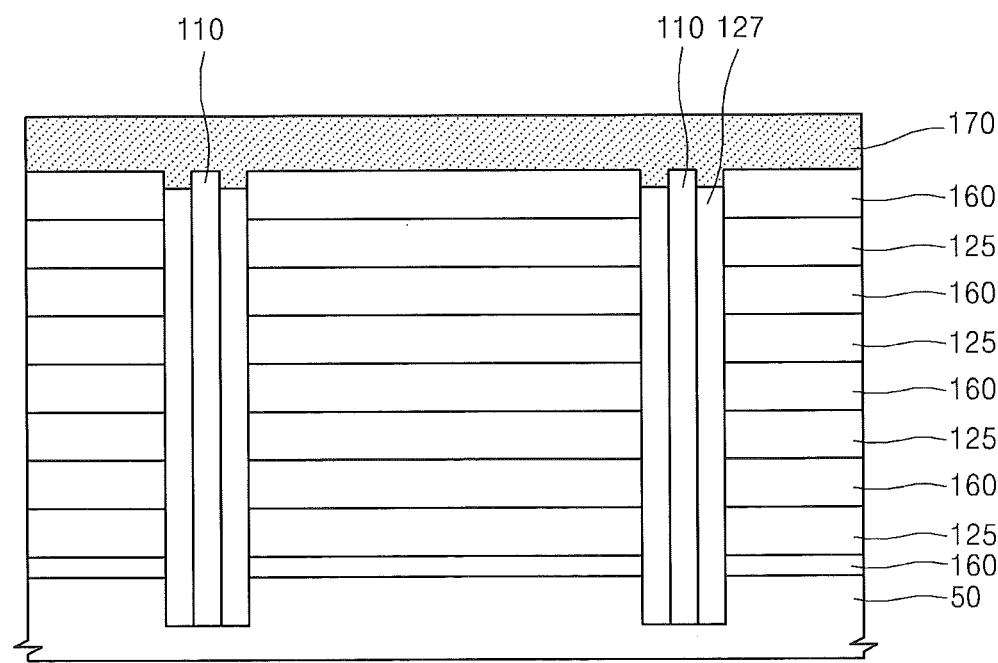

Referring to FIG. 9, the second insulating layer 170 is formed on the sacrificial spacer 127. In detail, the second insulating layer 170 is formed in such a way that the second insulating layer 170 contacts the side wall of the topmost first insulating layer 160 and the side wall of the channel layer 110. The second insulating layer 170 prevents a channel from falling down or being lifted during a pull back process of etching the sacrificial insulating layer 125 and the sacrificial spacer 127. Accordingly, the second insulating layer 170 may be formed of a material having an etch selectivity with the sacrificial insulating layer 125 and the sacrificial spacer 127.

Figure 10:
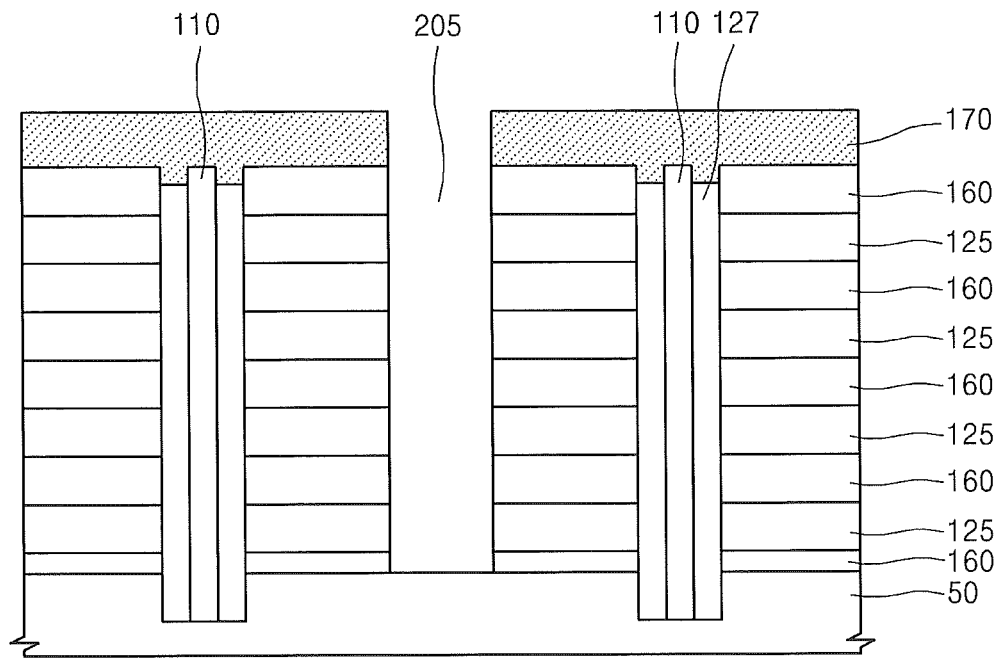

Referring to FIG. 10, in order to perform the pull back process of etching the sacrificial insulating layer 125 and the sacrificial spacer 127, a plurality of wordline recesses 205 are formed by etching the second insulating layer 170, the sacrificial insulating layers 125, and the first insulating layers 160. Here, each of the wordline recesses 205 is disposed between the channel layers 110.

Figure 11A:
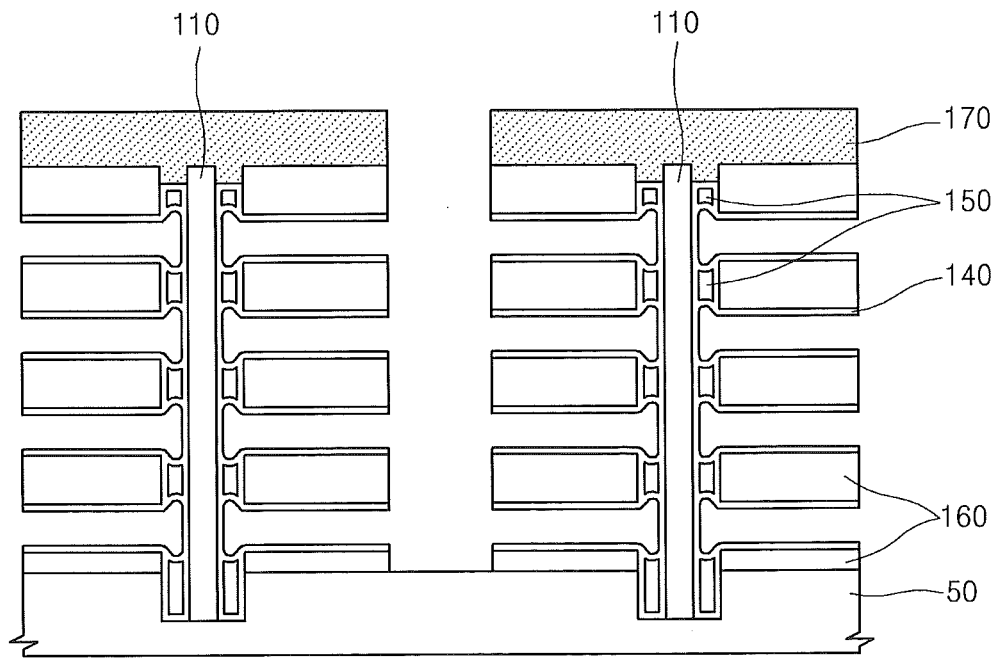
Figure 11B:
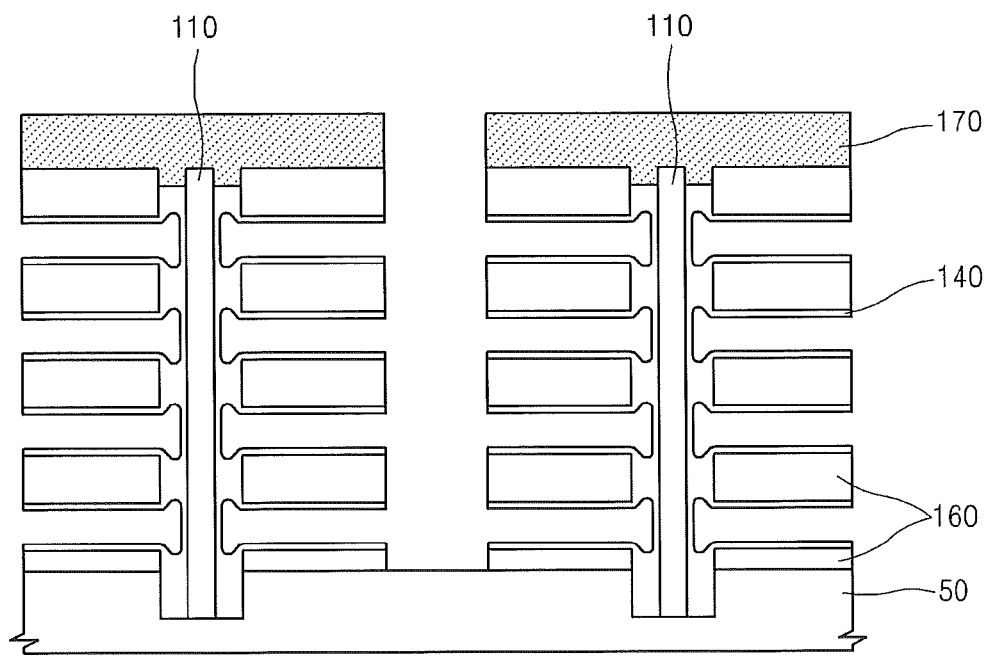

Referring to FIGS. 11A and 11B, the first insulating layer 160 and the channel layer 110 are exposed by etching the sacrificial insulating layer 125 and the sacrificial spacer 127, and the gate insulating layer 140 is formed on the exposed first insulating layer 160 and the exposed channel layer 110.

For example, the first and second insulating layers 160 and 170 may be silicon oxide layers, and the sacrificial insulating layer 125 and the sacrificial spacer 127 may be silicon nitride layers having an etch selectivity with the first and second insulating layers 160 and 170. Here, the first insulating layer 160, the second insulating layer 170, and the channel layer 110 may be exposed by removing the sacrificial insulating layer 125 and the sacrificial spacer 127 formed of silicon nitride via a phosphate strip process.

Then, the gate insulating layer 140 is formed on the exposed first insulating layer 160 and the exposed channel layer 110. As described above, the gate insulating layer 140 may include the tunneling insulating layer 142, the charge storage layer 144, and the blocking insulating layer 146. As shown in FIG. 11A, when the gate insulating layer 140 having poor step coverage is deposited, the air gaps 150 may be formed between the plurality of gate conductive layers 130, or between the topmost gate conductive layer of the gate conductive layers 130 and the second insulating layer 170. Alternatively, as shown in FIG. 11B, when the gate insulating layer 140 having good step coverage is deposited, the air gaps 150 may not be formed. Here, only the gate insulating layer 140 is disposed between the gate conductive layers 130.

Whether an air gap is formed or not may be determined based on the thickness of the gate insulating layer 140 and the thickness of the sacrificial spacer 127. Here, the thickness of the gate insulating layer 140 denotes a thickness of the gate insulating layer 140 disposed on a top and bottom of the first insulating layer 160. Also, the thickness of the sacrificial spacer 127 may be defined to be a thickness of the sacrificial spacer 127 deposited on the side walls of the sacrificial insulating layers 125 and first insulating layers 160.

When the thickness of the sacrificial spacer 127 is about a half or below the half of the thickness of the gate insulating layer 140, the air gap 150 may be formed between the gate insulating layers 140. Alternatively, when the thickness of the sacrificial spacer 127 is twice or more the thickness of the gate insulating layer 140, the air gap 150 may not be formed between the gate insulating layers 140. In other words, a forming condition of the air gap 150 is not only based on a deposition condition, such as step coverage, of the gate insulating layer 140, but also based on the thicknesses of the sacrificial spacer 127 and gate insulating layer 140.

Figure 12:
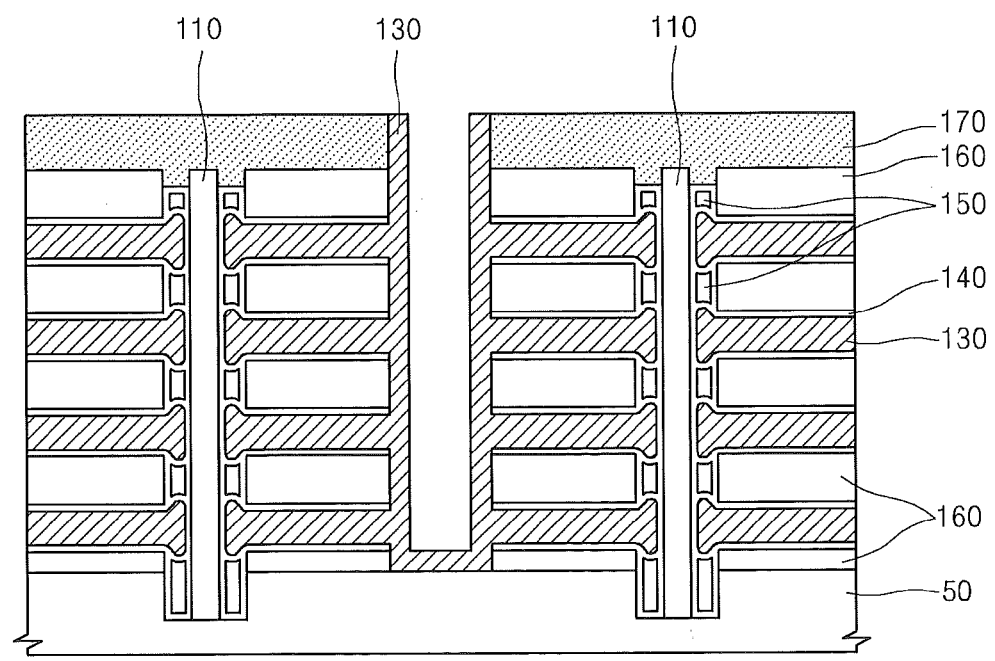
Figure 13:
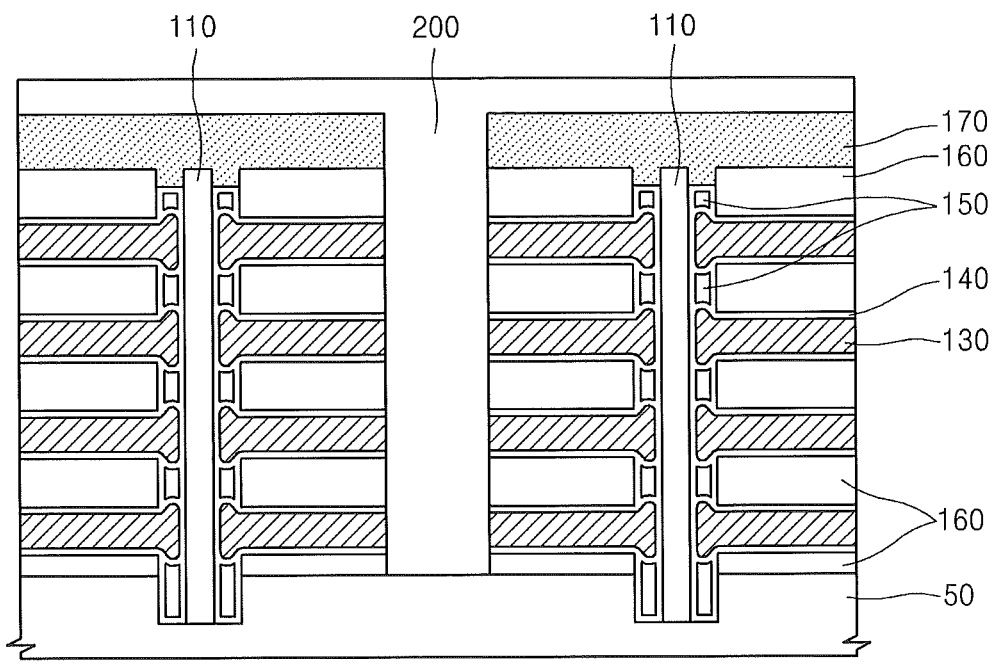

Referring to FIG. 12, the gate conductive layer 130 is formed on the gate insulating layer 140. Each of the gate conductive layers 130 formed between the first insulating layers 160 performs a function of a wordline. Referring to FIG. 13, a mutual electric connection between the gate conductive layers 130 may be removed by performing a strip process, and the separating insulating layer 200 filling the wordline recess 205 may be formed.

Figure 14A:
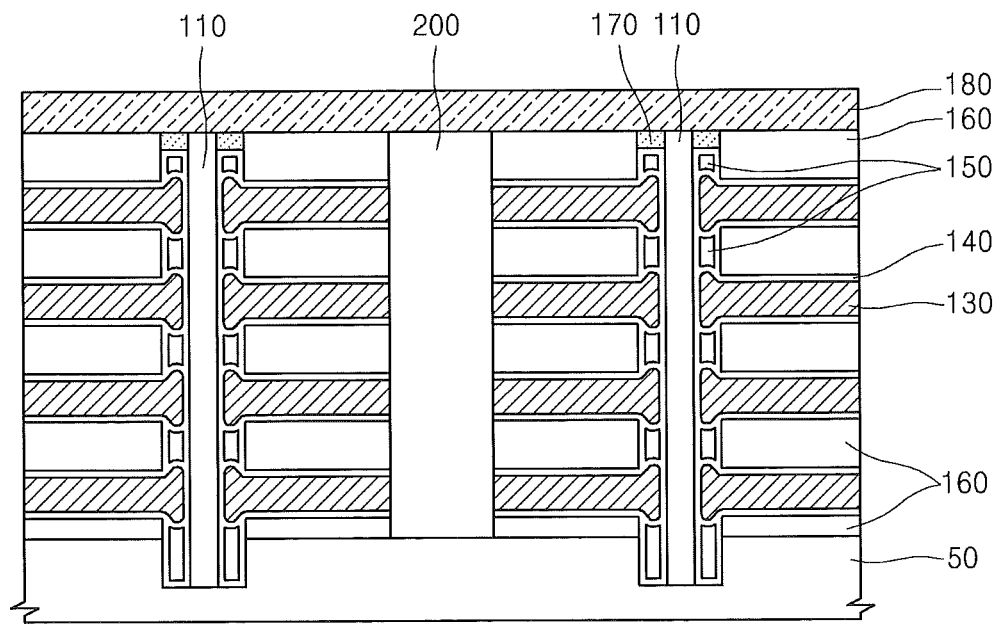
Figure 14B:
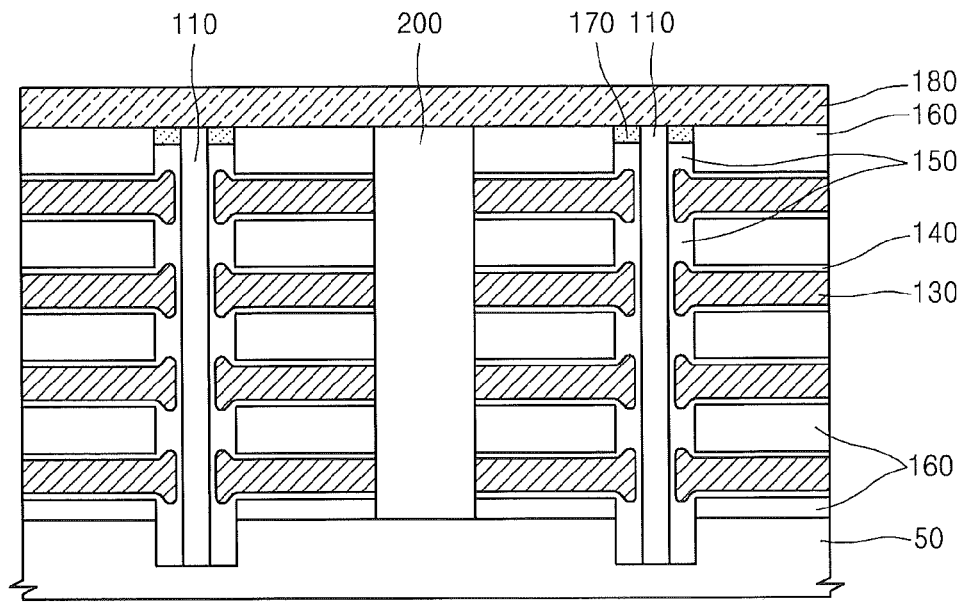

Referring to FIGS. 14A and 14B, a part of a top of the separating insulating layer 200 is removed by performing a chemical mechanical polishing (CMP) process, and the channel layer 110 is exposed. Then, the bitline conductive layer 180 is formed on the first insulating layer 160, the second insulating layer 170, and the separating insulating layer 200. FIG. 14A illustrates the nonvolatile memory device including the air gaps 150, and FIG. 14B illustrates the nonvolatile memory device wherein only the gate insulating layer 140 is disposed between the gate conductive layers 130 without the air gap 150.

FIGS. 15 through 22 are cross-sectional views for describing a method of manufacturing a nonvolatile memory device, according to another exemplary embodiment of the inventive concept. The method is used to manufacture the nonvolatile memory device of FIG. 3. Also, the method may include processes shown in FIGS. 5 through 14B. Overlapping descriptions thereof will not be repeated.

Figure 15:
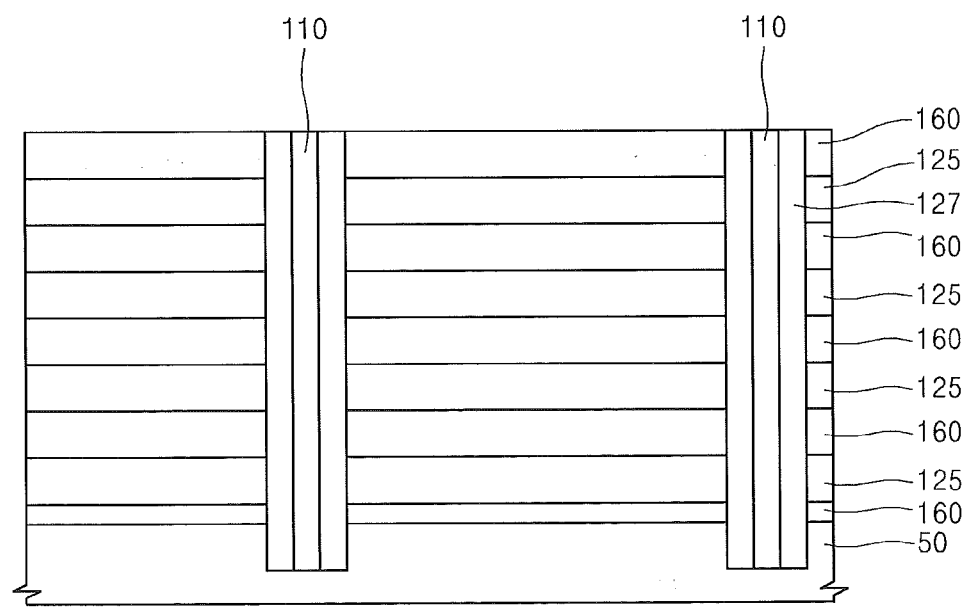
FIGS. 15 through 22 are cross-sectional views for describing a method of manufacturing a nonvolatile memory device, according to another exemplary embodiment of the inventive concept.

Referring to FIG. 15, as described above with reference to FIGS. 5 through 7, the plurality of sacrificial insulating layers 125 and the plurality of first insulating layers 160 are alternately stacked on the substrate 50, the plurality of channel holes 105 are formed, and the sacrificial spacers 127 and the channel layer 110 filling the channel hole 105 are formed.

Figure 16:
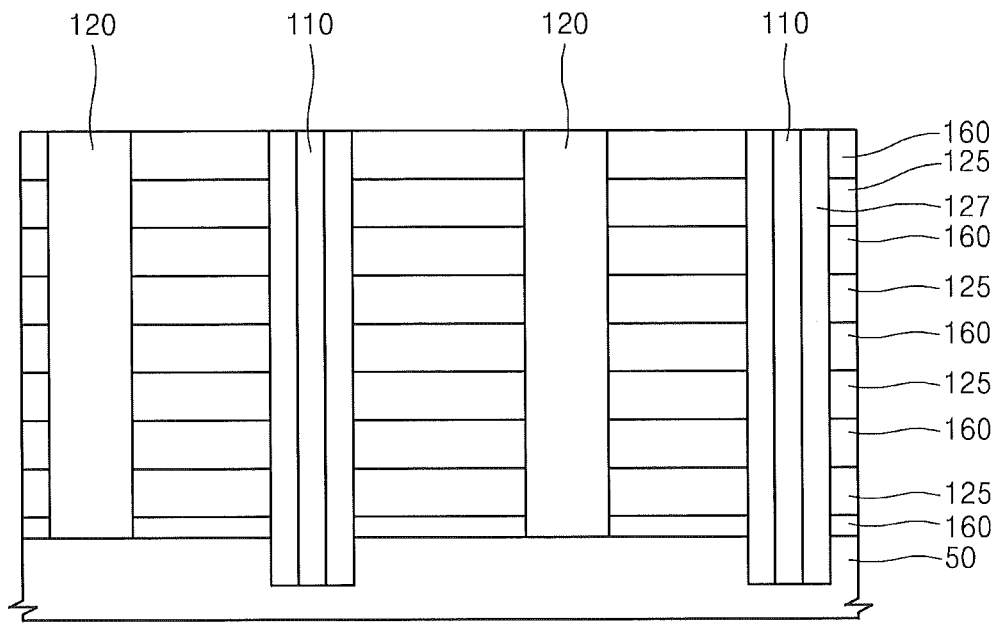

Referring to FIG. 16, a dummy hole (not shown) is formed by etching the sacrificial insulating layers 125 and the first insulating layers 160, and the supporting insulating layer 120 filling the dummy hole is formed. The supporting insulating layer 120 may be formed of a material having a different etch selectivity from the sacrificial insulating layer 125 and sacrificial spacer 127.

Figure 17:
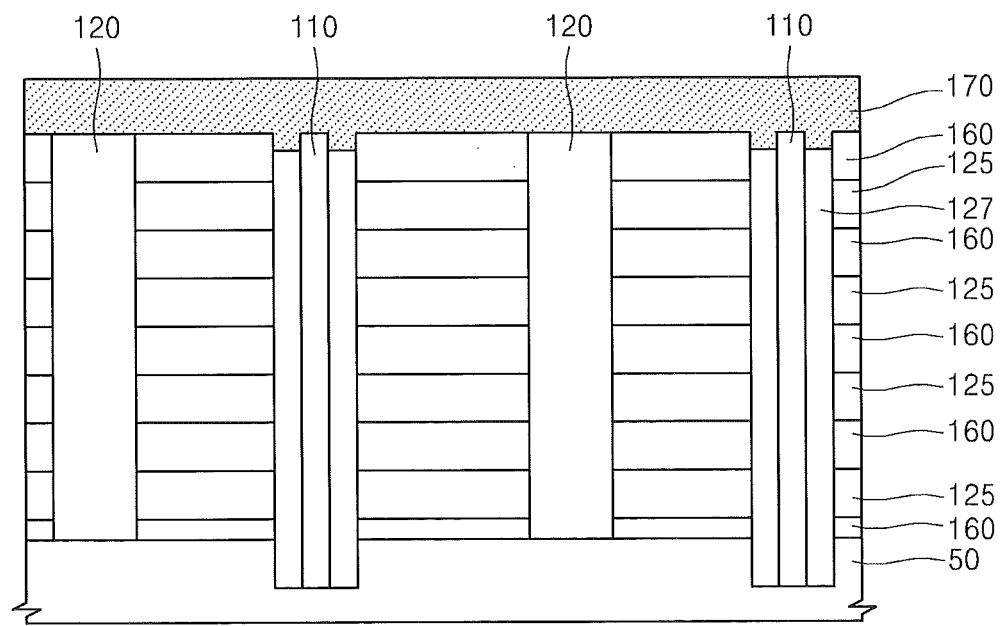

Referring to FIG. 17, as described above with reference to FIGS. 8 and 9, the part of the top of the sacrificial spacer 127 is etched so that the side wall of the topmost first insulating layer 160 and the side wall of the channel layer 110 are exposed, and the second insulating layer 170 contacting the side wall of the topmost first insulating layer 160 and the side wall of the channel layer 110 is formed.

Figure 18:
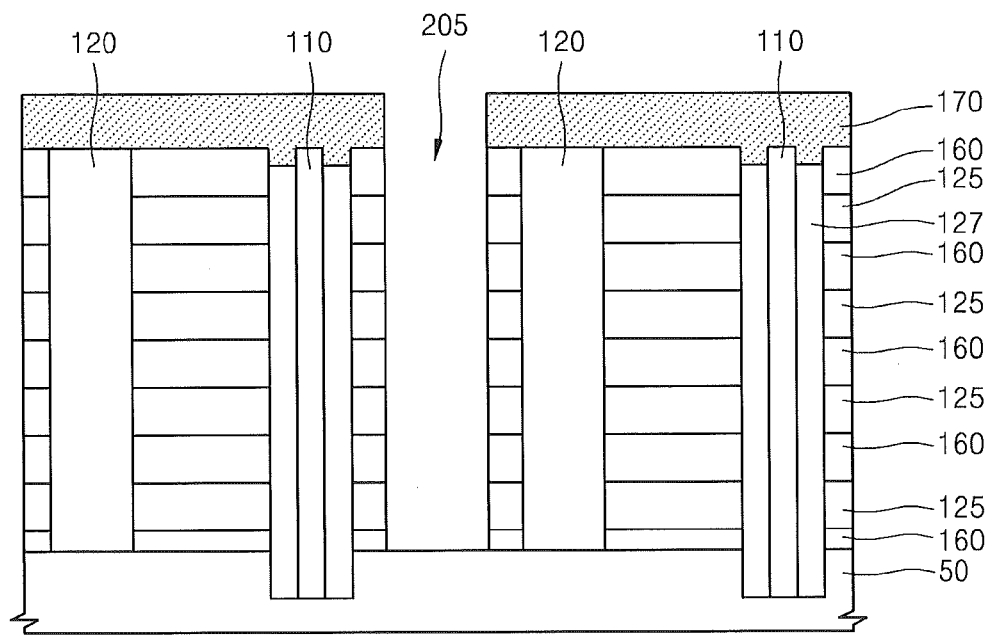

Referring to FIG. 18, the wordline recess 205 is formed by etching the second insulating layer 170, the sacrificial insulating layers 125, and the first insulating layers 160 so as to perform the pull back process for etching the sacrificial insulating layer 125 and the sacrificial spacer 127. Here, the wordline recess 205 is disposed between the channel layer 110 and the supporting insulating layer 120.

Figure 19:
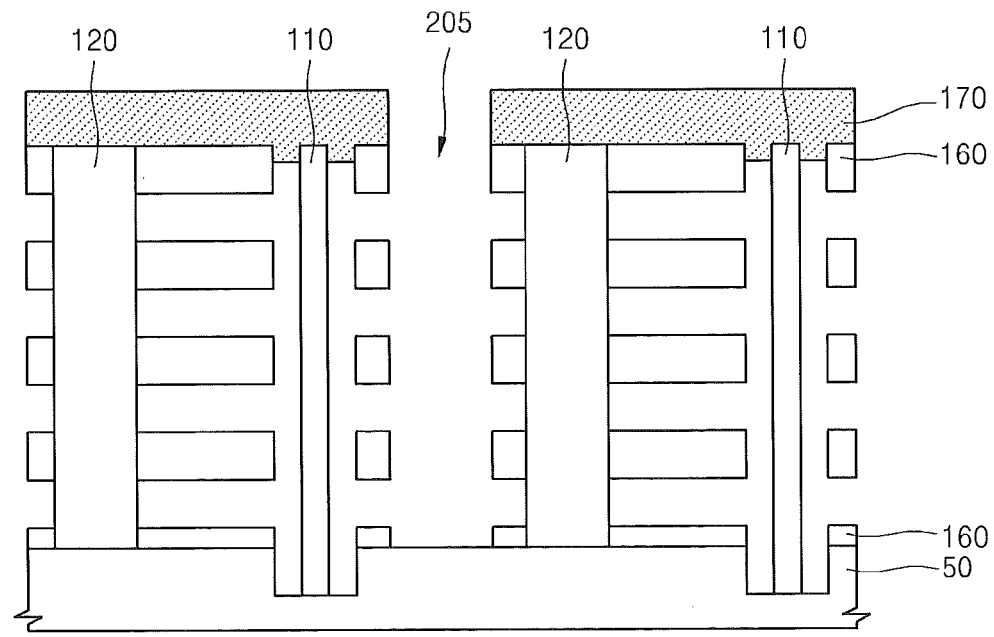

Referring to FIG. 19, the pull back process is performed by etching the sacrificial insulating layer 125 and the sacrificial spacer 127. As described above, the supporting insulating layer 120 prevents the first insulating layer 160 from sinking after the sacrificial insulating layer 125 is etched.

Figure 20:
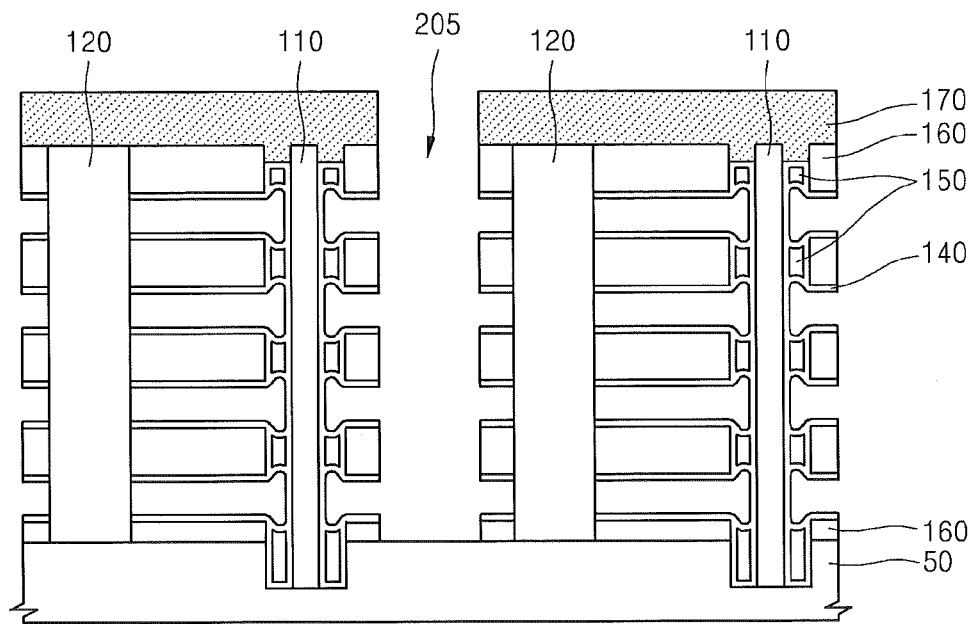

Referring to FIG. 20, as described above with reference to FIG. 11A, the gate insulating layer 140 is formed on the exposed first insulating layer 160 and the exposed channel layer 110. Here, as described above, the air gaps 150 may be formed between the plurality of gate conductive layers 130, or between the topmost gate conductive layer 130 and the second insulating layer 170 by depositing the gate insulating layer 140 having poor step coverage. Although not illustrated in FIG. 20, the air gap 150 may not be formed as shown in FIG. 11B by depositing the gate insulating layer 140 having good step coverage.

Figure 21:
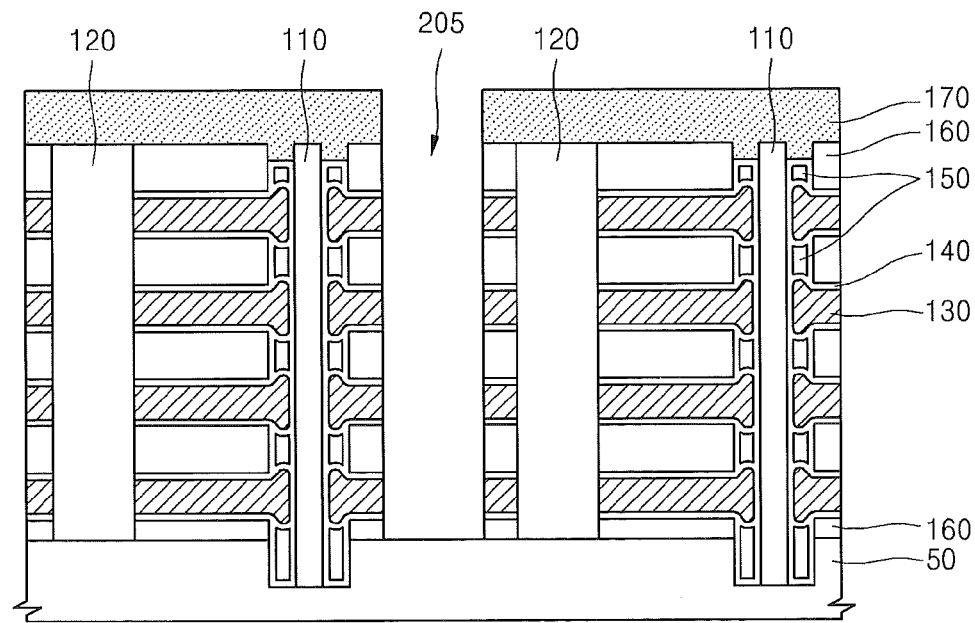
Figure 22:
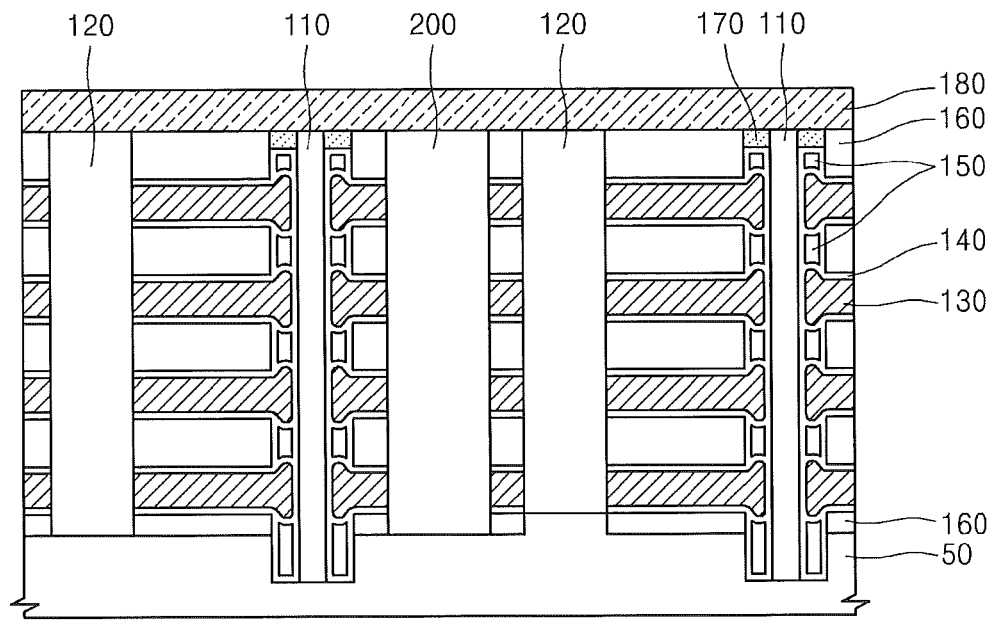

Referring to FIGS. 21 and 22, as described above with reference to FIGS. 12 through 14A, the gate conductive layer 130 is formed on the gate insulating layer 140, and the separating insulating layer 200 filing the wordline recess 205 is formed. Then, the channel layer 110 is exposed by removing the parts of the top of the separating insulating layer 200 and second insulating layer 170, and then the bitline conductive layer 180 is formed on the first insulating layer 160, the second insulating layer 170, the channel layer 110, the supporting insulating layer 120, and the separating insulating layer 200. Although not illustrated in FIGS. 21 and 22, the air gap 150 may not be formed as shown in FIG. 14B by depositing the gate insulating layer 140 having good step coverage.

FIGS. 23 through 29 are cross-sectional views for describing a method of manufacturing a nonvolatile memory device, according to another exemplary embodiment of the inventive concept. The method is used to manufacture the nonvolatile memory device of FIG. 4. The method may be obtained by partially modifying the method of FIGS. 5 through 14B. Overlapping descriptions thereof will not be repeated.

Figure 23:
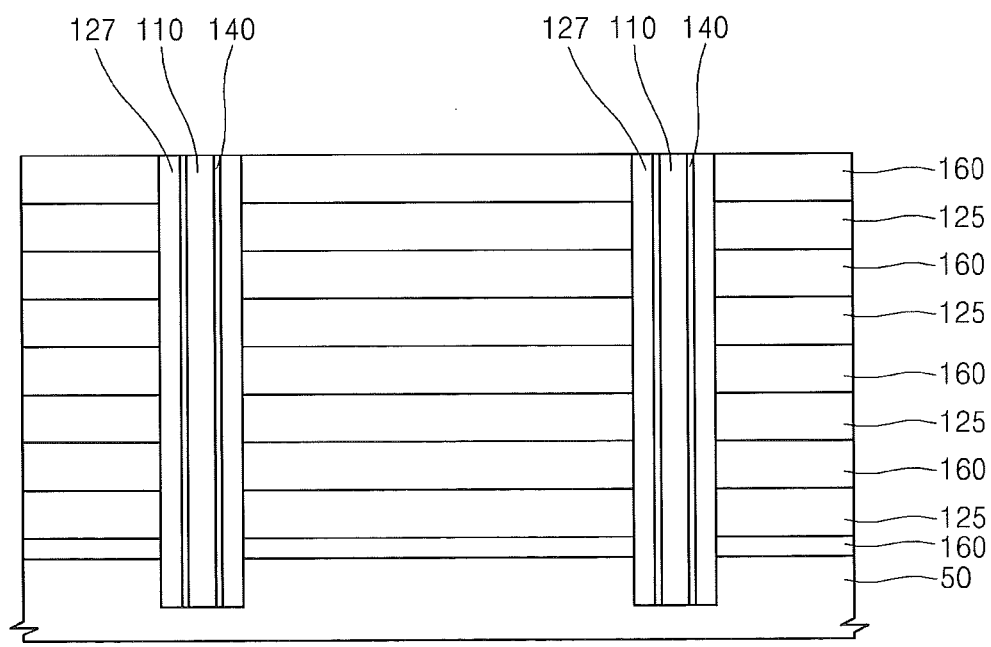
FIGS. 23 through 29 are cross-sectional views for describing a method of manufacturing a nonvolatile memory device, according to another exemplary embodiment of the inventive concept.

Referring to FIG. 23, the plurality of sacrificial insulating layers 125 and the plurality of first insulating layers 160 are alternately stacked on the substrate 50, and the plurality of channel holes 105 are formed. Then, the sacrificial spacers 127 and the gate insulating layers 140 respectively filling the channel holes 105 are formed. In detail, the sacrificial spacer 127 filling the channel hole 105 is formed first, and then the gate insulating layer 140 contacting the sacrificial spacer 127 is formed. Next, the channel layer 110 filling the gate insulating layer 140 is formed.

Figure 24:
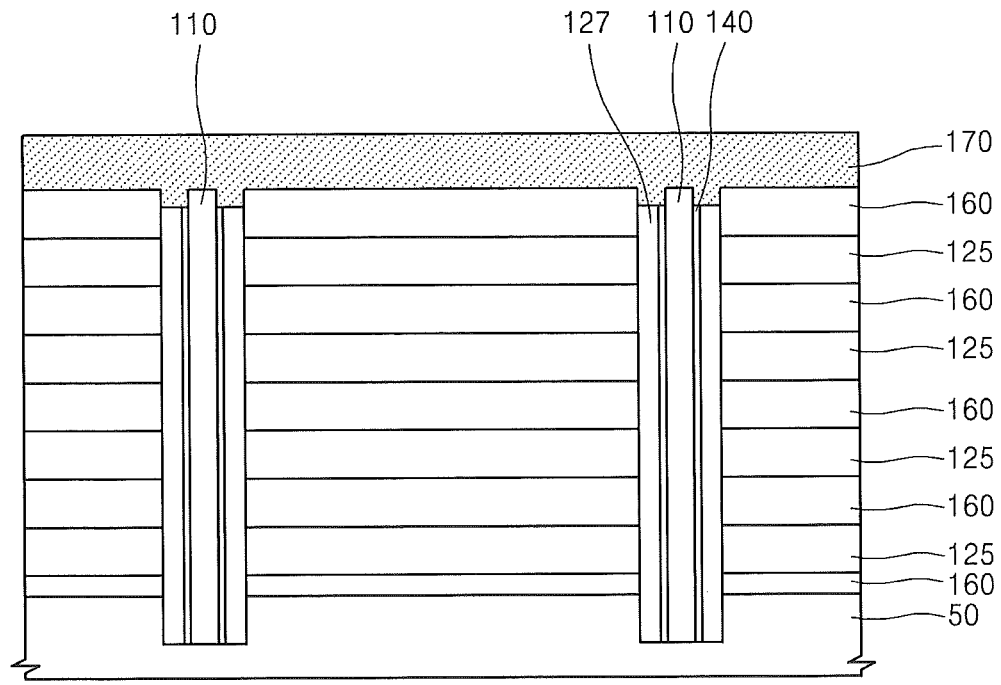

Referring to FIG. 24, the parts of the top of the sacrificial spacer 127 and the gate insulating layer 140 are etched so that the side wall of the topmost first insulating layer 160 and the side wall of the channel layer 110 are exposed, and the second insulating layer 170 contacting the side wall of the topmost first insulating layer 160 and the side wall of the channel layer 110 is formed.

Figure 25:
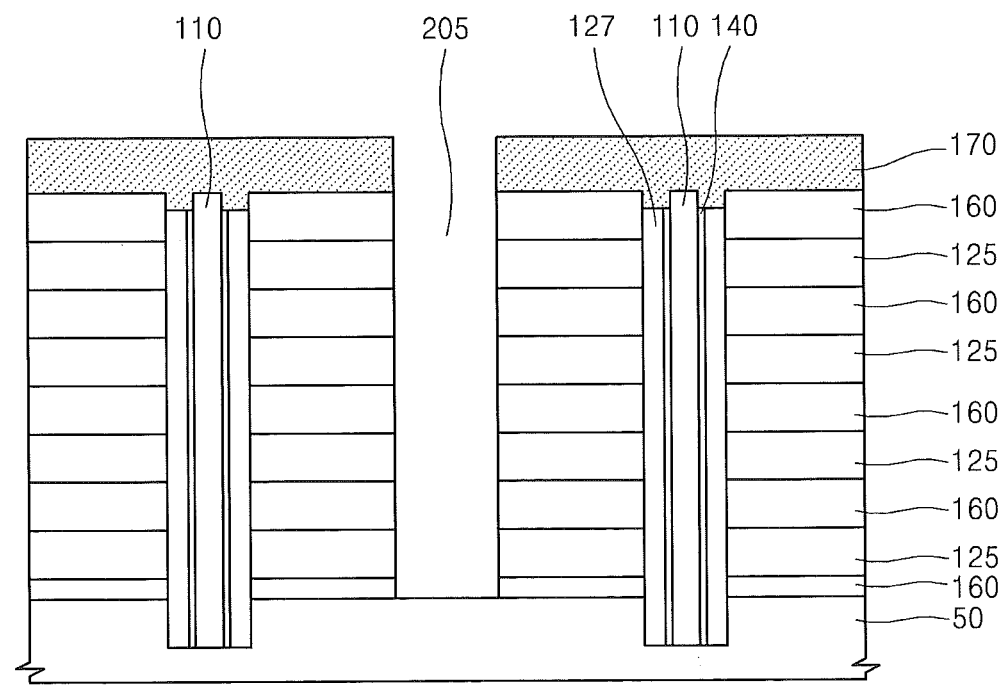

Referring to FIG. 25, the wordline recess 205 is formed by etching the second insulating layer 170, the sacrificial insulating layers 125, and the first insulating layers 160 so as to perform the pull back process for etching the sacrificial insulating layer 125 and the sacrificial spacer 127.

Figure 26:
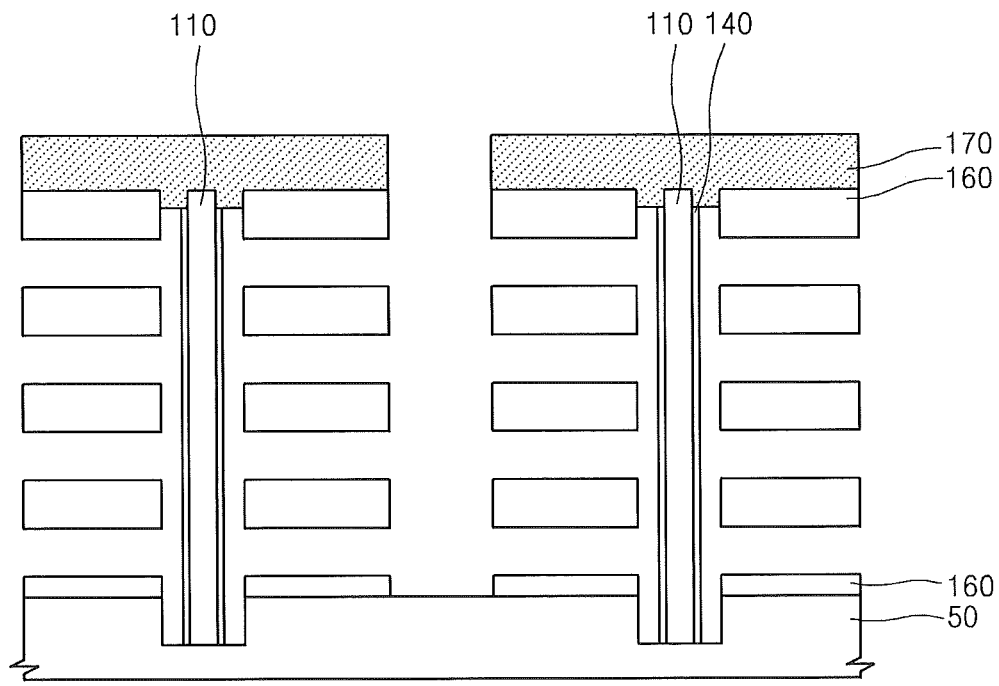

Referring to FIG. 26, the pull back process is performed by etching the sacrificial insulating layer 125 and the sacrificial spacer 127. Although not illustrated in FIG. 26, the supporting insulating layer 120 of FIG. 3 may be formed between the wordline recess 205 and the channel layer 110, so as to support the first insulating layer 160 or prevent the first insulating layer 160 from sinking.

Figure 27:
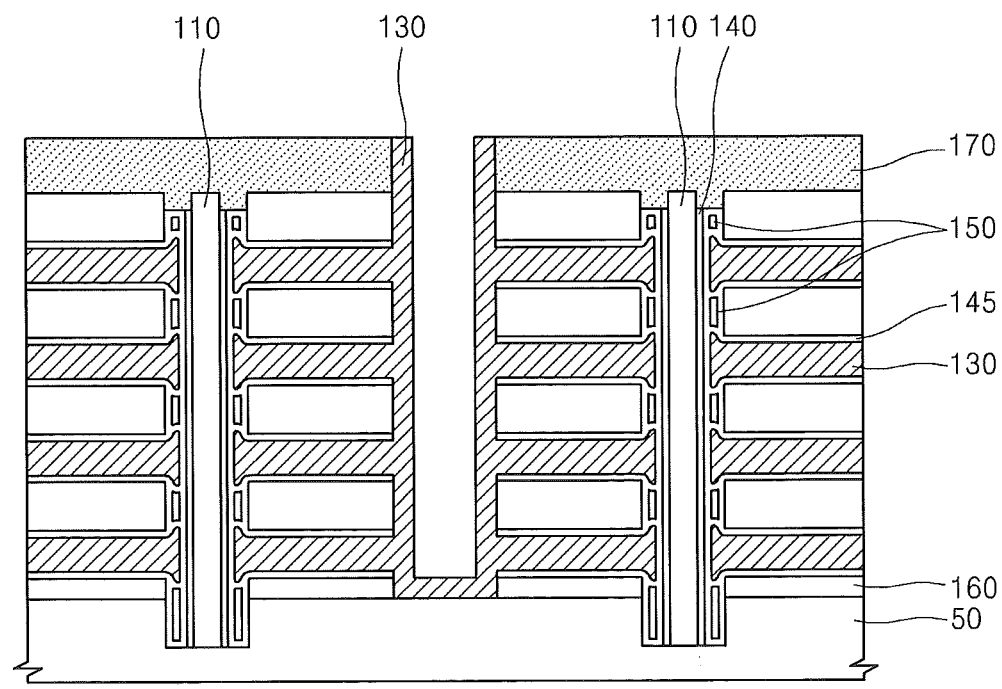

Referring to FIG. 27, the gate separation insulating layer 145 is formed on the exposed first insulating layer 160 and the exposed channel layer 110, and the gate conductive layer 130 is formed on the gate separation insulating layer 145. Here, the air gaps 150 may be formed between the gate separation insulating layers 145, or between the topmost gate separation insulating layer 145 and the second insulating layer 170 by depositing the gate separation insulating layer 150 having poor step coverage. Alternatively, although not illustrated in FIG. 27, the air gaps 150 may not be formed by depositing the gate separation insulating layer 145 having good step coverage.

Figure 28:
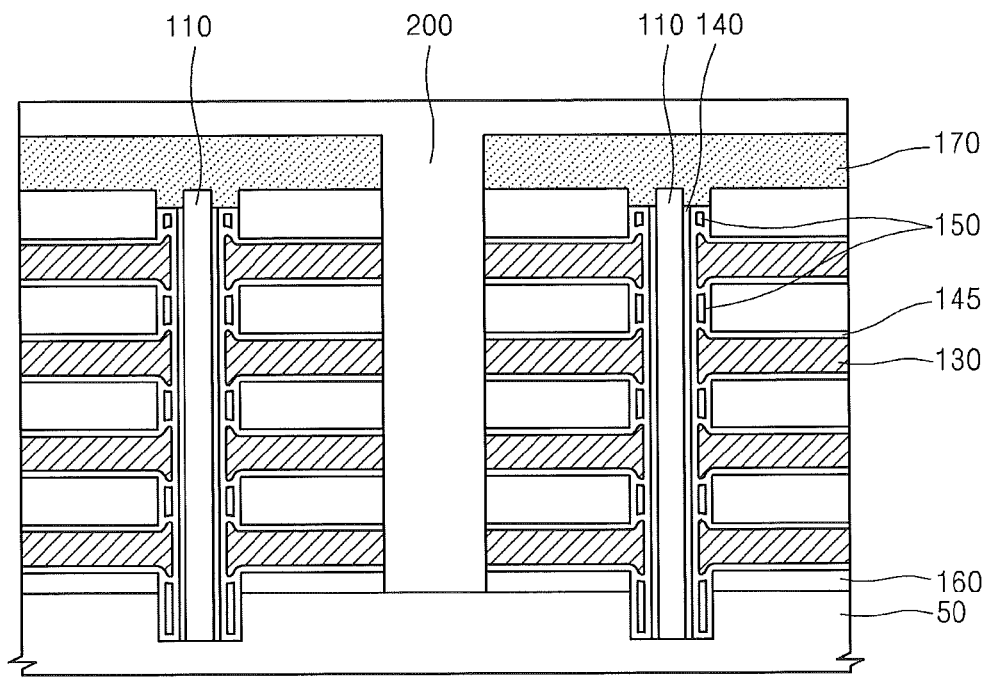
Figure 29:
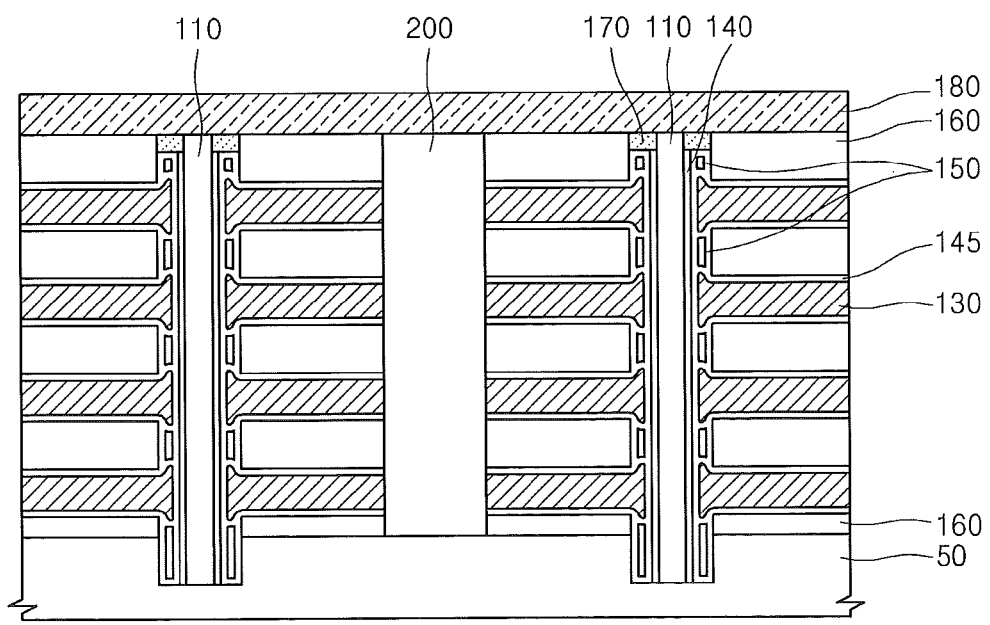

Referring to FIGS. 28 and 29, the separating insulating layer 200 filling the wordline recess 205 is formed, the channel layer 110 is exposed by removing the parts of the top of the separating insulating layer 200 and second insulating layer 170, and the bitline conductive layer 180 is formed on the first insulating layer 160, the second insulating layer 170, and the separating insulating layer 200.

FIGS. 30 through 47 are perspective views for describing a method of manufacturing a nonvolatile memory device, according to an exemplary embodiment of the inventive concept. The method may be obtained by partially modifying the method of FIGS. 5 through 14B. Overlapping descriptions thereof will not be repeated.

Figure 30:
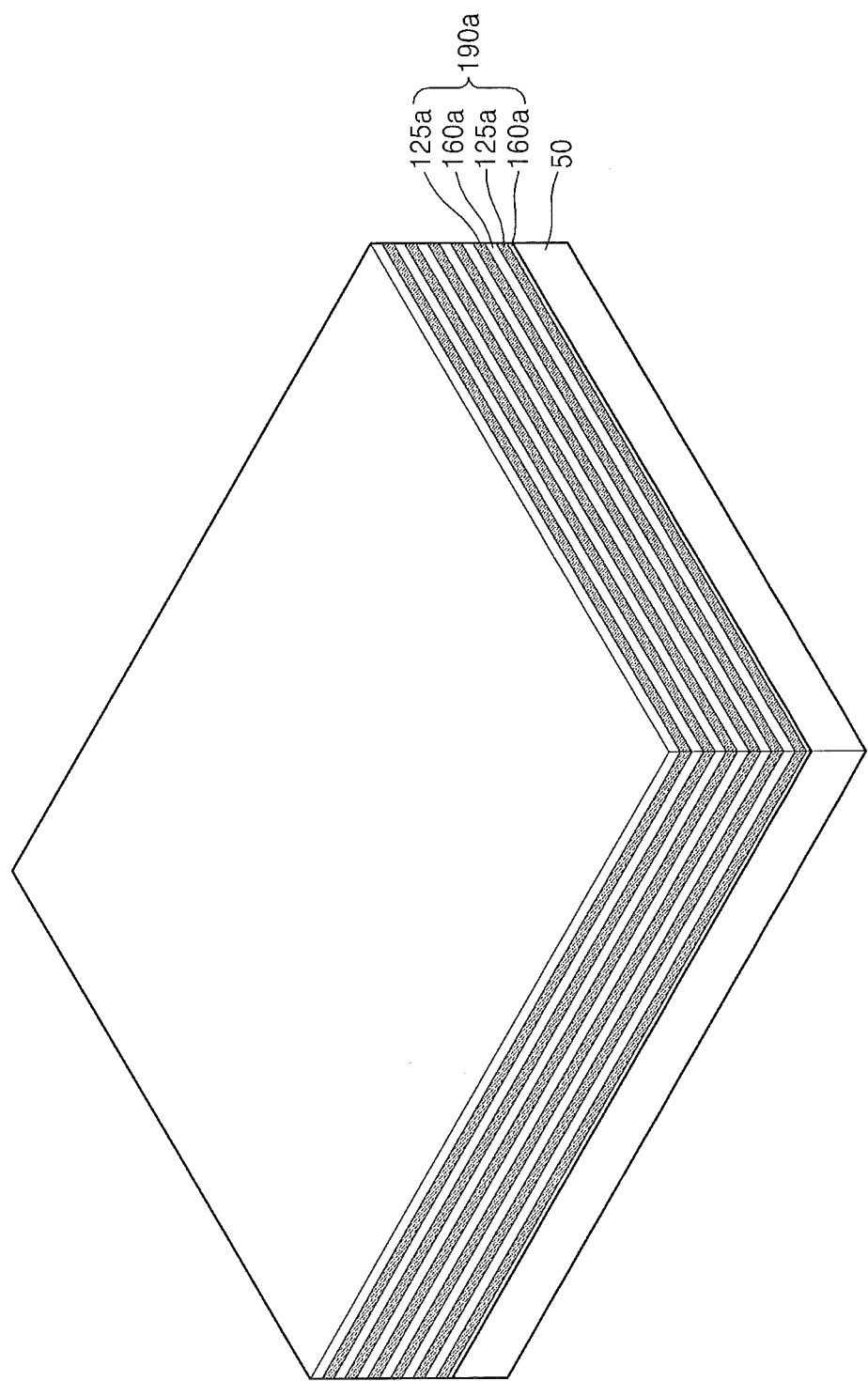
FIGS. 30 through 47 are perspective views for describing a method of manufacturing a nonvolatile memory device, according to an exemplary embodiment of the inventive concept.

Referring to FIG. 30, a lower mold stack 190a for forming a lower channel layer (not shown) is formed. The lower mold stack 190a may include a lower sacrificial insulating layer 125a and a lower insulating layer 160a. The lower sacrificial insulating layer 125a and the lower insulating layer 160a may be alternately and repeatedly stacked on each other. Materials of the lower sacrificial insulating layer 125a and the lower insulating layer 160a having an etch selectivity are as described above.

Figure 31:
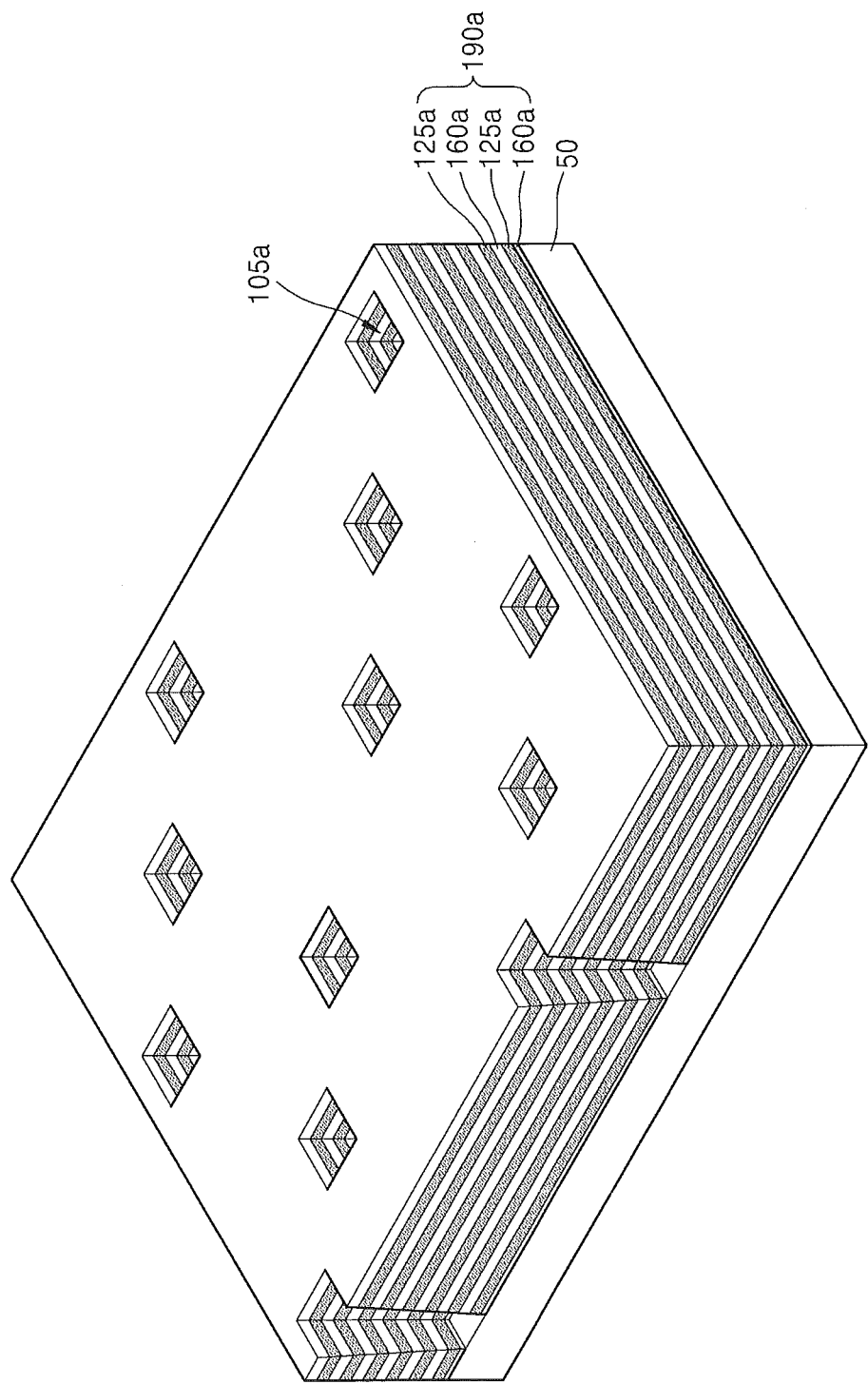

Referring to FIG. 31, lower channel holes 105a penetrating through the lower mold stack 190a are formed. The lower channel holes 105a may be arranged 2-dimensionally to expose the substrate 50. The lower channel holes 105a may be tapered toward the substrate 50. In other words, a top of the lower channel hole 105a may be wider than a bottom of the lower channel hole 105a.

In FIG. 31, the lower channel hole 105a has a square pillar shape, but as shown in FIG. 1, the lower channel hole 105a may have a cylindrical or conical shape. Also in FIG. 31, the lower channel holes 105a are diagonally arranged, but the arrangement of the lower channel holes 105a is not limited thereto, and the lower channel holes 105a may be disposed in zigzag patterns as shown in FIG. 1.

In order to form the lower channel holes 105a, a mask pattern (not shown) defining locations of the lower channel holes 105a on the lower mold stack 190a may be formed, and the lower mold stack 190a may be etched by using the mask pattern as an etching mask.

Figure 32:
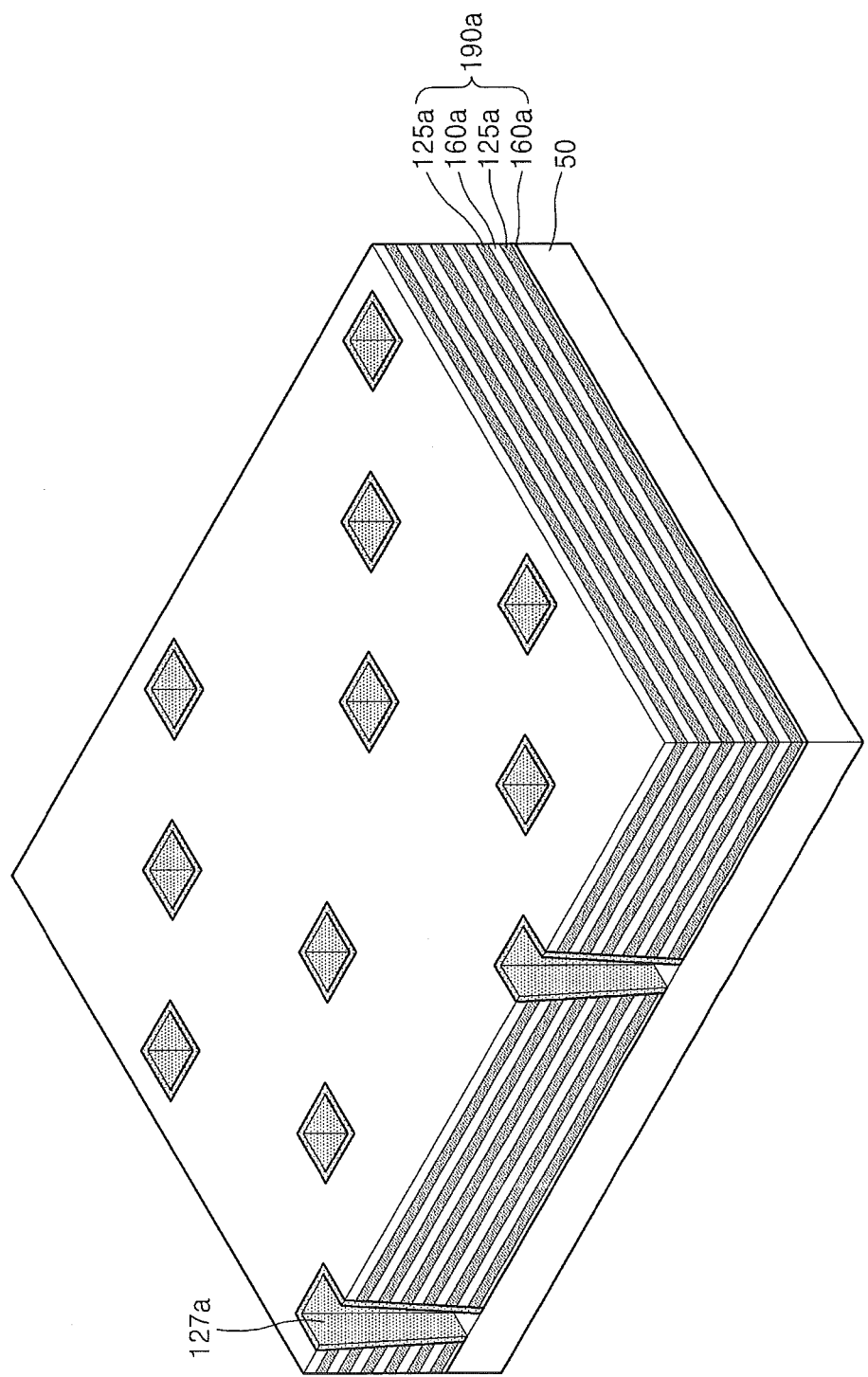

Referring to FIG. 32, a lower sacrificial spacer 127a surrounding a side wall of the lower channel hole 105a is formed. As described above, the lower sacrificial spacer 127a may be formed of the same material as the lower sacrificial insulating layer 125a, and may include a silicon oxide, a silicon nitride, silicon carbide, silicon, or silicon germanium.

In order to form the lower sacrificial spacer 127a, a material for forming the lower sacrificial spacer 127a may be deposited on the lower sacrificial insulating layer 125a, and then an etchback process may be performed on the material. Here, the sacrificial spacer 127a may be formed only on a side wall of the lower sacrificial insulating layer 125a and a side wall of the lower insulating layer 160a, and thus an upper surface of the substrate 50 may be exposed.

Figure 33:
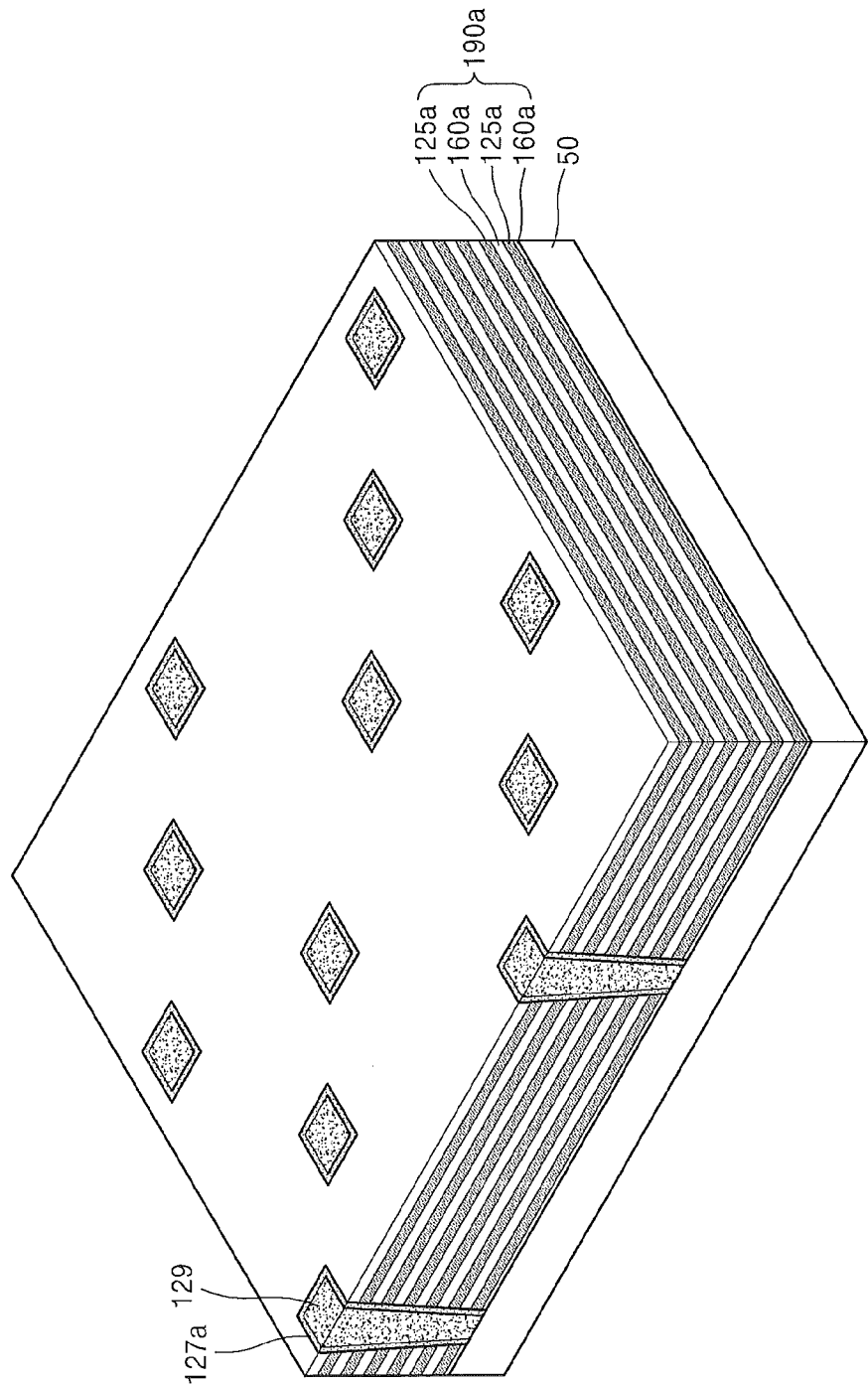

Referring to FIG. 33, a closed insulating layer 129 filling the lower channel hole 105a is formed. The closed insulating layer 129 may be formed of a material having an etch selectivity with the lower sacrificial spacer 127a. Alternatively, the closed insulating layer 129 may be selectively formed of the same material as the lower insulating layer 160a, and may include a silicon oxide, a silicon nitride, or silicon germanium.

For example, in order to form the closed insulating layer 129 including a silicon oxide, a deposition process of the silicon oxide may be performed. Then, a CMP or etchback process may be performed on the silicon oxide in such a way that a top surface of the lower mold stack 190a is exposed.

Figure 34:
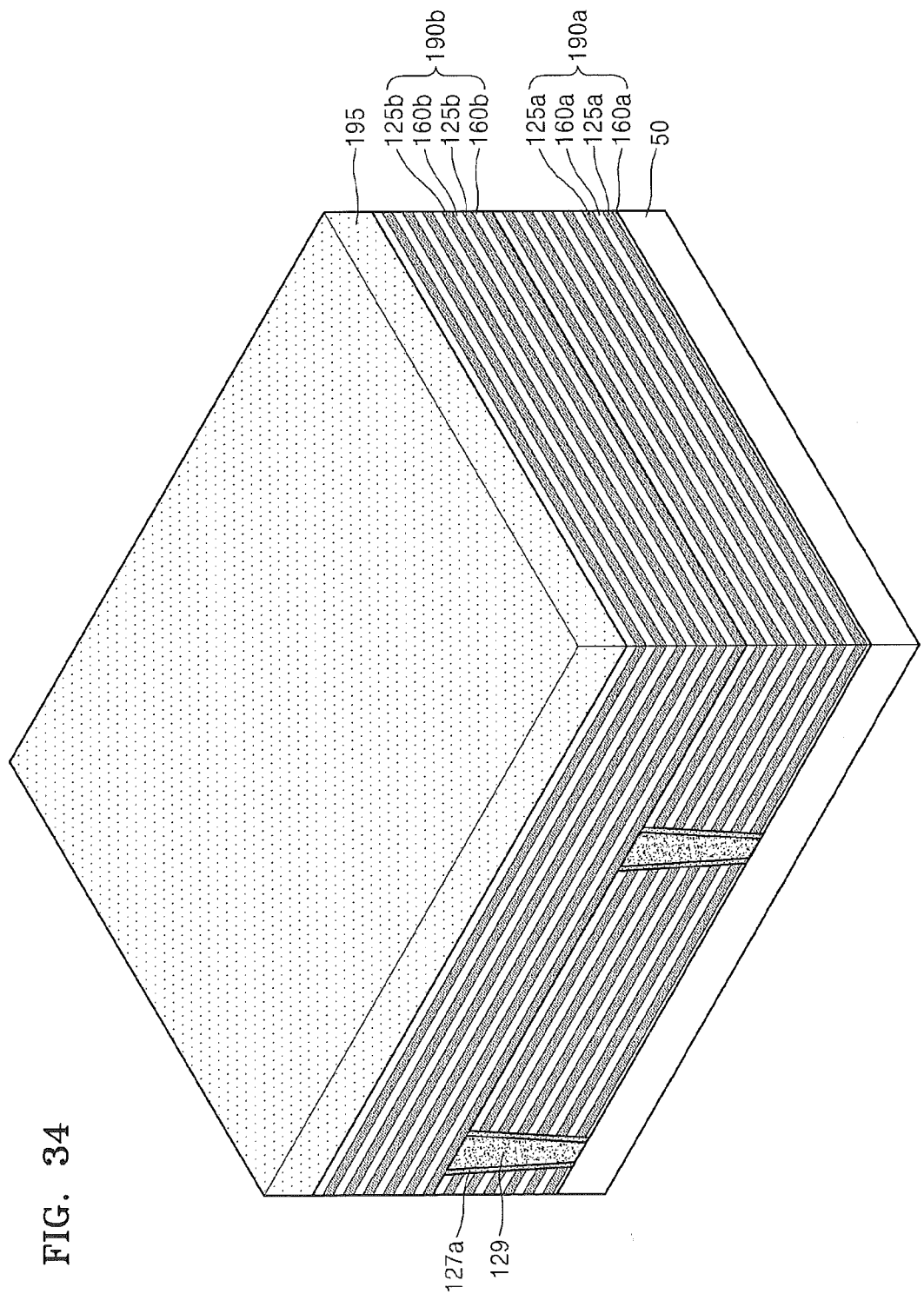

Referring to FIG. 34, an upper mold stack 190b for forming an upper channel layer (not shown) is formed. The upper mold stack 190b may include an upper sacrificial insulating layer 125b and an upper insulating layer 160b. The upper sacrificial insulating layer 125b and the upper insulating layer 160b may be alternately and repeatedly stacked on each other. As described above, materials for forming the upper sacrificial insulating layer 125b and the upper insulating layer 160b may have an etch selectivity with each other.

A buffer layer 195 may be formed on the upper mold stack 190b. The buffer layer 195 may have a thickness from about 50 nm to about 100 nm. The buffer layer 195 may be formed of a material having an etch selectivity with the upper insulating layer 160b. Alternatively, the buffer layer 195 may be formed of the same material as the upper sacrificial insulating layer 125b.

The buffer layer 195 may prevent the upper mold stack 190b from being damaged while etching the closed insulating layer 129. For example, when the closed insulating layer 129 is formed of the same material, such as a silicon oxide, as the upper insulating layer 160b, the upper insulating layer 160b of the upper mold stack 190b may be etched while etching the closed insulating layer 129. However, when the buffer layer 195 having the etch selectivity with the upper insulating layer 160b is formed on the upper insulating layer 160b, the upper insulating layer 160b is prevented from being damaged since the buffer layer 195 operates as an etching mask while etching the closed insulating layer 129.

Figure 35:
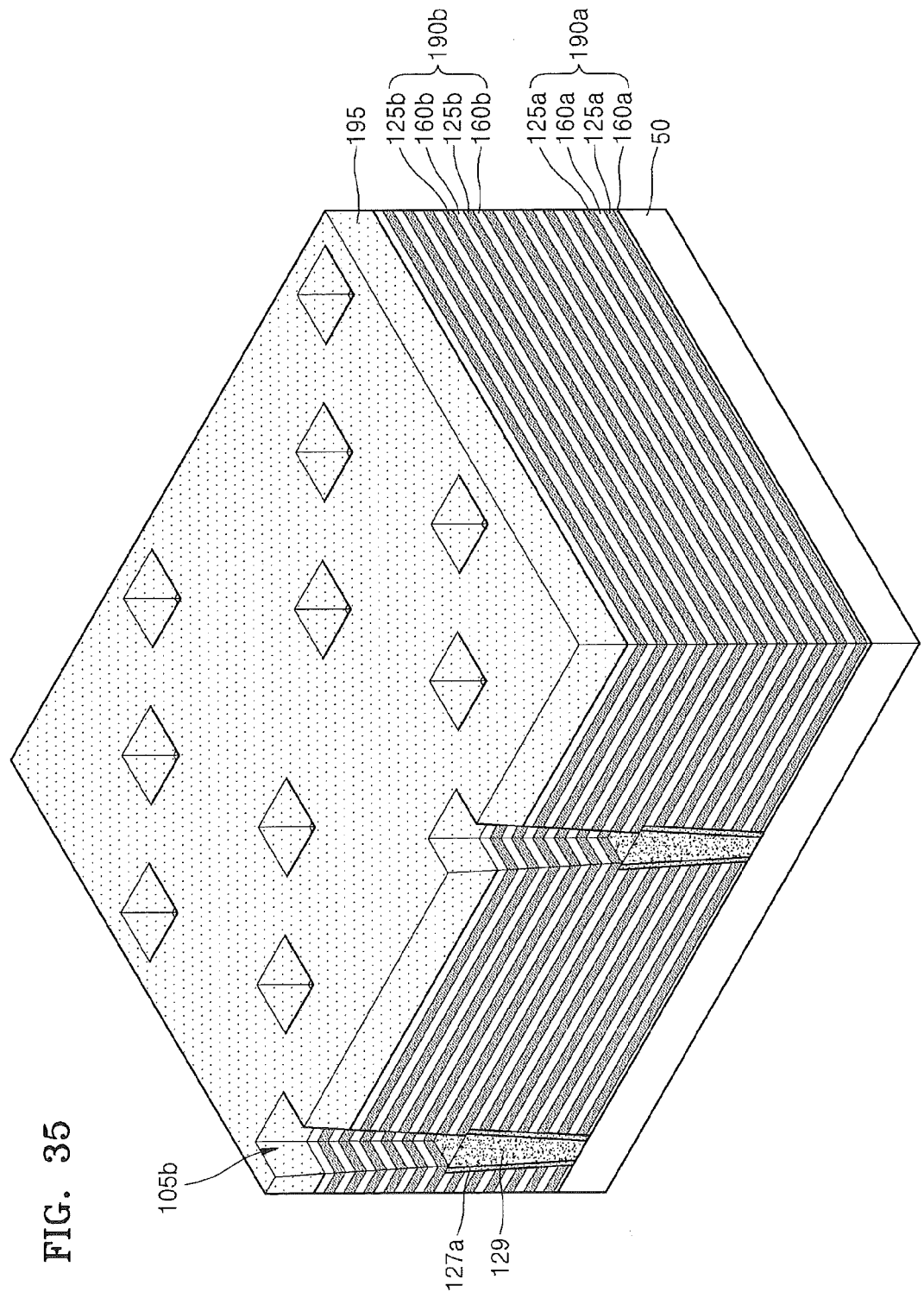

Referring to FIG. 35, upper channel holes 105b penetrating through the upper mold stack 190b are formed. The upper channel holes 105b may be 2-dimensionally arranged so as to expose the closed insulating layer 129. The upper channel holes 105b may be disposed to overlap with the lower channel holes 105a. The upper channel holes 105b may be tapered toward the lower channel holes 105a.

In order to form the upper channel holes 105b, a mask pattern (not shown) defining locations of the upper channel holes 105b of the upper mold stack 190b may be formed, and then the buffer layer 195 and the upper mold stack 190b may be etched by using the mask pattern as an etching mask.

Figure 36:
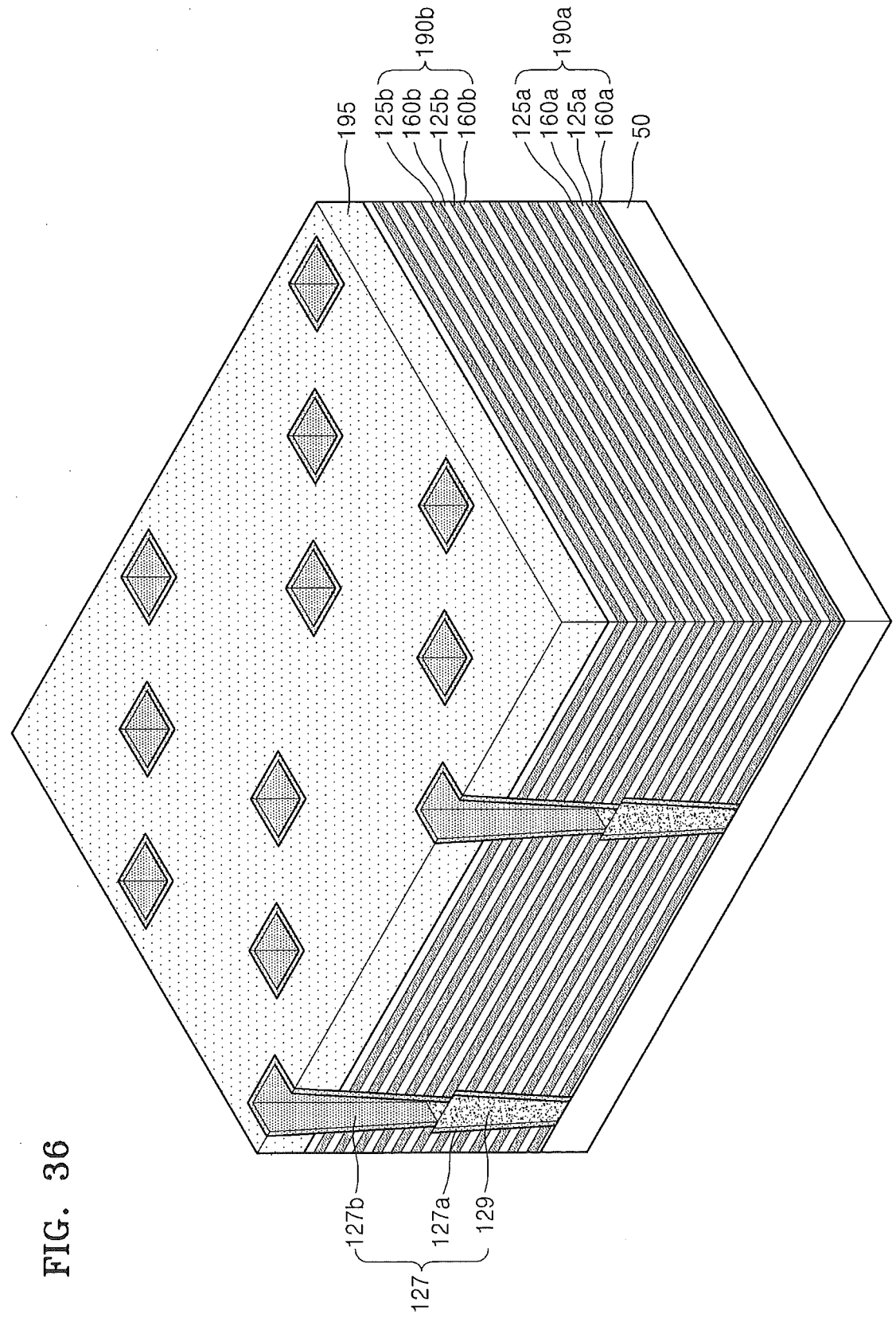

Referring to FIG. 36, an upper sacrificial spacer 127b surrounding a side wall of the upper channel hole 105b is formed. As described above, the upper sacrificial spacer 127b may be formed of the same material as the upper sacrificial insulating layer 125b, and may include a silicon oxide, a silicon nitride, silicon carbide, silicon, or silicon germanium. Like the lower sacrificial spacer 127a, the upper sacrificial spacer 127b may be formed only on a side wall of the upper sacrificial insulating layer 125b and a side wall of the upper insulating layer 160b, thereby exposing an upper surface of the closed insulating layer 129.

Figure 37:
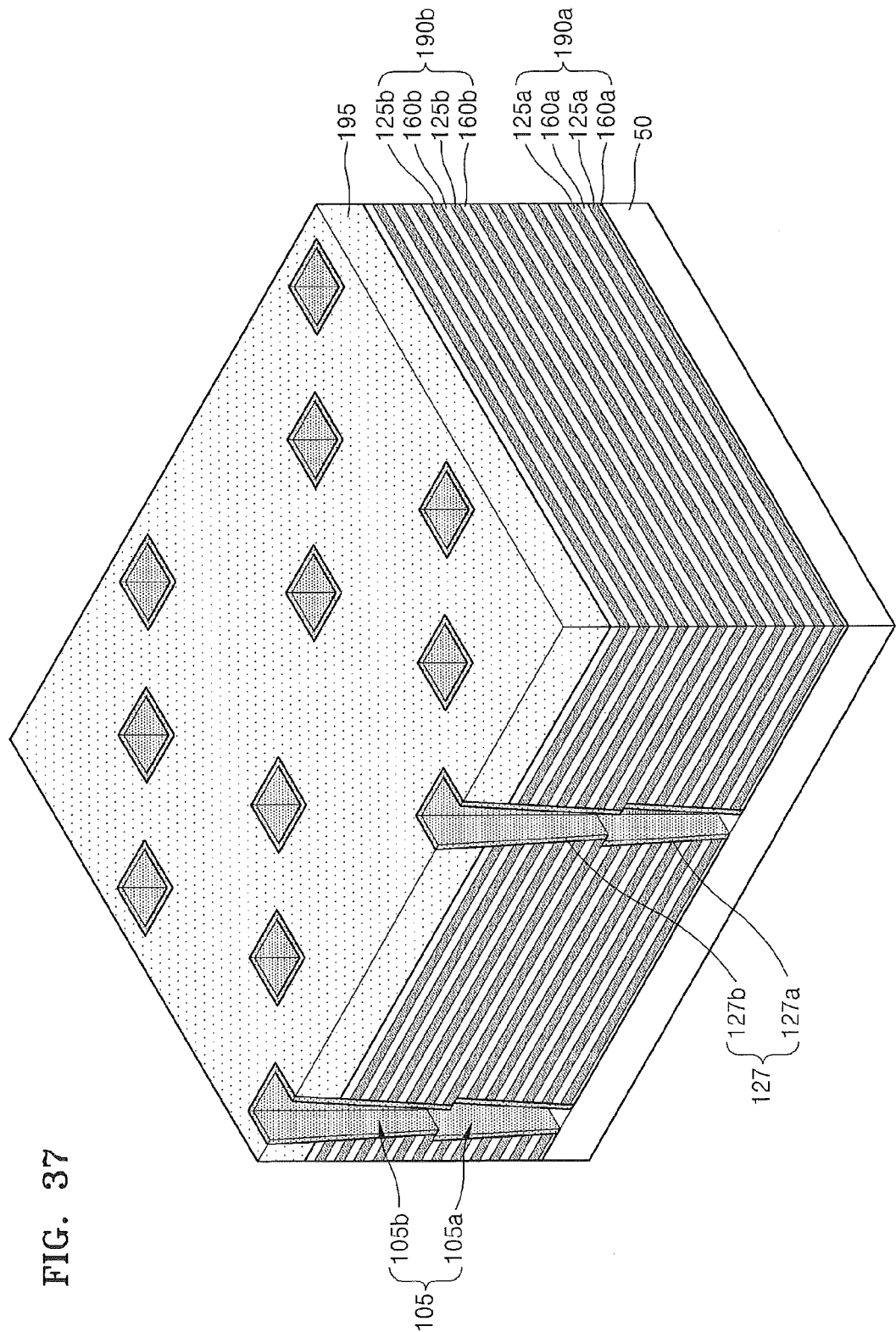

Referring to FIG. 37, the top surface of the substrate 50 is exposed by removing the closed insulating layer 129. In other words, the lower channel hole 105a is opened. While opening the lower channel hole 105a, the upper sacrificial spacer 127b and the lower sacrificial spacer 127a prevent the lower and upper sacrificial insulating layers 125a and 125b and the lower and upper insulating layers 160a and 160b from being damaged. Accordingly, even when the closed insulating layer 129 is removed, the lower sacrificial spacer 127a remains since the lower sacrificial spacer 127a has the etch selectivity with the closed insulating layer 129.

Figure 38:
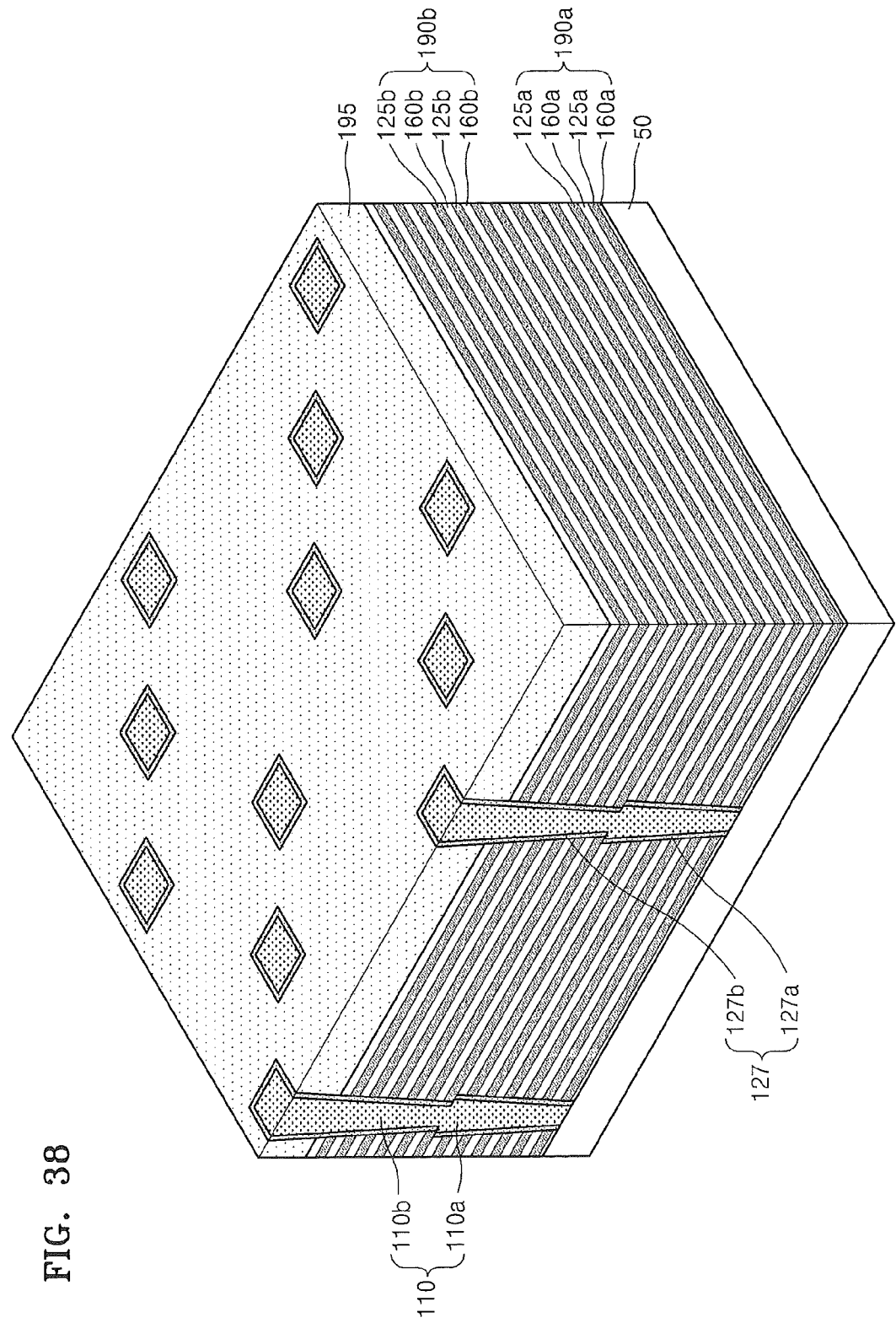

Referring to FIG. 38, the channel layer 110 filling the lower channel hole 105a and the upper channel hole 105b is formed. In detail, a lower channel layer 110a and an upper channel layer 110b respectively filling the lower channel hole 105a and the upper channel hole 105b may be simultaneously formed. Accordingly, the lower channel layer 110a and the upper channel layer 110b may be formed as a continuously connected single body.

In order to form the channel layer 110, the lower channel hole 105a and the upper channel hole 105b may be formed of a semiconductor material including silicon. Accordingly, the channel layer 110 may include a silicon epitaxial layer having a single or multi crystal structure. Next, a CMP or etch back process may be performed until the top surface of the buffer layer 195 is exposed so as to separate the channel layers 110 from each other.

Figure 39A:
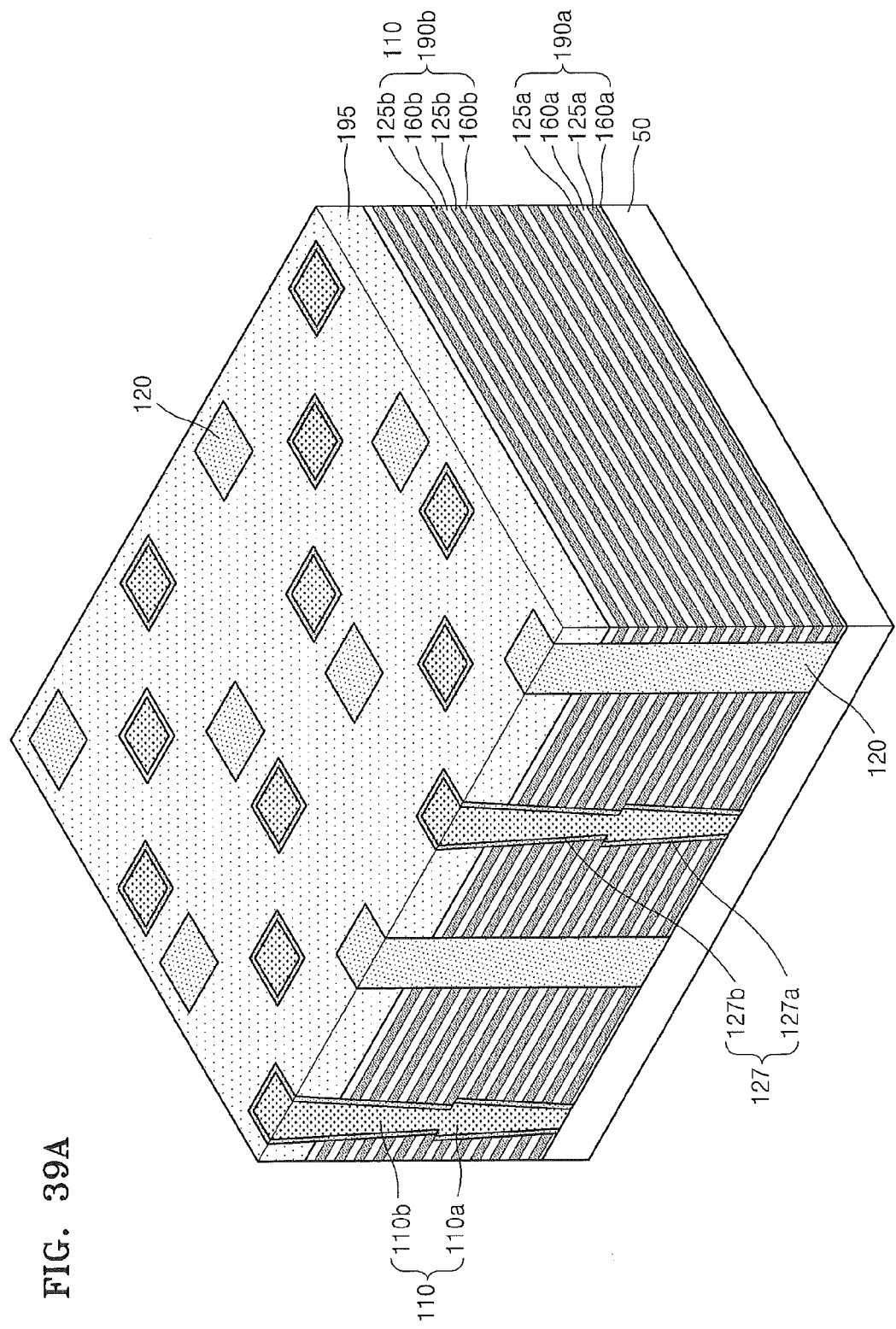
Figure 39B:
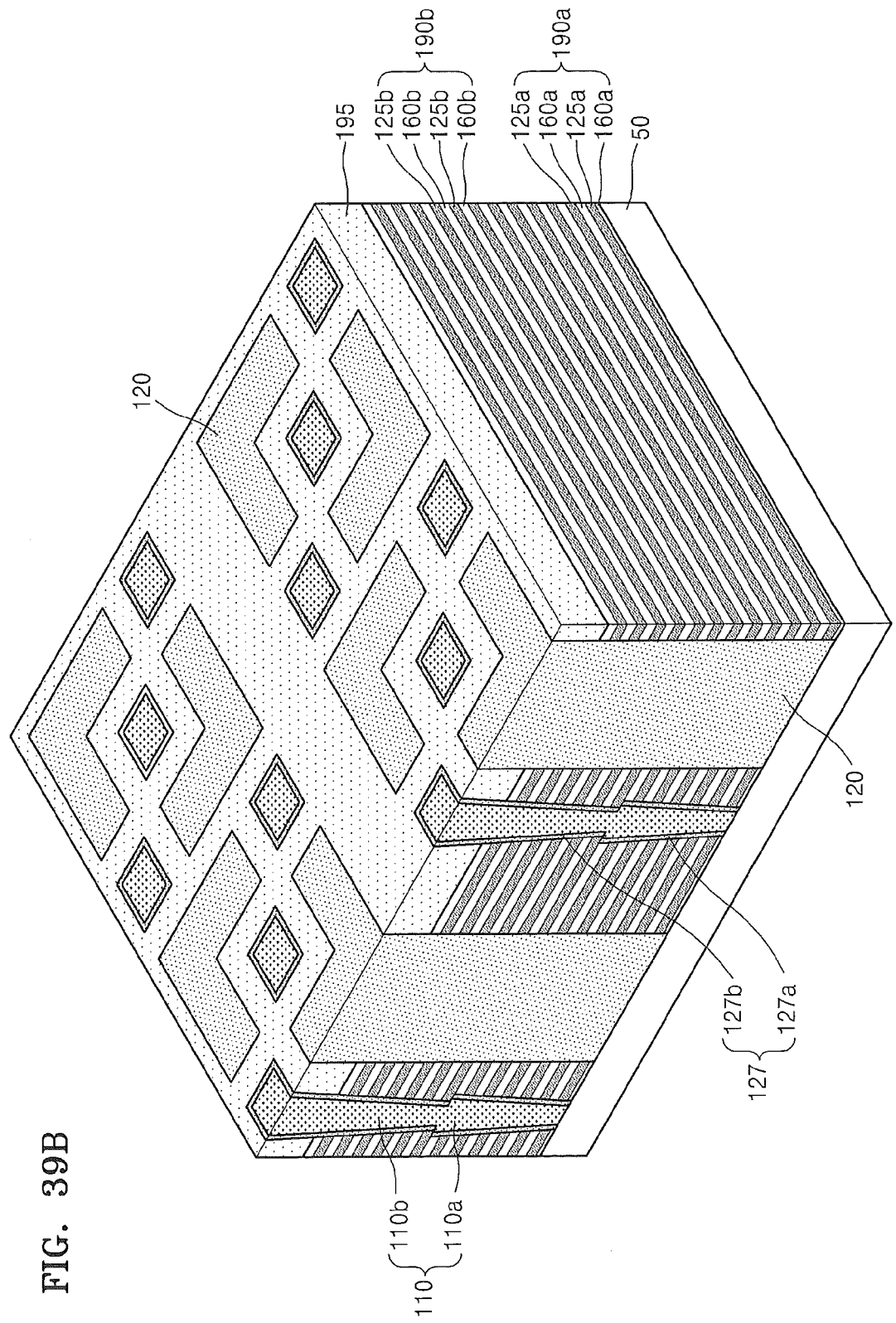

Referring to FIG. 39A, a dummy hole is formed by etching the buffer layer 195, the upper mold stack 190b, and the upper mold stack 190a, and the supporting insulating layer 120 filling the dummy hole is formed. The supporting insulating layer 120 may be formed of a material having a different etch selectivity from the sacrificial insulating layer 125 and the sacrificial spacer 127. Each of the supporting insulating layers 120 may be disposed between the channel layers 110. Also, the supporting insulating layers 120 may be disposed in zigzag patterns when viewed in a plan view.

As described above, the supporting insulating layer 120 may prevent the lower and upper insulating layers 160a and 160b from sinking during the pull back process for etching the sacrificial insulating layer 125. Accordingly, the supporting insulating layer 120 has a square pillar shape, but a shape of the supporting insulating layer 120 is not limited thereto.

Figure 39C:
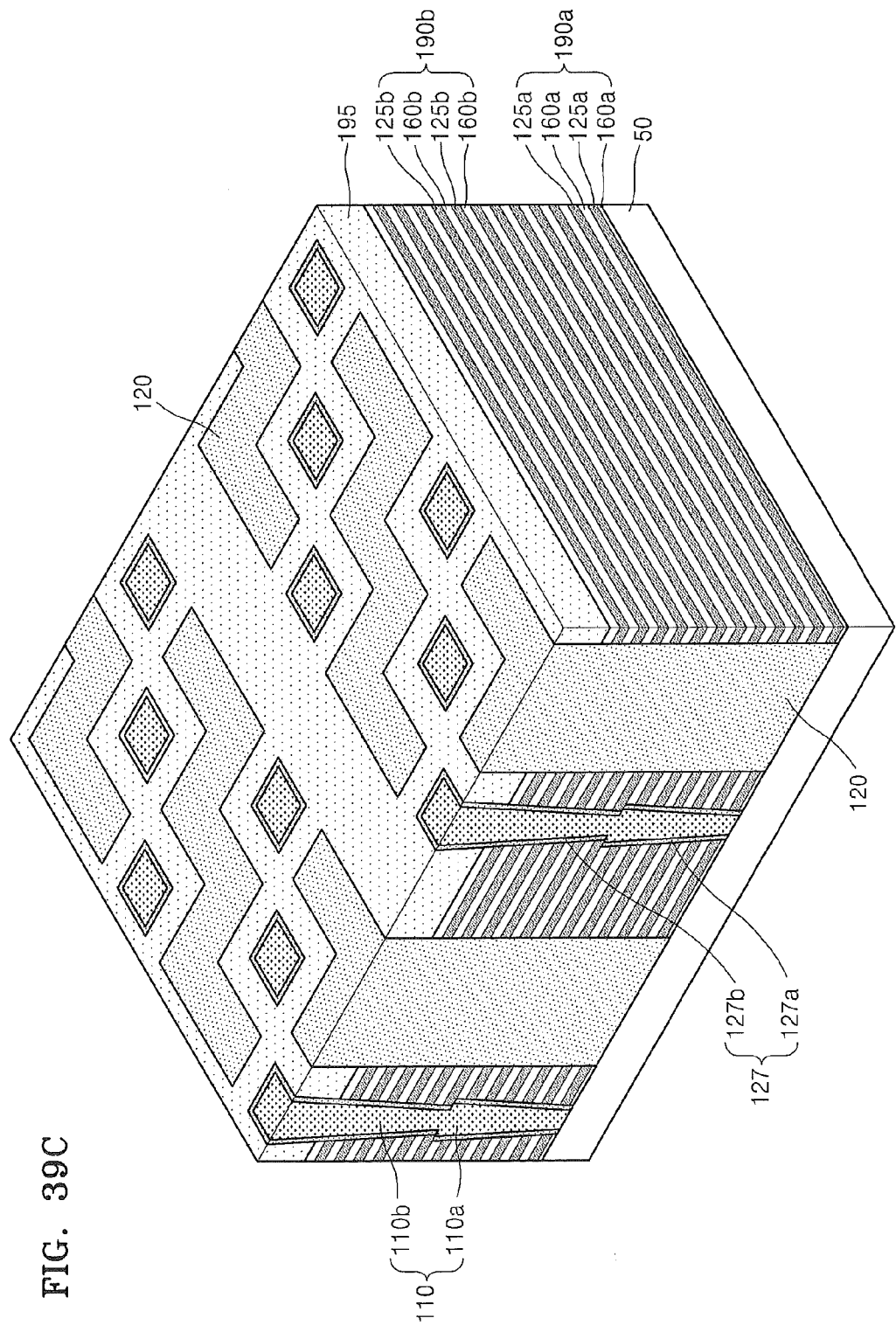

For example, as shown in FIG. 38B, the supporting insulating layer 120 may have an L-shaped pillar shape. Alternatively, as shown in FIG. 39C, the supporting insulating layer 120 may have a shape where L-shaped pillars are connected to each other. In detail, the supporting insulating layer 120 may have a predetermined shape that prevents the lower and upper insulating layers 160a and 160b from sinking.

Figure 40:
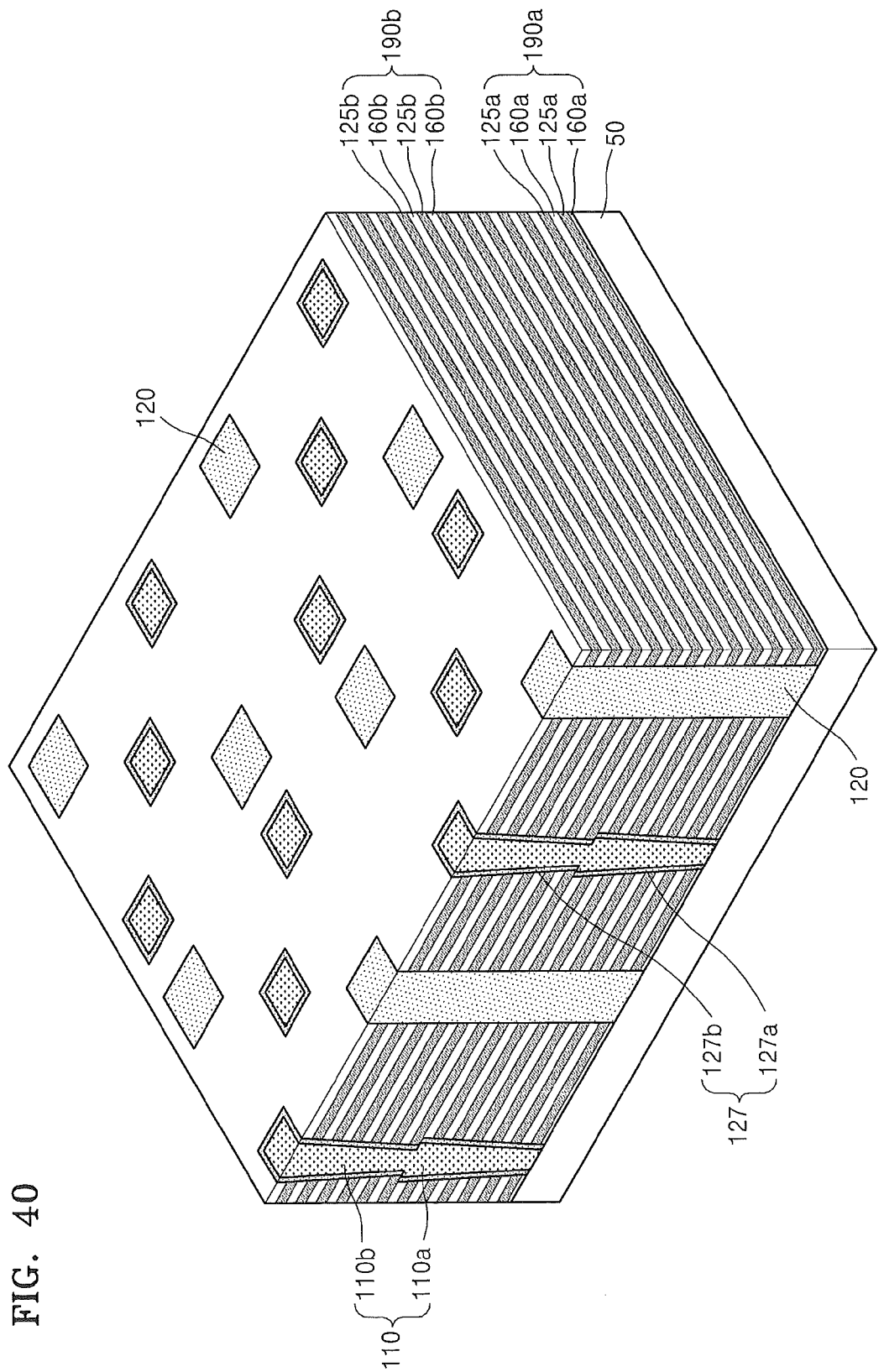

Referring to FIG. 40, the top surface of the upper mold stack 190b is exposed by removing the buffer layer 195. A CMP or phosphate strip process may be performed to remove the buffer layer 195. As described above, the buffer layer 195 and the upper sacrificial spacer 127b may be formed of the same material, such as a silicon nitride, and at this time, a part of the upper sacrificial spacer 127b may be removed during the phosphate strip process. In detail, as shown in FIG. 8, the part of a top of the upper sacrificial spacer 127b contacting the buffer layer 195 may be removed during the phosphate strip process. Here, not only the top surface of the channel layer 110, but also a top side wall of the channel layer 110 may be exposed during the phosphate strip process.

Figure 41:
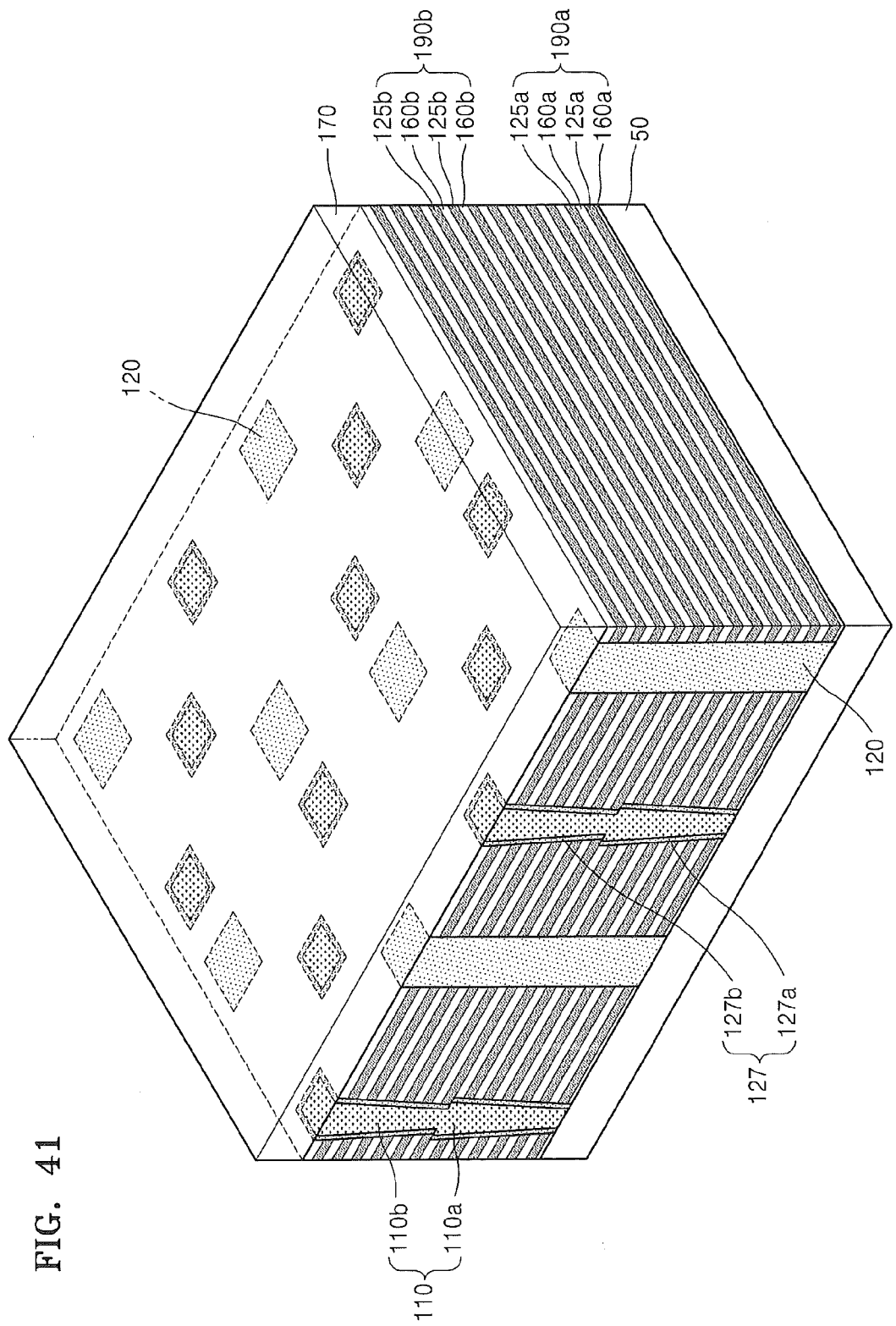

Referring to FIG. 41, the second insulating layer 170 is formed on the upper mold stack 190b. The second insulating layer 170 may be formed of a material having an etch selectivity with the sacrificial insulating layer 125 and the sacrificial spacer 127. The second insulating layer 170 prevents a channel from falling down or being lifted during the pull back process, and accordingly, the second insulating layer 170 may contact the upper surface of the channel layer 110. Moreover, as shown in FIG. 9, the second insulating layer 170 may contact the side wall of the upper insulating layer 160b and the side wall of the channel layer 110.

Figure 42:
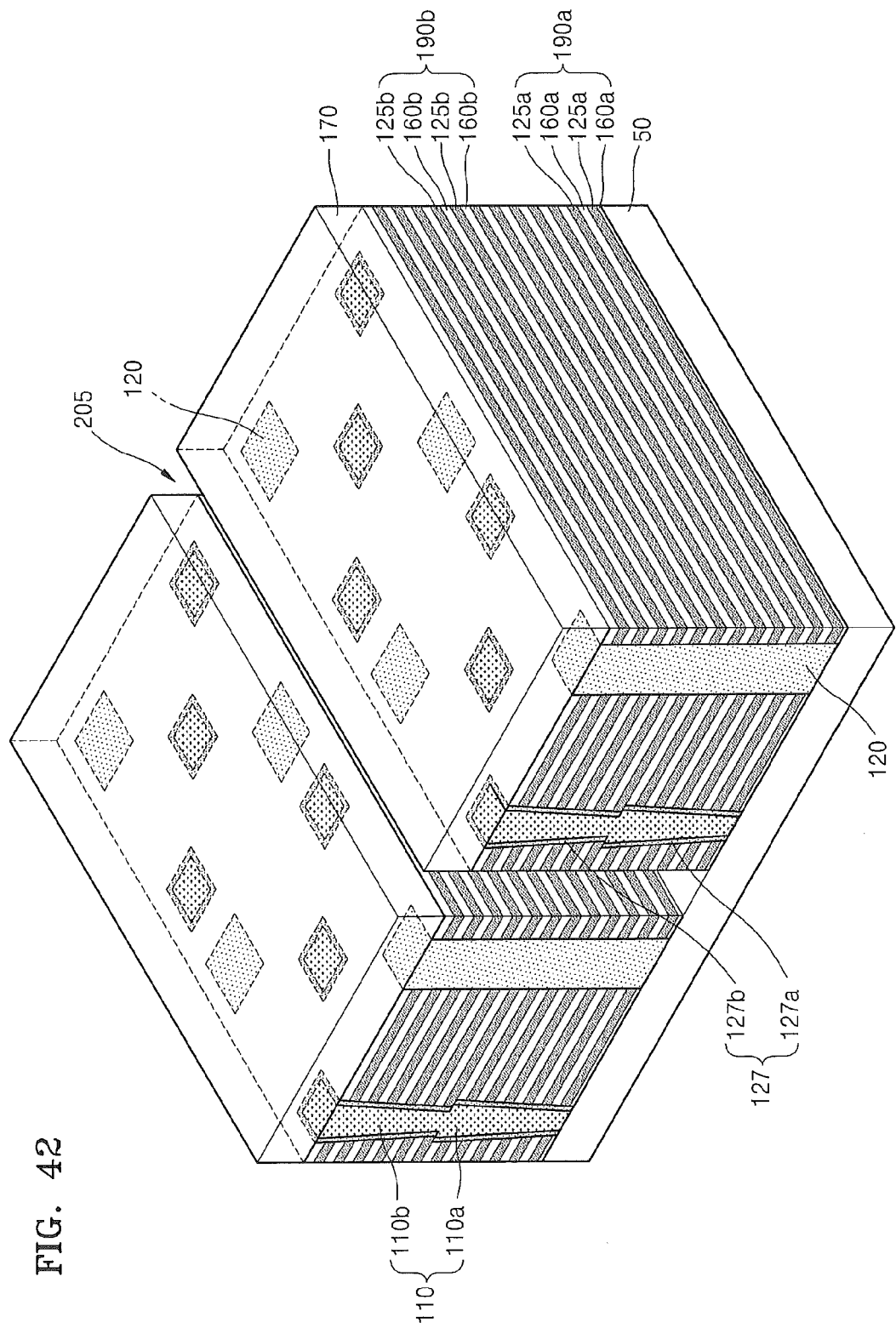

Referring to FIG. 42, in order to perform the pull back process for etching the sacrificial insulating layer 125 and the sacrificial spacer 127, the wordline recess 205 is formed by etching the second insulating layer 170, the upper mold stack 190b, and the lower mold stack 190a. Here, the wordline recess 205 may be disposed between the channel layer 110 and the supporting insulating layer 120.

Figure 43:
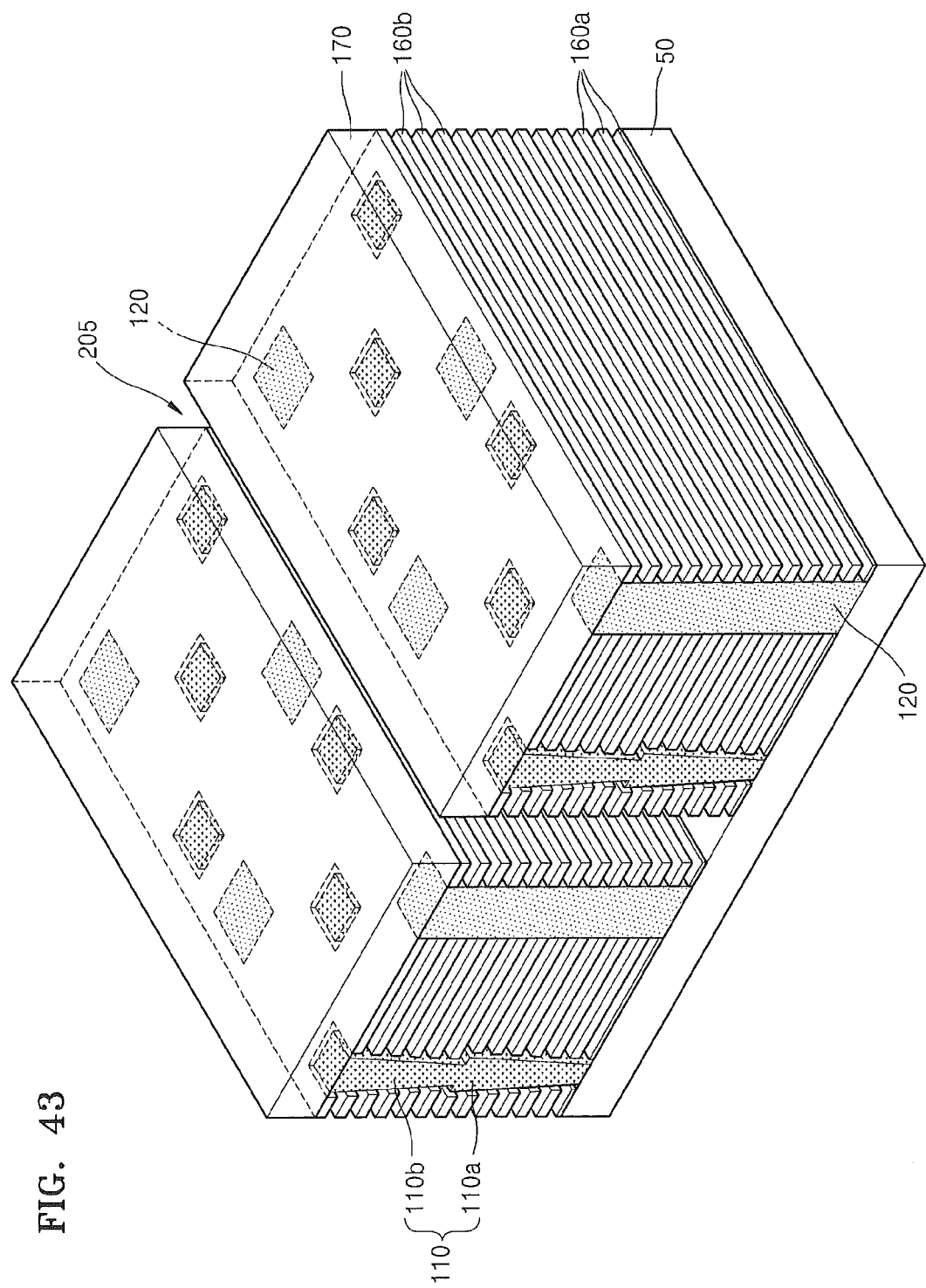

Referring to FIG. 43, the first insulating layer 160 and the channel layer 110 are exposed by etching the sacrificial insulating layer 125 and the sacrificial spacer 127. When the sacrificial insulating layer 125 and the sacrificial spacer 127 are formed of silicon nitride, the sacrificial insulating layer 125 and the sacrificial spacer 127 may be removed through the phosphate strip process. Alternatively, when the sacrificial insulating layer 125 and the sacrificial spacer 127 are formed of silicon germanium, the sacrificial insulating layer 125 and the sacrificial spacer 127 may be removed by using standard clean-1 (SC-1) obtained by mixing ammonia, hydrogen peroxide, and water.

Figure 44:
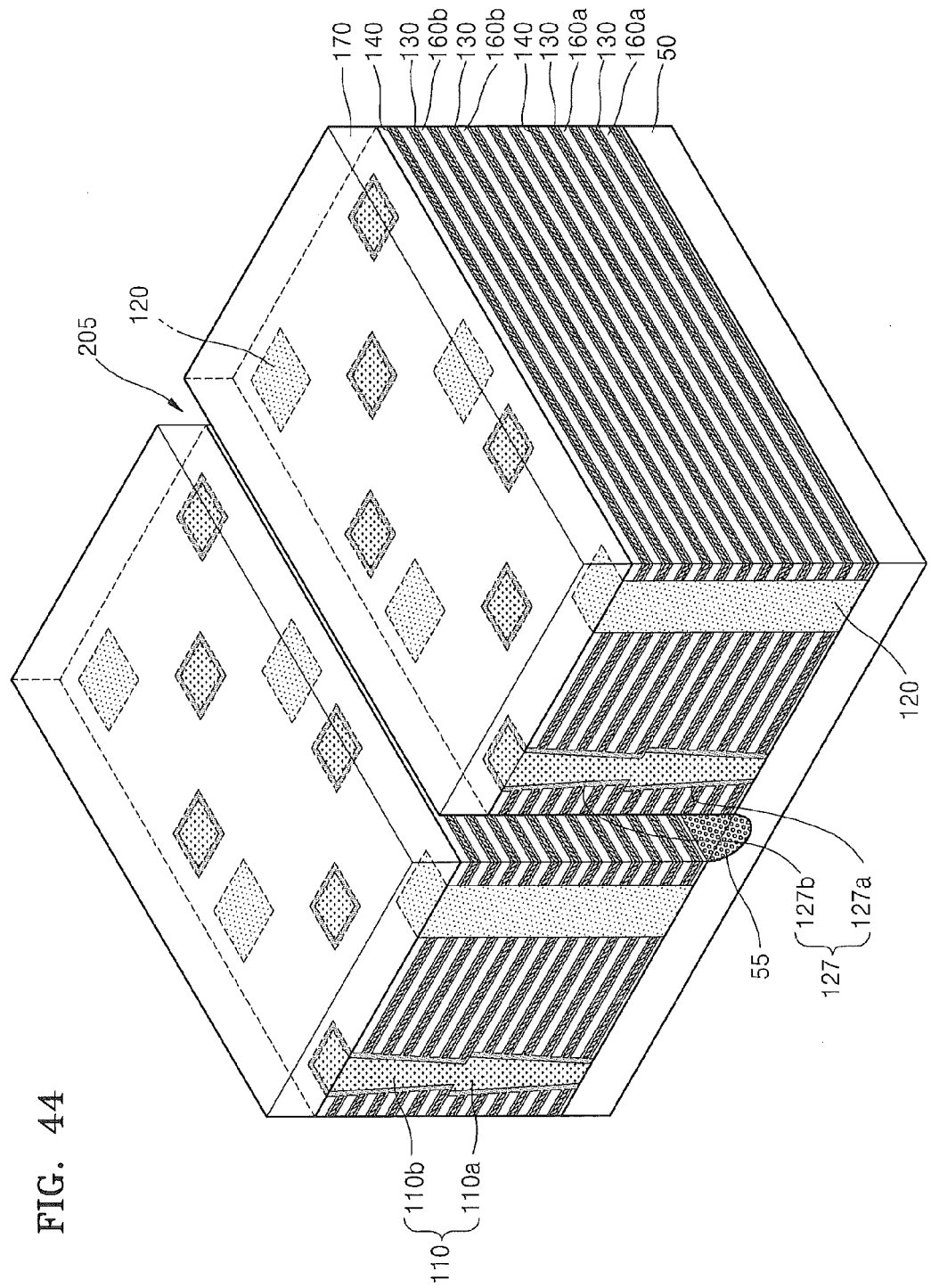

Referring to FIG. 44, the gate insulating layer 140 and the gate conductive layer 130 are formed on the exposed first insulating layer 160 and the exposed channel layer 110. As described above, the gate insulating layer 140 may include the tunneling insulating layer 142, the charge storage layer 144, and the blocking insulating layer 146 of FIG. 2. Also, as described above, an air gap may be formed (refer to FIG. 11A) or may not be formed (refer to FIG. 11B) between the gate insulating layer 140 and the channel layer 110 according to step coverage of the gate insulating layer 140.

Then an impurity area 55 is formed on a top surface of the substrate 50 by injecting impurities into the substrate 50 through the wordline recess 205. The impurity area 55 may be formed along an extending direction of the wordline recess 205. The impurity area 55 may be electrically connected to a common source line CSL of FIG. 74. The impurity area 55 may have same or opposite conductivity as or to the substrate 50. When the impurity area 55 has the opposite conductivity to the substrate 50, the impurity area 55 and the substrate 50 may form a P-N junction.

Figure 45:
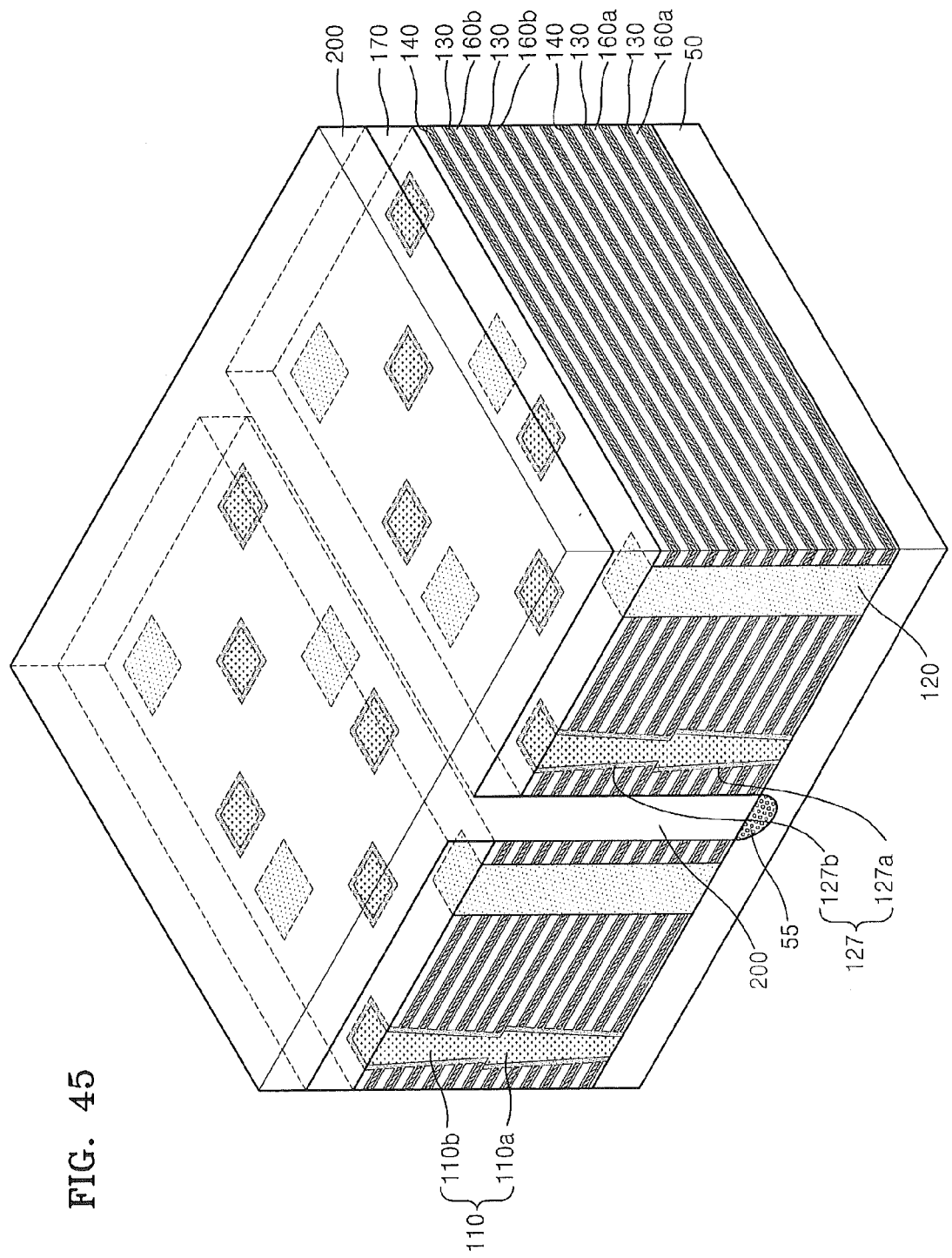
Figure 46:
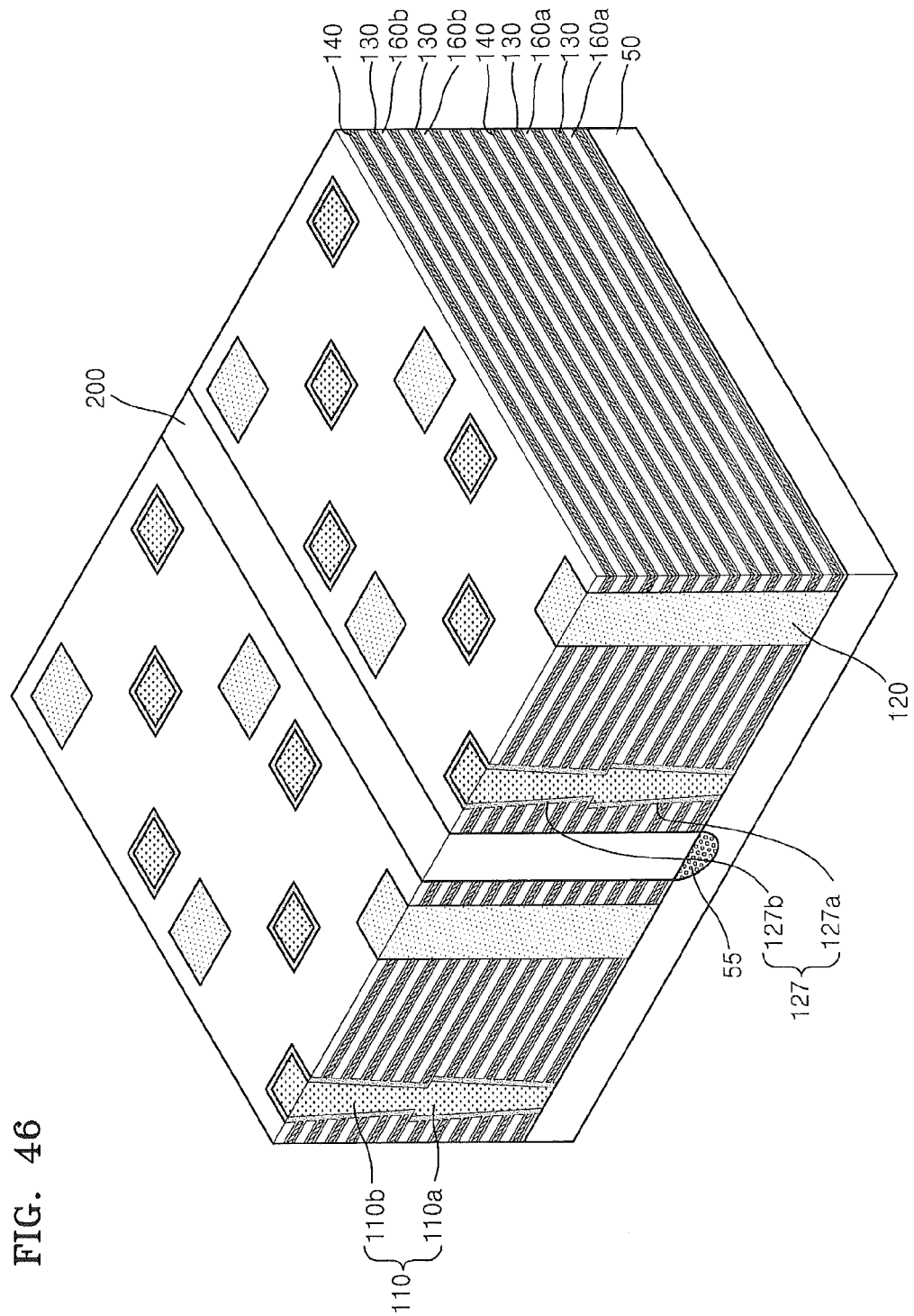

Referring to FIGS. 45 and 46, the separating insulating layer 200 filling the wordline recess 205 is formed, and then a CMP process is performed to remove the separating insulating layer 200 and the second insulating layer 170.

Figure 47:
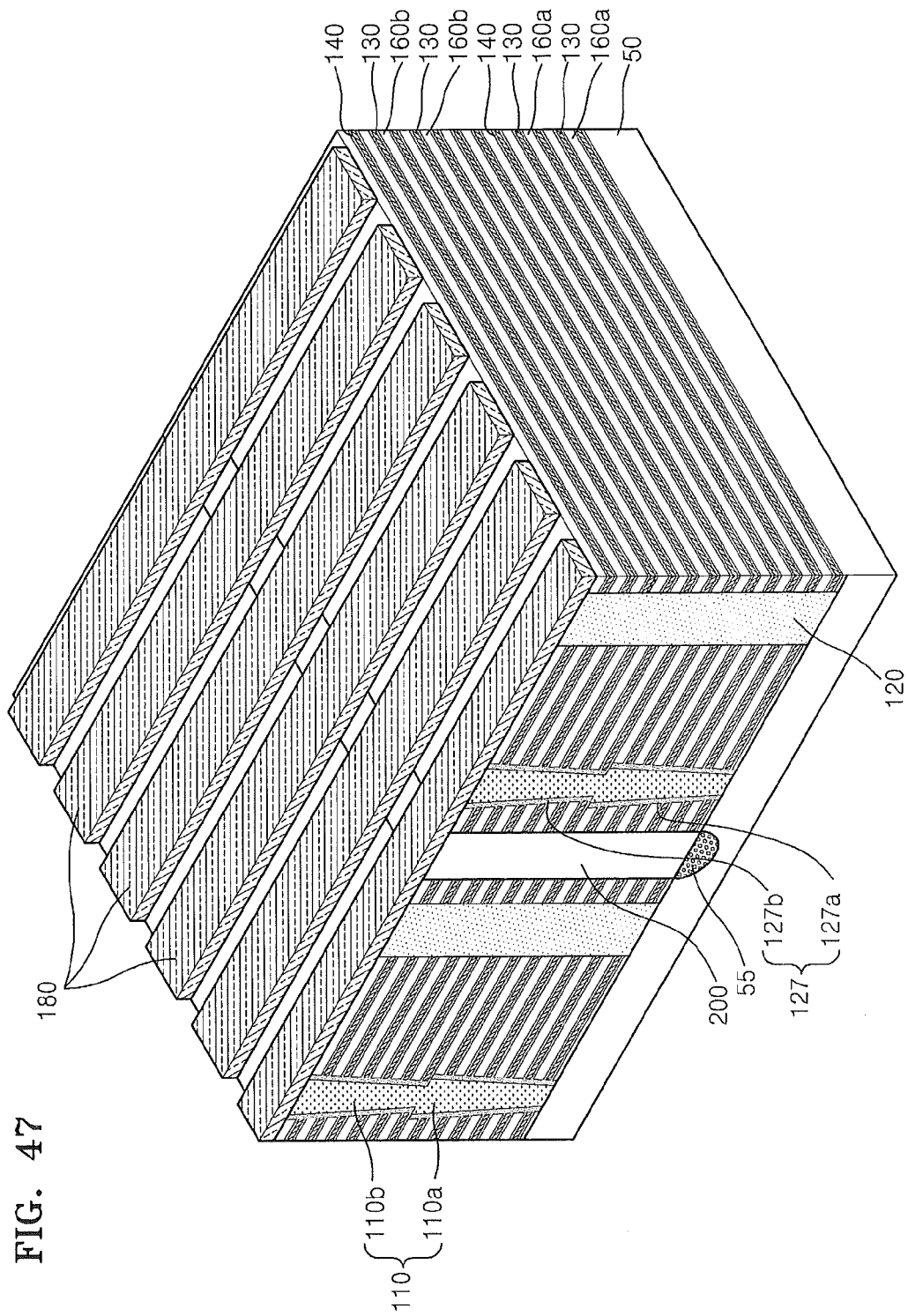

Referring to FIG. 47, the bitline conductive layer 180 is formed on the first insulating layer 160, the channel layer 110, and the separation insulating layer 200. The bitline conductive layer 180 may extend in a direction perpendicular to an extending direction of the separating insulating layer 200.

FIGS. 48 through 61 are perspective views for describing a method of manufacturing a nonvolatile memory device, according to another exemplary embodiment of the inventive concept. The method may be obtained by partially modifying the method of FIGS. 30 through 47. Overlapping descriptions thereof will not be repeated.

Figure 48:
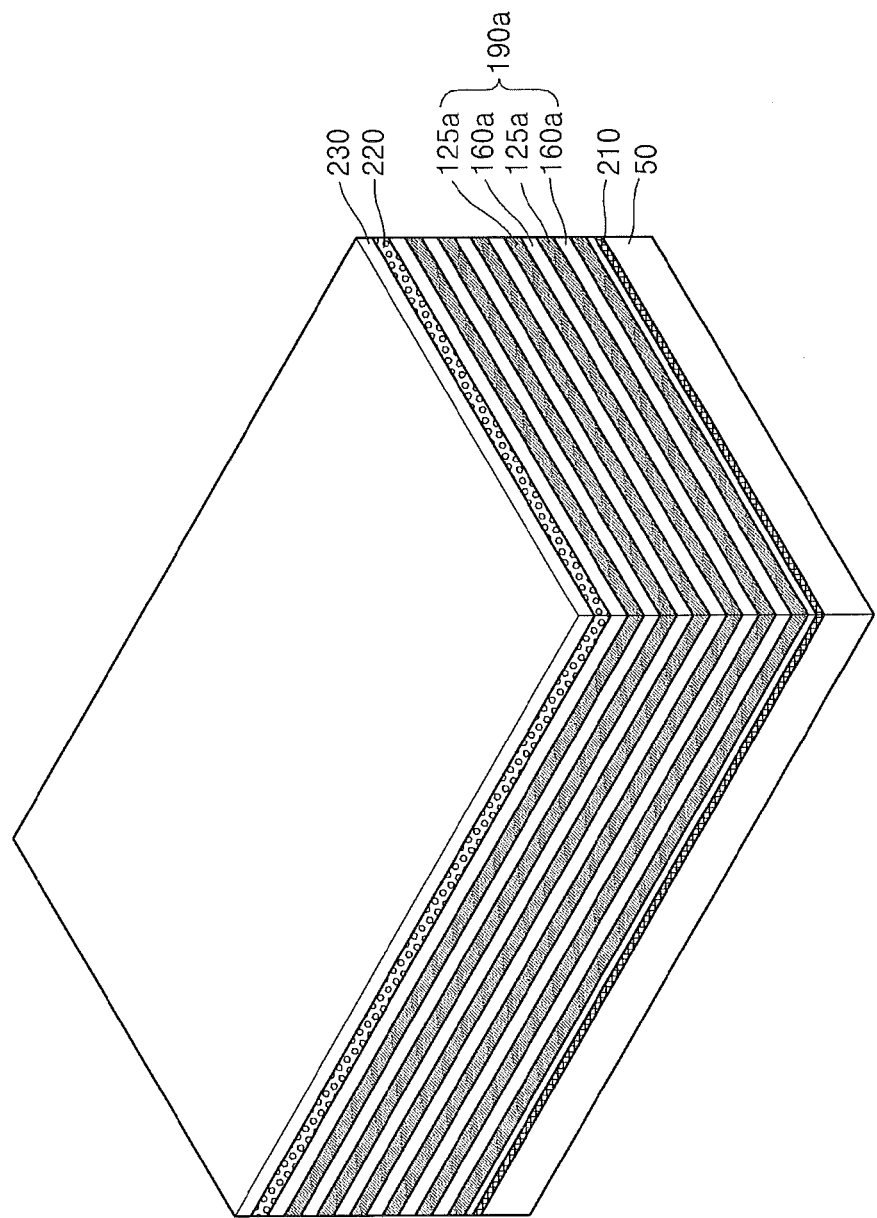
FIGS. 48 through 61 are perspective views for describing a method of manufacturing a nonvolatile memory device, according to another exemplary embodiment of the inventive concept.

Referring to FIG. 48, a stopping layer 210, the lower mold stack 190a, and a mask layer 220 are sequentially formed on the substrate 50. As described above, the lower mold stack 190a may include the lower sacrificial insulating layer 125a and the lower insulating layer 160a, wherein the lower sacrificial insulating layer 125a and the lower insulating layer 160 have an etch selectivity with each other. In order to improve uniformity of a selective growth process, a lid layer 230 may be selectively formed on the mask layer 220.

Figure 49:
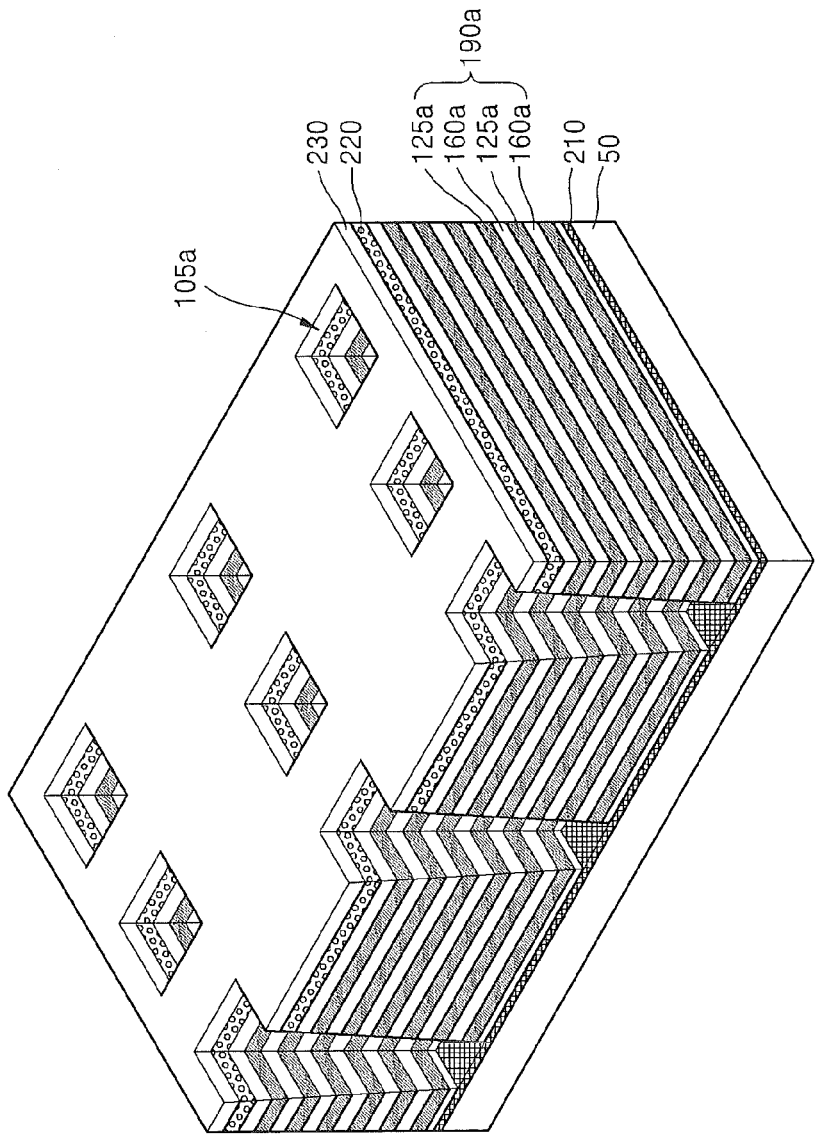

Referring to FIG. 49, the lower channel holes 105 penetrating through the lid layer 230, the mask layer 220, and the lower mold stack 190a are formed. The lower channel holes 105a may be 2-dimensionally arranged to expose the stopping layer 210. The stopping layer 210 may operate as an etch stopping layer during an etch process for forming the lower channel hole 105a. Accordingly, the stopping layer 210 may be formed of a material having an etch selectivity with both the lower sacrificial insulating layer 125a and the lower insulating layer 160a.

For example, the lower sacrificial insulating layer 125a may be formed of a silicon nitride, and the lower insulating layer 160a may be formed of a silicon oxide. Here, the stopping layer 210 may include a material such as an aluminum oxide (Al2O3), a tantalum nitride (TaN), or silicon carbide (SiC) having an etch selectivity with both a silicon nitride and a silicon oxide.

Figure 50:
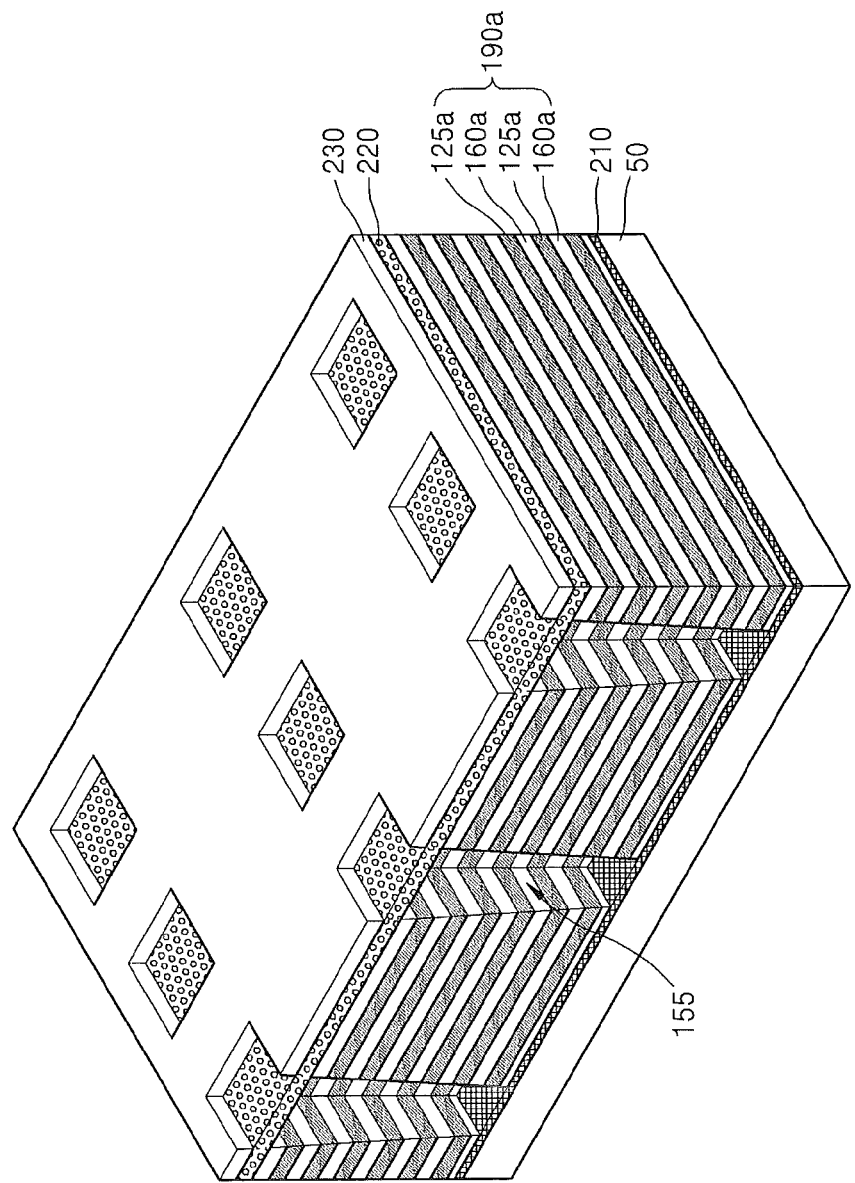

Referring to FIG. 50, in order to close the lower channel hole 105a, a selective growth process is performed on the mask layer 220. In detail, the mask layer 220 is selectively grown to close the lower channel hole 105a with the mask layer 220. Accordingly, an air gap 155 may be formed between the mask layer 220 and the substrate 50.

The mask layer 220 may include silicon (Si) or silicon germanium (SiGe) having a single or multi crystal structure. Here, the lower channel hole 105a may be closed by performing a selective epitaxial growth process on the mask layer 220. The stopping layer 210 may prevent the substrate 50 including a semiconductor material from growing while the mask layer 220 grows. Accordingly, the stopping layer 210 may operate not only as an etch stopping layer but also as a growth stopping layer during a selective growth process for closing the lower channel hole 105a.

In FIG. 50, the lid layer 230 is formed on the mask layer 220, and thus only a side wall of the mask layer 220 is grown during the selective growth process. However, the selective growth process may be performed even when the lid layer 230 is not formed on the mask layer 220. At this time, the selective growth process may be performed on a top surface and the side wall of the mask layer 220 to close the lower channel hole 105a.

In order to close the lower channel hole 105a with the mask layer 220, a thermal expansion process may be selectively performed on the mask layer 220 by heating the mask layer 220. In other words, when the mask layer 220 is heated, an exposed side wall of the mask layer 220 is expanded, thereby closing the lower channel hole 105a. Furthermore, the thermal expansion process and the selective growth process may be simultaneously performed so as to quickly close the lower channel hole 105a with the mask layer 220.

Figure 51:
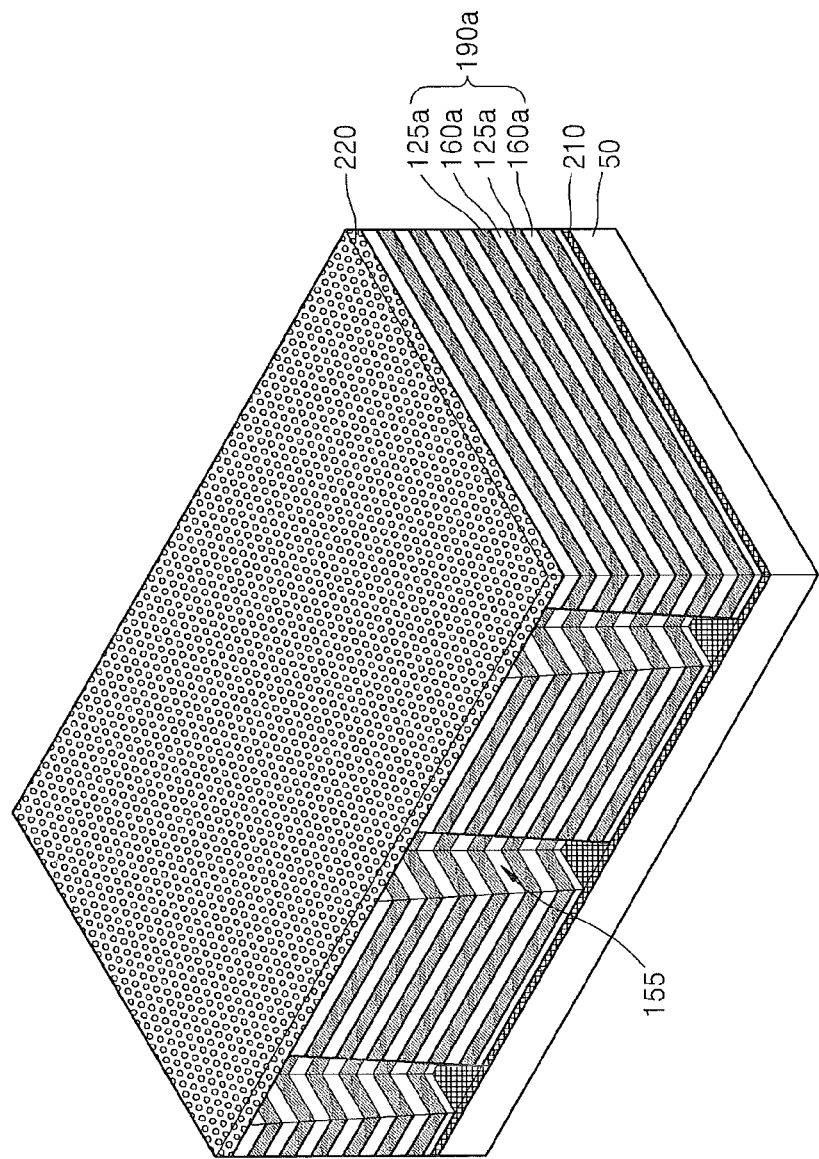

Referring to FIG. 51, the mask layer 220 is exposed by removing the lid layer 230. For example, the lid layer 230 may include a silicon oxide, and may be removed via a wet or dry etching process of the silicon oxide. Then, an oxidation process may be selectively performed on the exposed mask layer 220. For example, when the mask layer 220 include silicon, a wet or dry oxidation process may be performed on the mask layer 220, and thus the mask layer 220 may include a silicon oxide.

Figure 52:
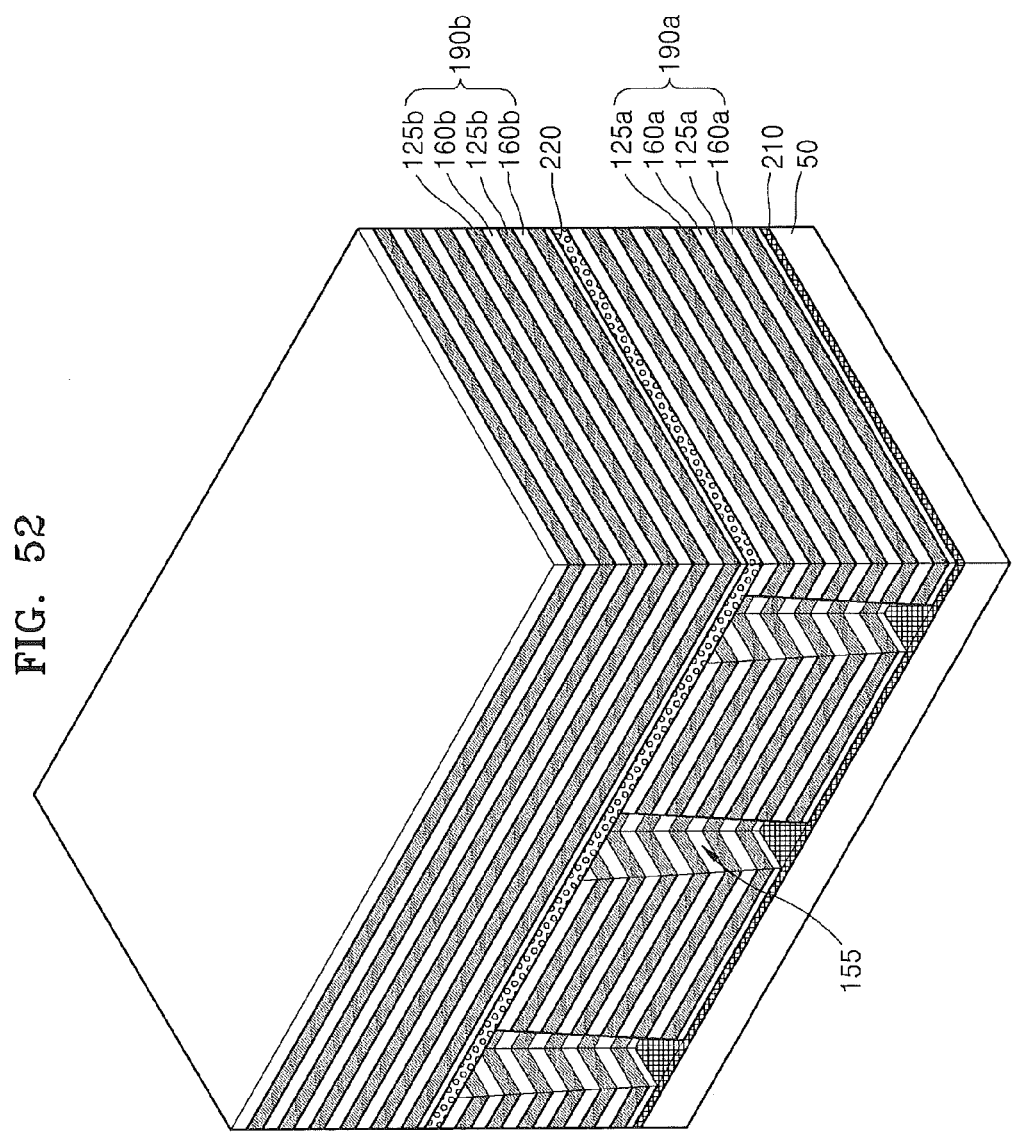

Referring to FIG. 52, the upper mold stack 190b is formed on the mask layer 220. As described above, the upper mold stack 190b may include the upper sacrificial insulating layer 125b and the upper insulating layer 160b, wherein the upper sacrificial insulating layer 125b and the upper insulating layer 160b have an etch selectivity with each other.

Figure 53:
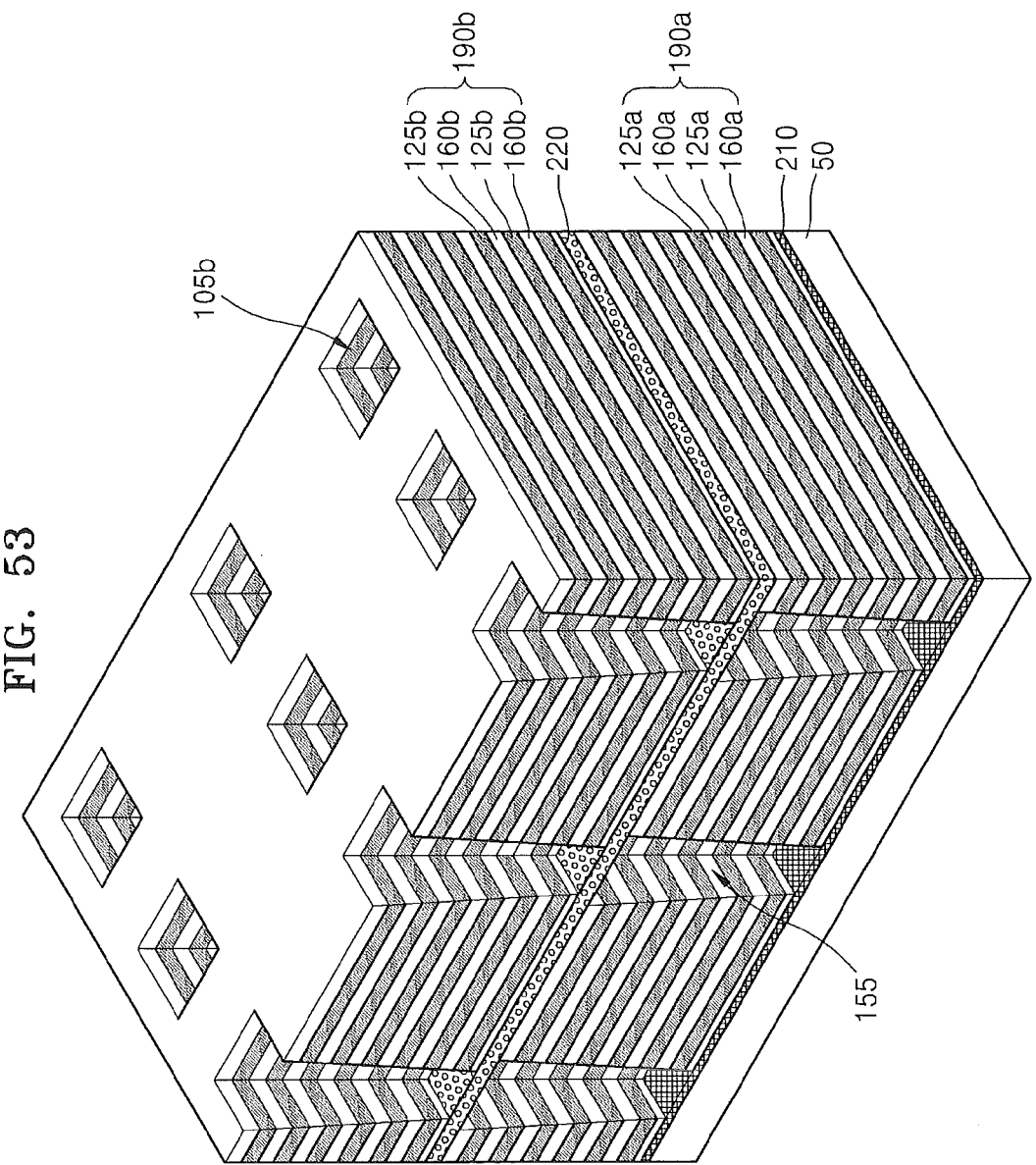

Referring to FIG. 53, the upper channel holes 105b penetrating through the upper mold stack 190b are formed. The upper channel holes 105b are 2-dimensionally arranged to expose the mask layer 220. The upper channel holes 105b may be arranged to overlap with the lower channel holes 105a.

Figure 54:
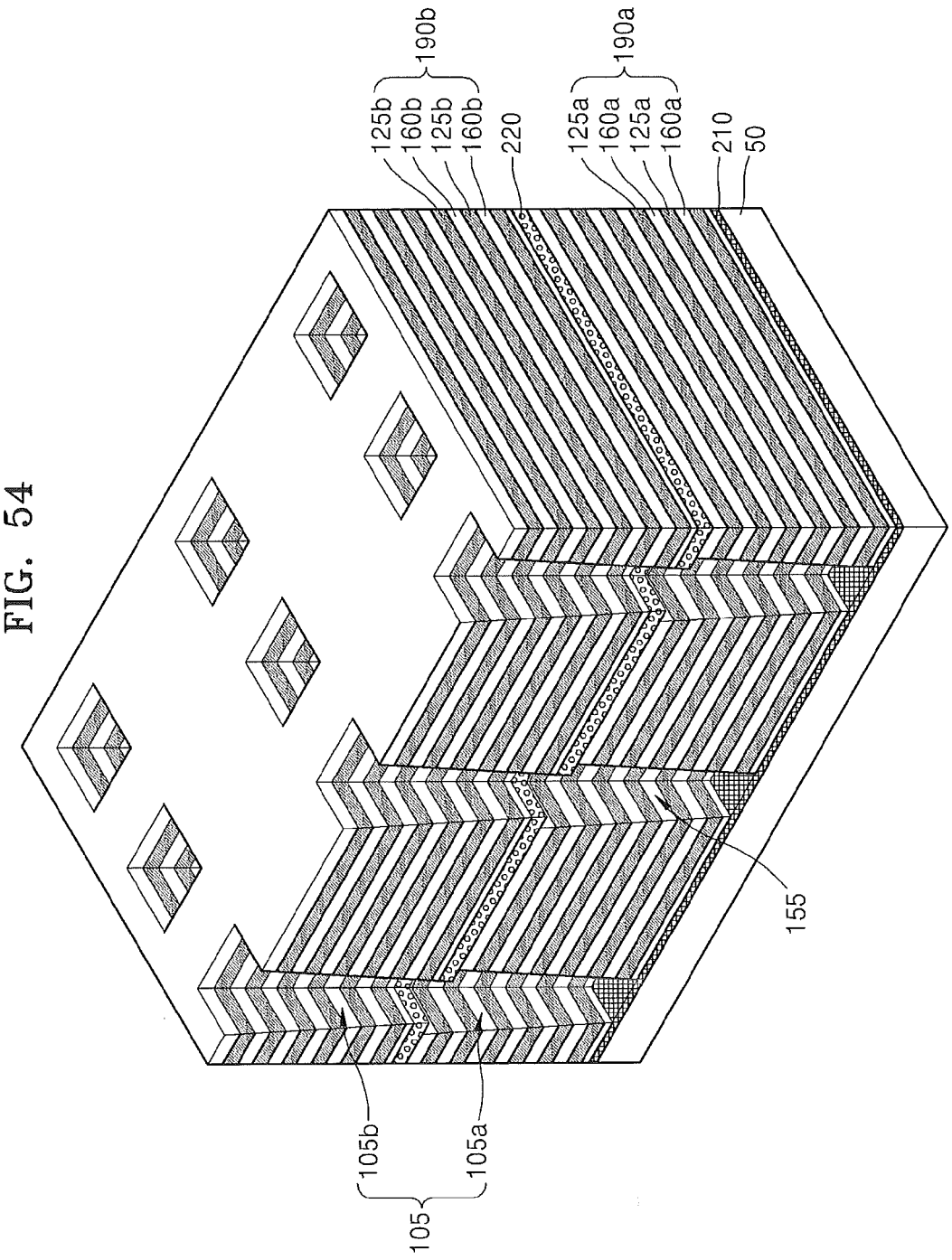

Referring to FIG. 54, the top surface of the stopping layer 210 is exposed by removing the mask layer 220. In other words, the lower channel hole 105a is opened again. Even when the mask layer 220 is removed, the stopping layer 210 remains since the stopping layer 210 has an etch selectivity with the mask layer 220. Accordingly, the stopping layer 210 prevents the substrate 50 from being damaged while opening the lower channel hole 105a.

Figure 55:
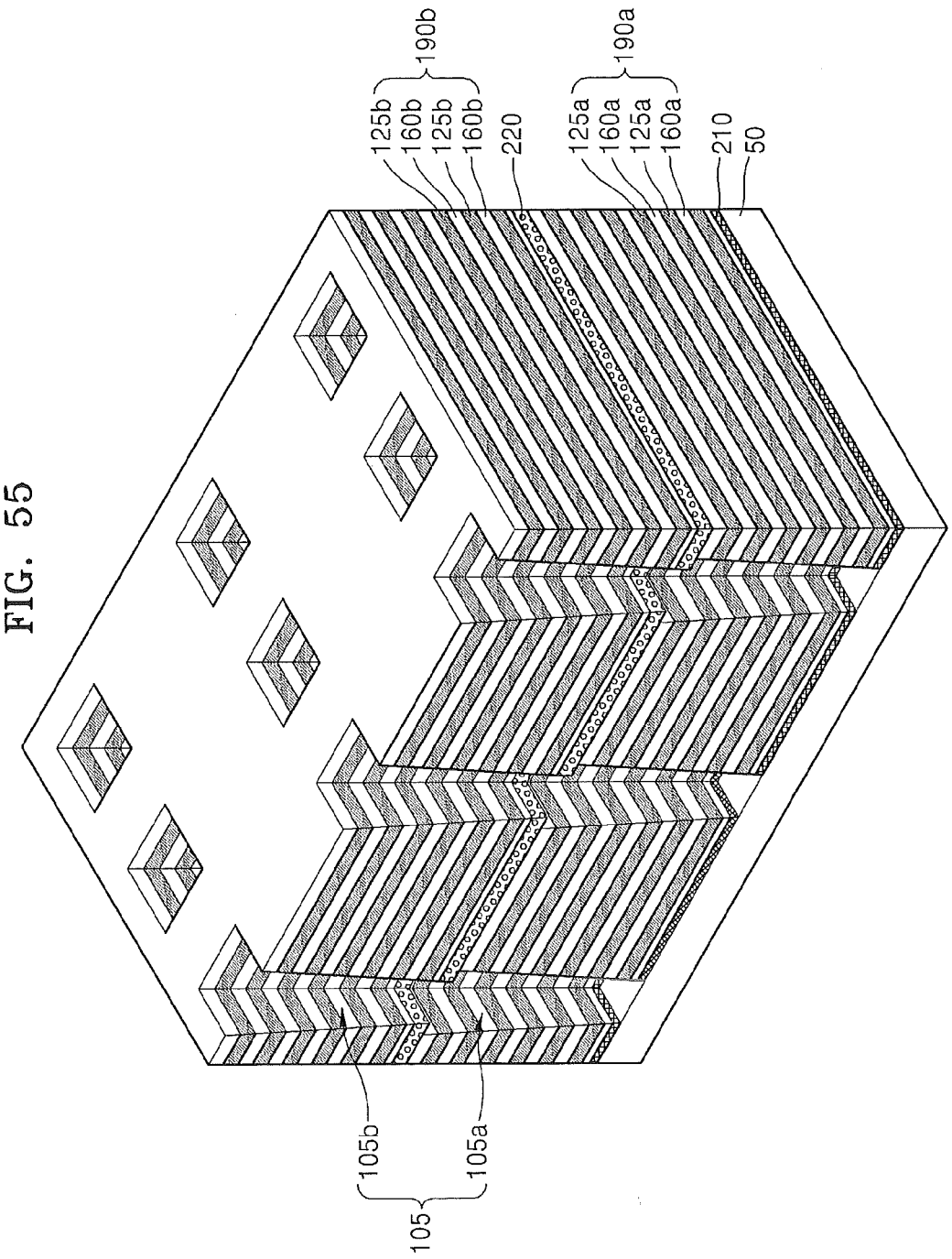
Figure 56:
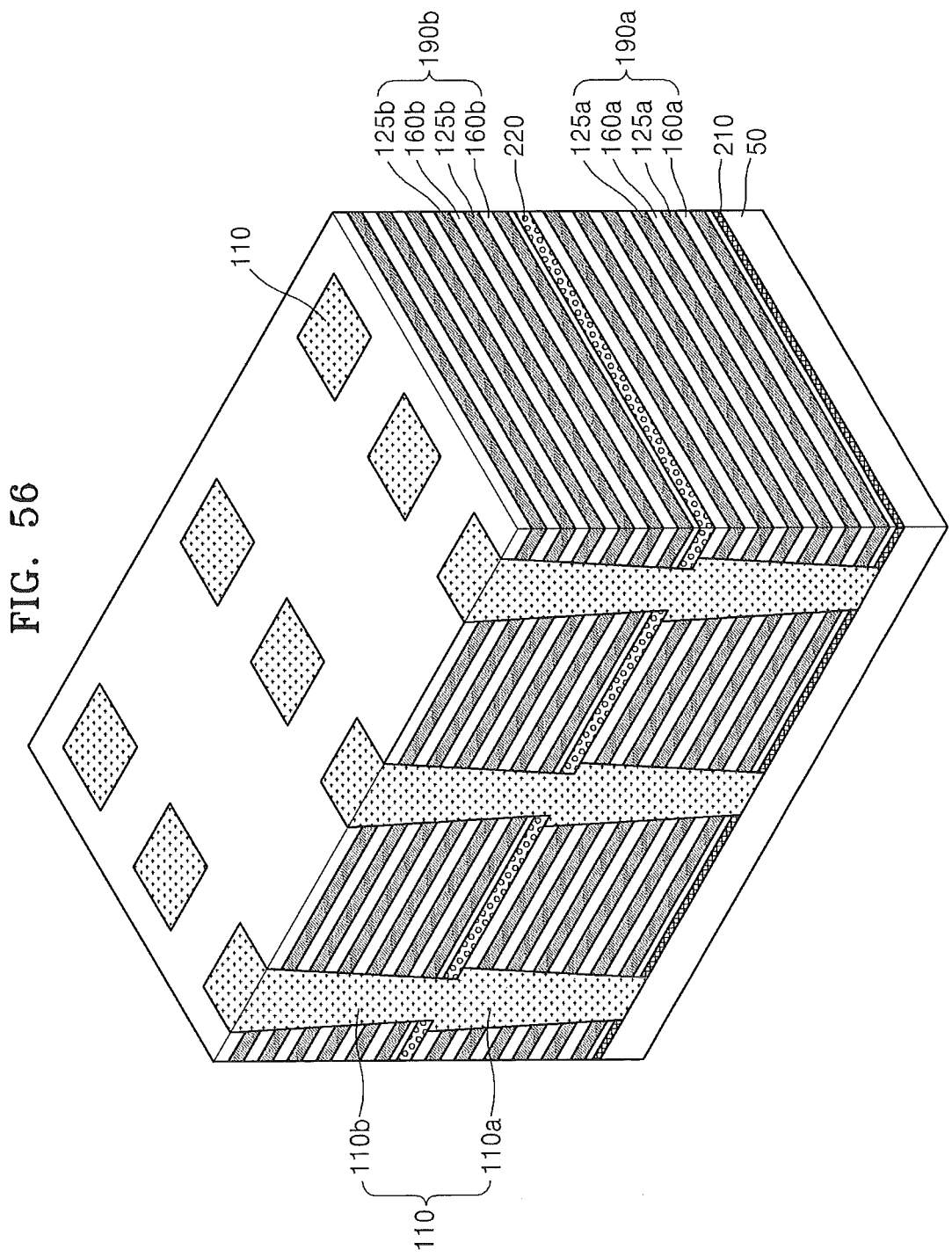

Referring to FIGS. 55 and 56, the top surface of the substrate 50 is exposed by removing the stopping layer 210, and the channel layer 110 filling the lower channel hole 105a and the upper channel hole 105b is formed. As described above, the lower channel layer 110a and the upper channel layer 110b respectively filling the lower channel hole 105a and the upper channel hole 105b may be simultaneously formed, and thus the lower channel layer 110a and the upper channel layer 110b may be formed as a continuously connected single body.

Figure 57:
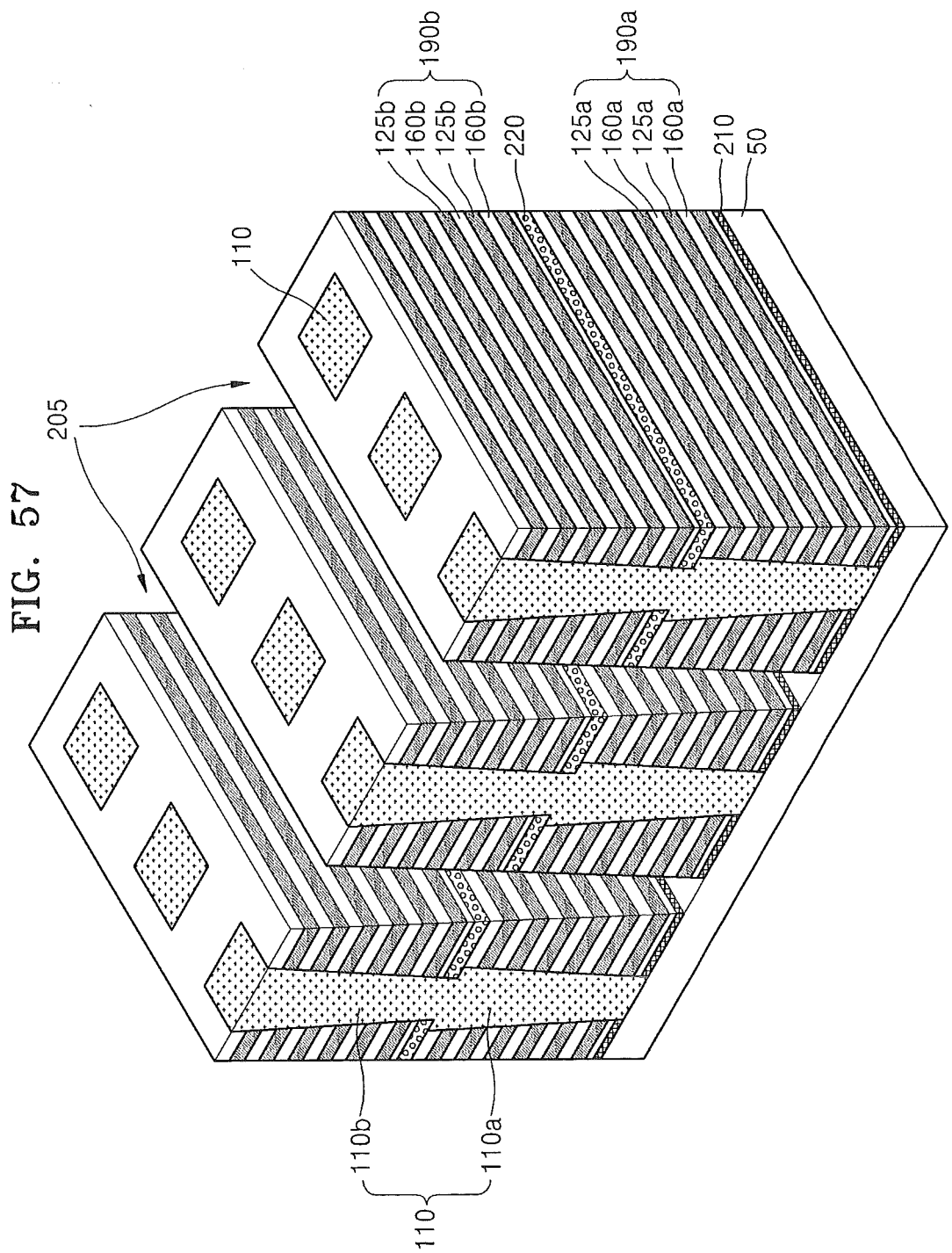

Referring to FIG. 57, in order to perform the pull back process for etching the lower sacrificial insulating layer 125a and the upper sacrificial insulating layer 125b, the wordline recess 205 is formed by etching the upper mold stack 190b, the mask layer 220, and the lower mold stack 190a. Selectively, the stopping layer 210 may be further etched.

Figure 58:
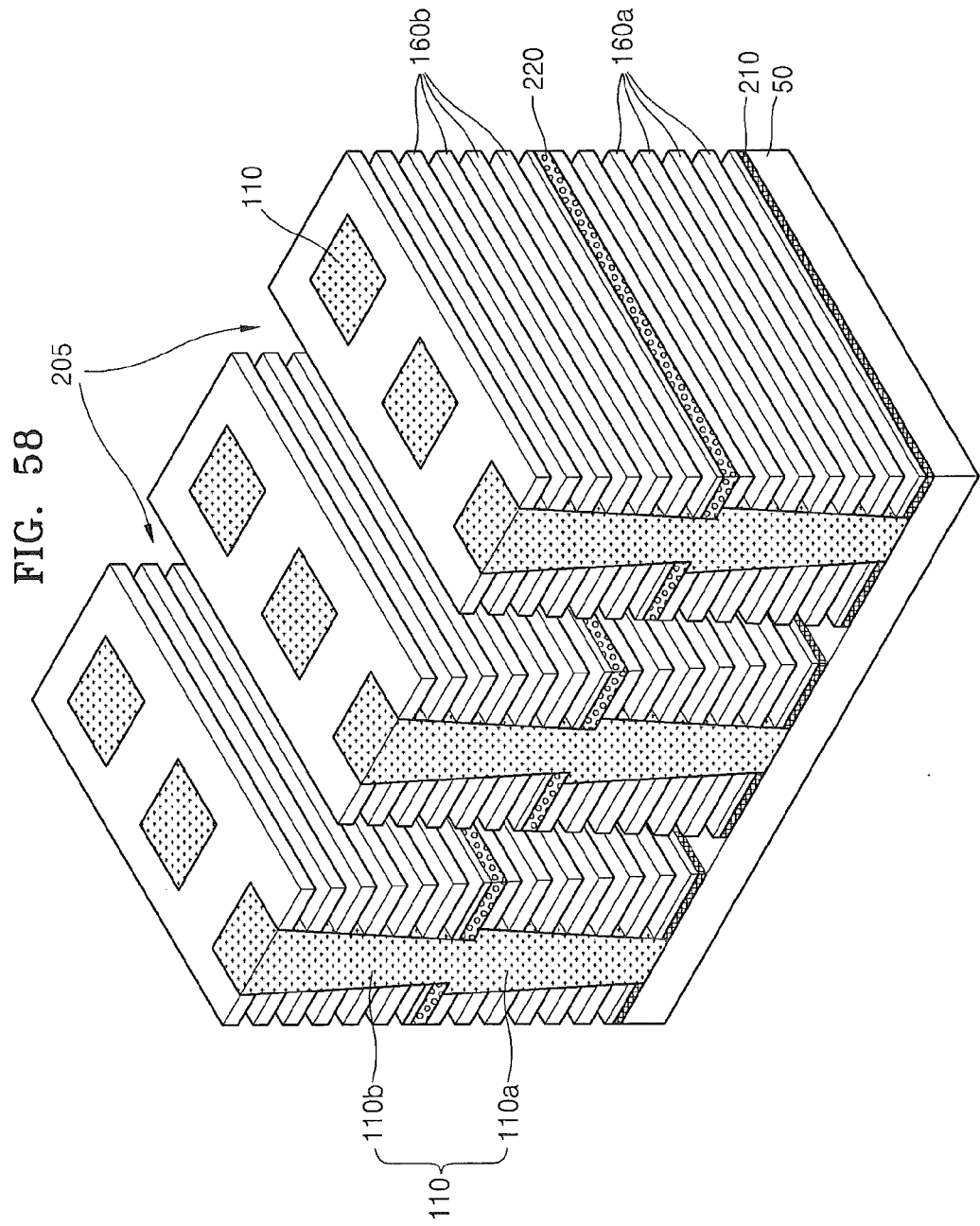
Figure 59:
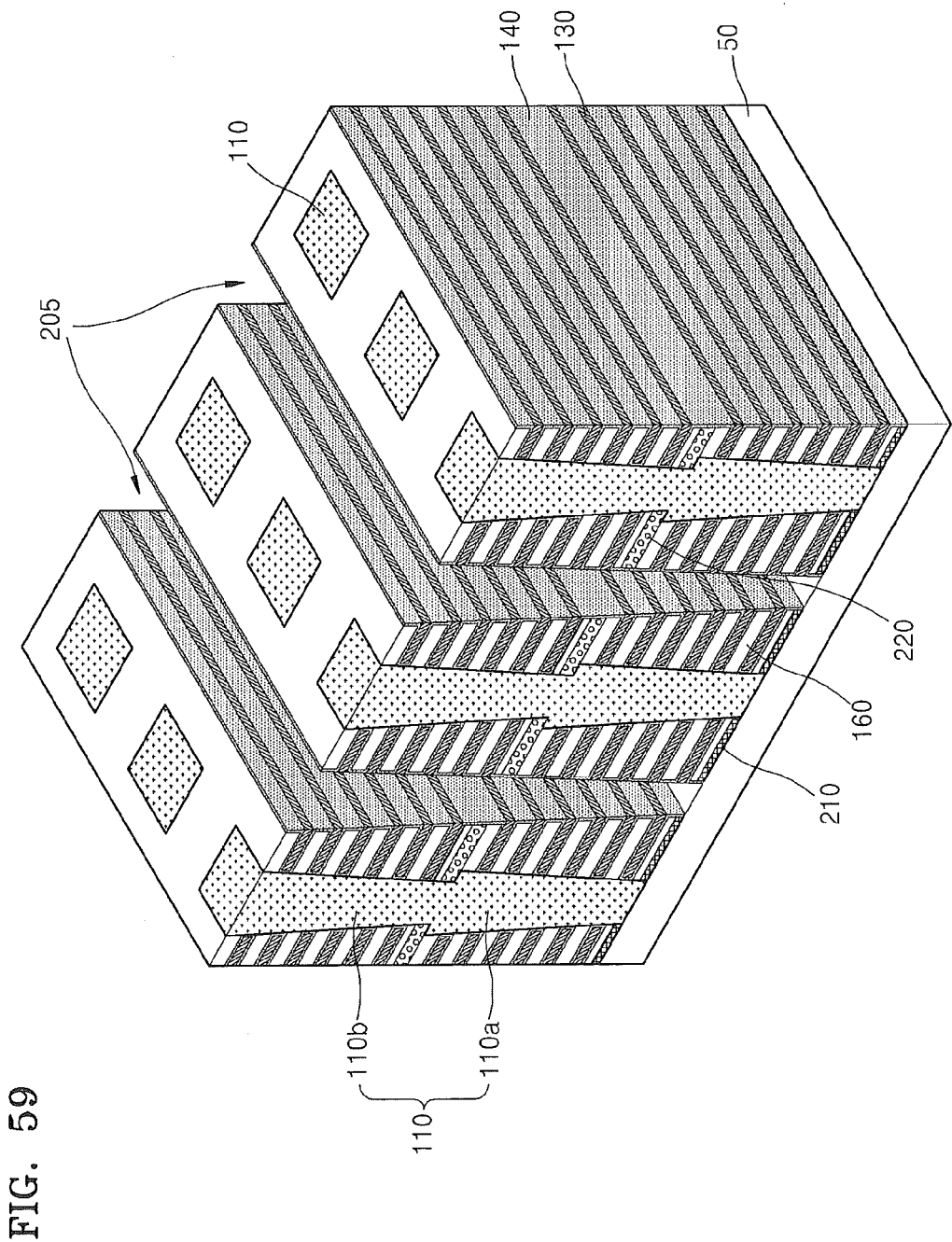

Referring to FIGS. 58 and 59, the side wall of the channel layer 110 is exposed by etching the lower sacrificial insulating layer 125a and the upper sacrificial insulating layer 125b, and the gate insulating layer 140 and the gate conductive layer 130 are formed on the exposed side wall of the channel layer 110.

Figure 60:
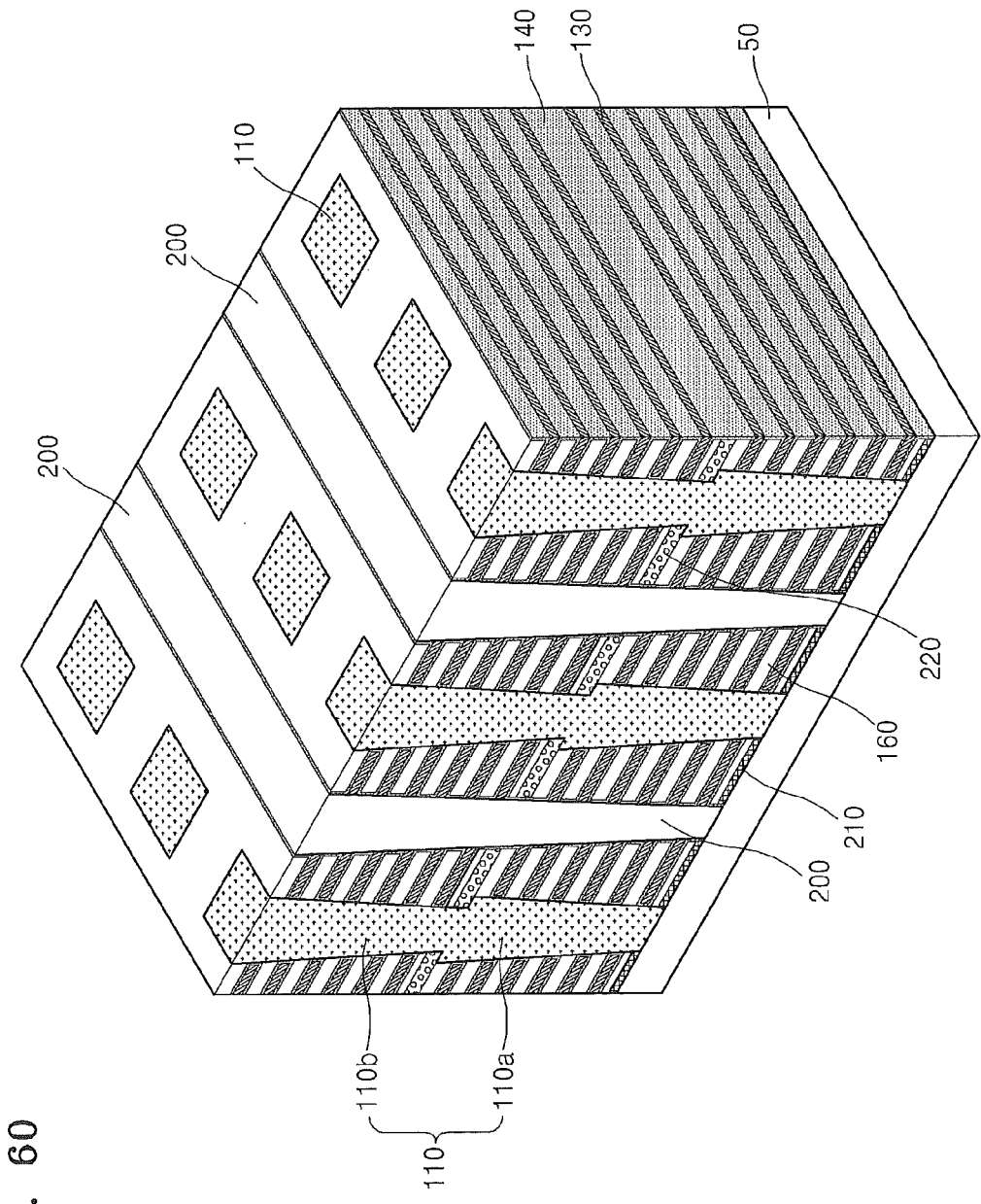
Figure 61:
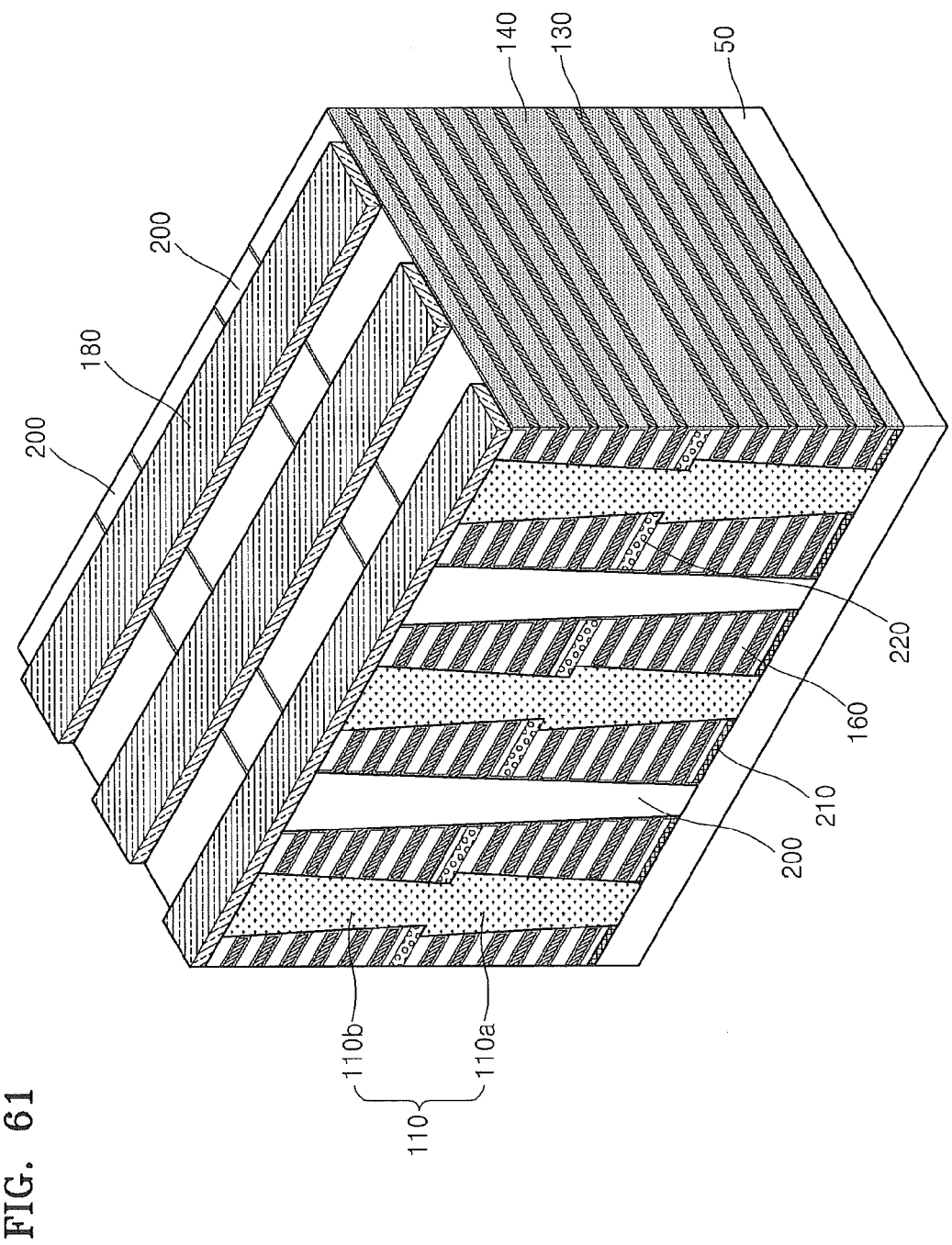

Referring to FIGS. 60 and 61, the separating insulating layer 200 filling the wordline recess 205 is formed, and the bitline conductive layer 180 is formed on the first insulating layer 160, the channel layer 110, and the separating insulating layer 200. As described above, the bitline conductive layer 180 may extend in a direction perpendicular to the extending direction of the separating insulating layer 200.

FIGS. 62 through 73 are perspective views for describing a method of manufacturing a nonvolatile memory device, according to another exemplary embodiment of the inventive concept. The method may be obtained by partially modifying the method of FIGS. 48 through 61. Overlapping descriptions thereof will not be repeated.

Figure 62:
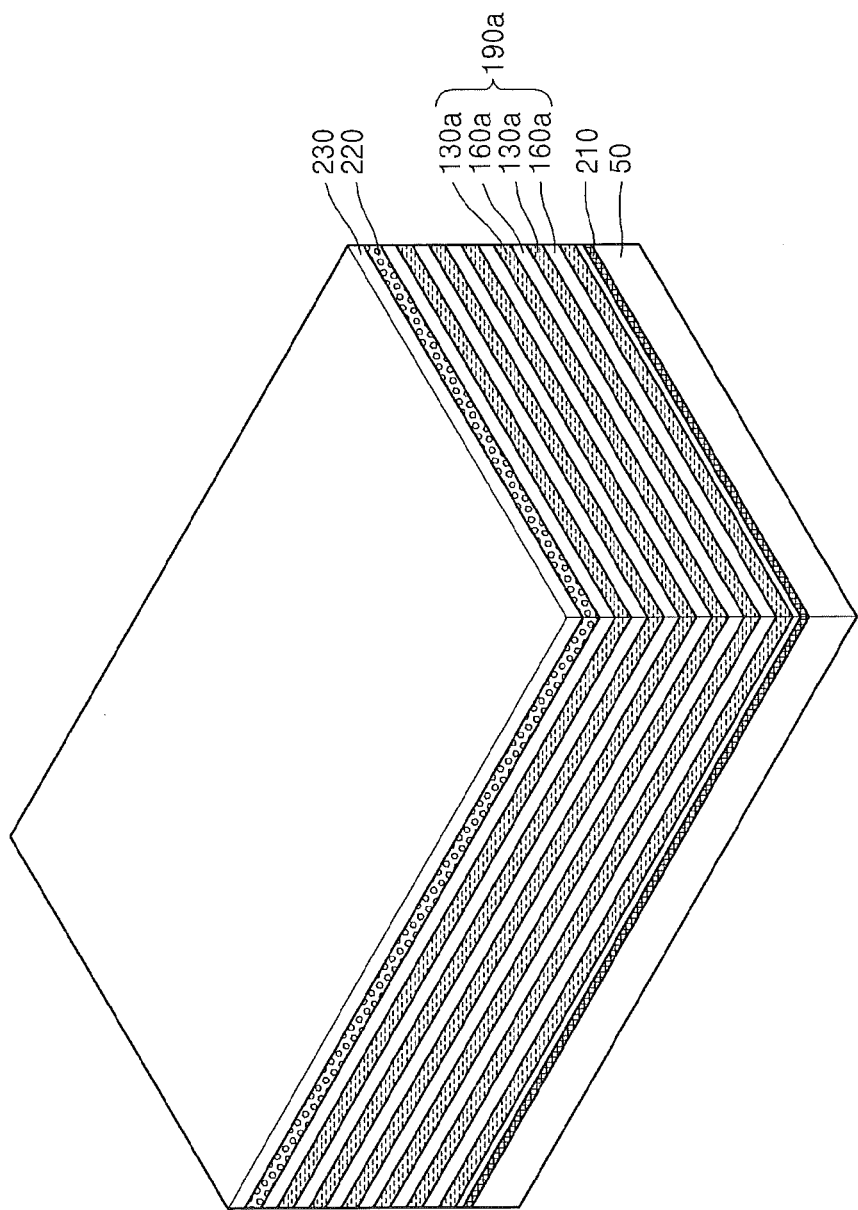
FIGS. 62 through 73 are perspective views for describing a method of manufacturing a nonvolatile memory device, according to another exemplary embodiment of the inventive concept.

Referring to FIG. 62, the stopping layer 210, the lower mold stack 190a, the mask layer 220, and the lid layer 230 are sequentially formed on the substrate 50. The lower mold stack 190a may include a lower gate conductive layer 130a and the lower insulating layer 160a. The lower gate conductive layer 130a may be an epitaxial layer having a single or multi crystal structure. Also, the lower gate conductive layer 130a may include silicon (Si) or silicon germanium (SiGe). The mask layer 220 may include Si or SiGe having a single or multi crystal structure. Moreover, the mask layer 220 may be formed of the same material as the lower gate conductive layer 130a.

Figure 63:
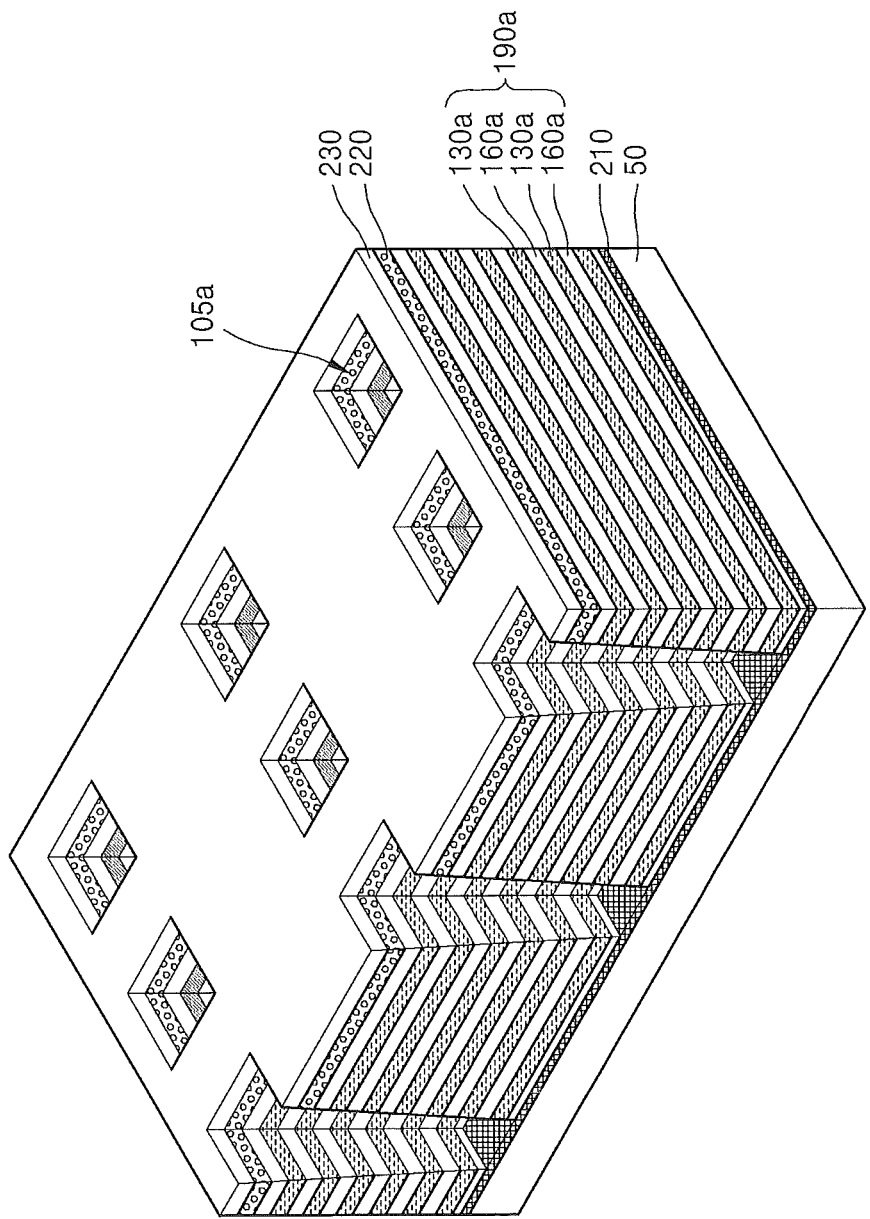

Referring to FIG. 63, the lower channel holes 105a penetrating through the lid layer 230, the mask layer 220, and the lower mold stack 190a is formed. As described above, the lower channel holes 105a may be 2-dimensionally arranged to expose the stopping layer 210.

Figure 64:
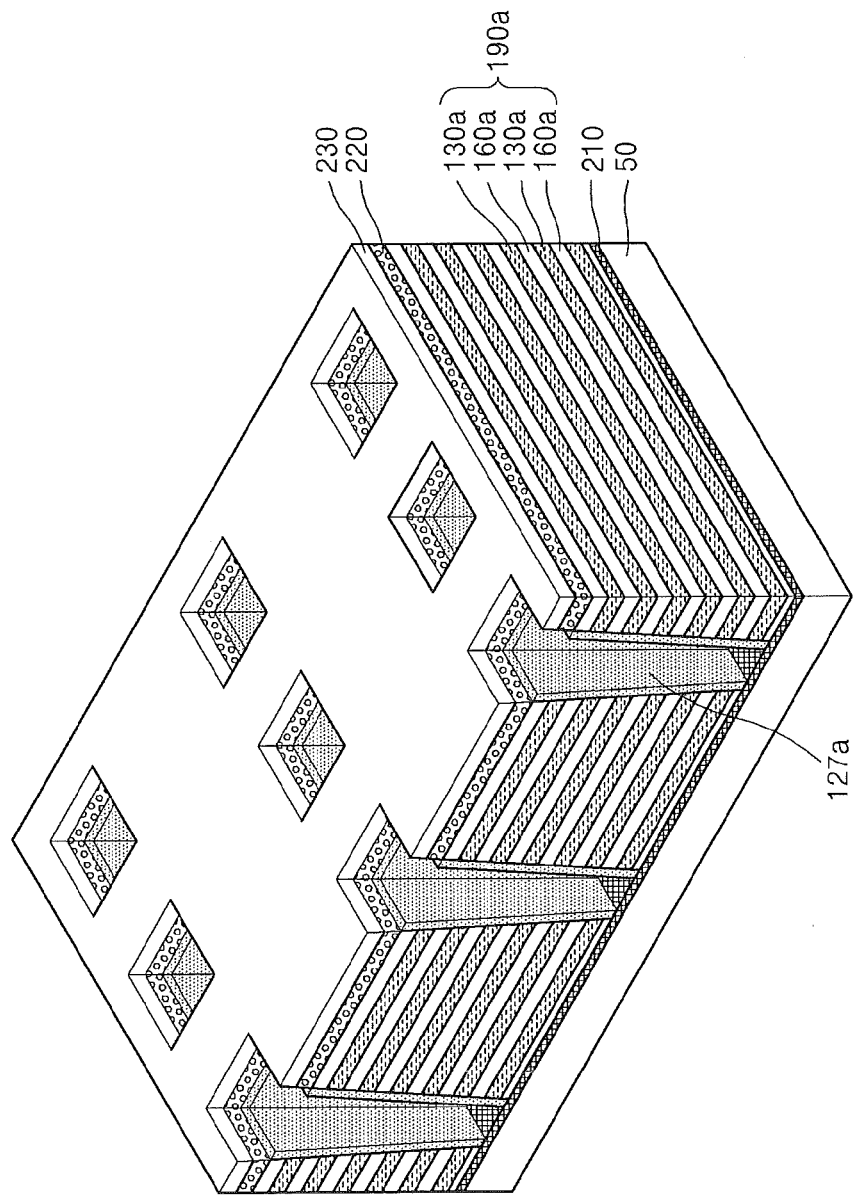

Referring to FIG. 64, the lower sacrificial spacer 127a surrounding the side wall of the lower channel hole 105a is formed. The lower sacrificial spacer 127a may directly contact the lower gate conductive layer 130a. In detail, the lower sacrificial spacer 127a prevents the lower gate conductive layer 130a from growing while the selective growth process is performed on the mask layer 220.

In order to form the lower sacrificial spacer 127a, a material having an etch selectivity with the lower insulating layer 160a and the lower gate conductive layer 130a is deposited, and an etch back process may be performed on the material. Here, the lower sacrificial spacer 127a may be formed only on the side wall of the lower gate conductive layer 130a and the side wall of the lower insulating layer 160a, and thus the side wall of the mask layer 220 may be exposed.

Figure 65:
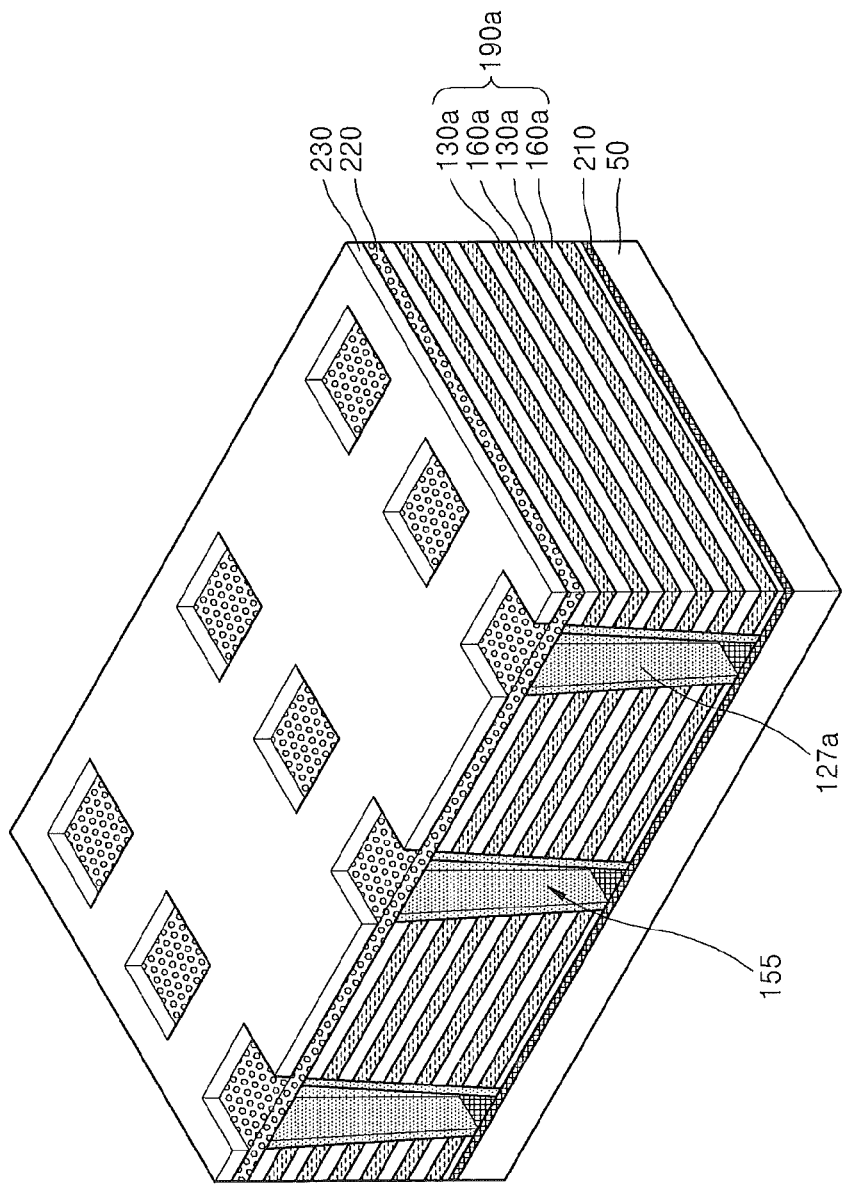

Referring to FIG. 65, in order to close the lower channel hole 105a, a selective growth process is performed on the mask layer 220. As described above, the lower channel hole 105a is closed via the selective growth process of the mask layer 220, and thus the air gap 155 may be formed between the mask layer 220 and the substrate 50.

Figure 66:
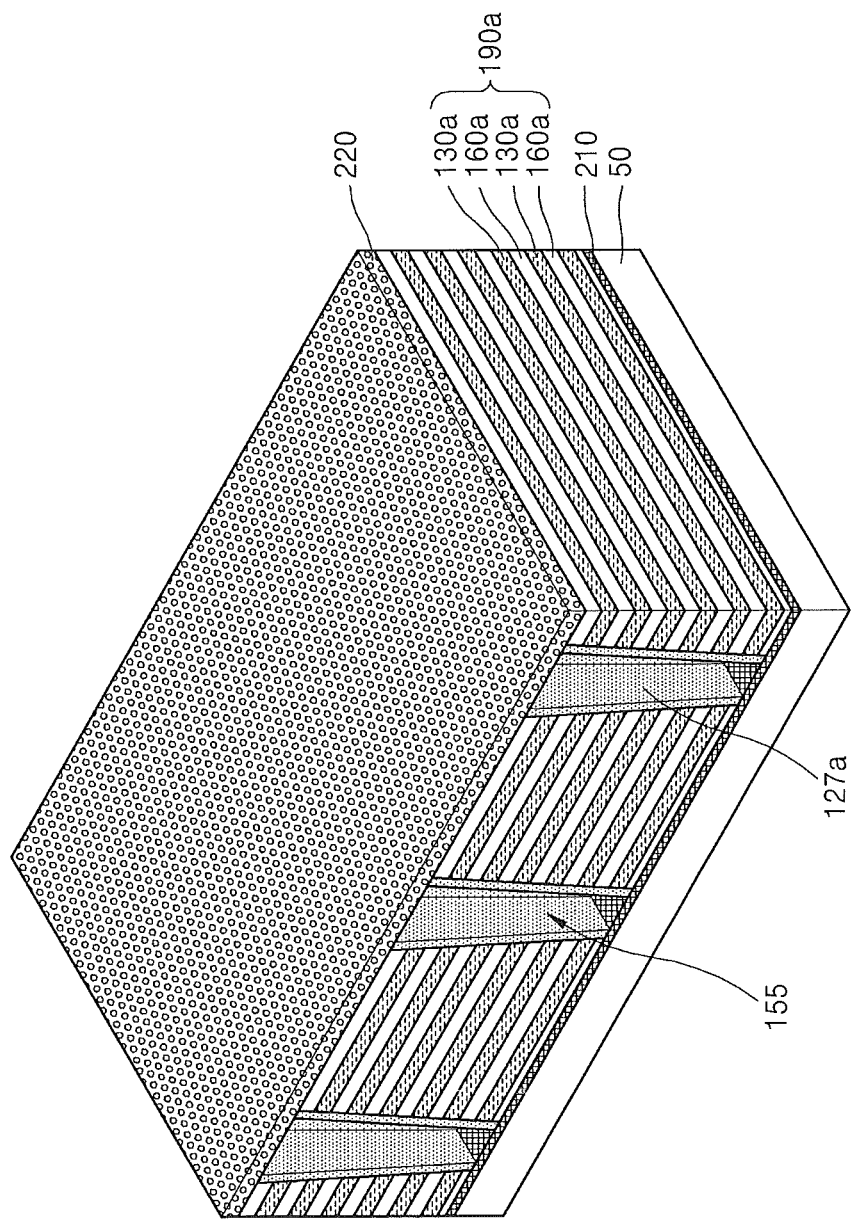

Referring to FIG. 66, the mask layer 220 is exposed by removing the lid layer 230. As described above, an oxidation process may be selectively performed on the exposed mask layer 220.

Figure 67:
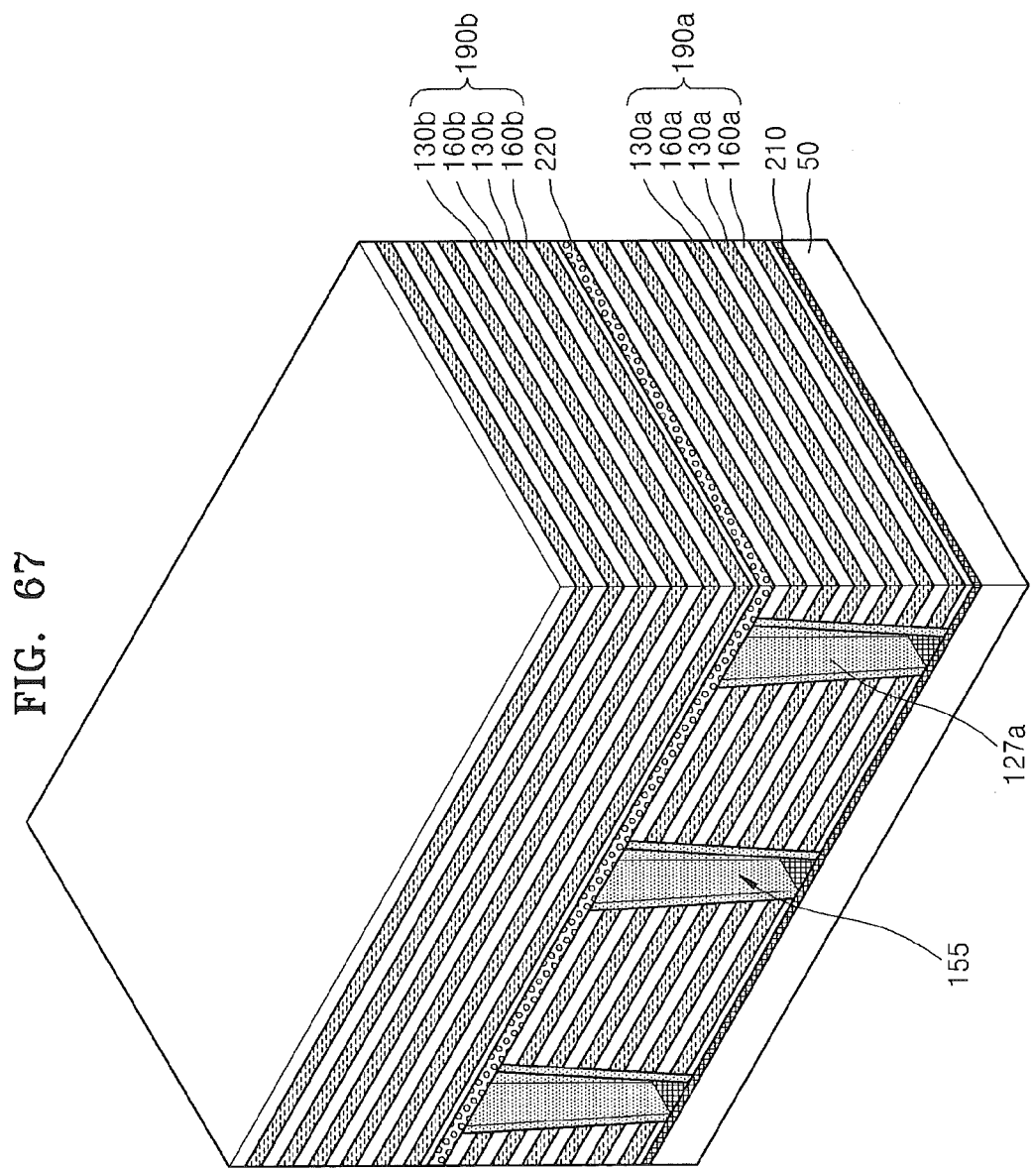
Figure 68:
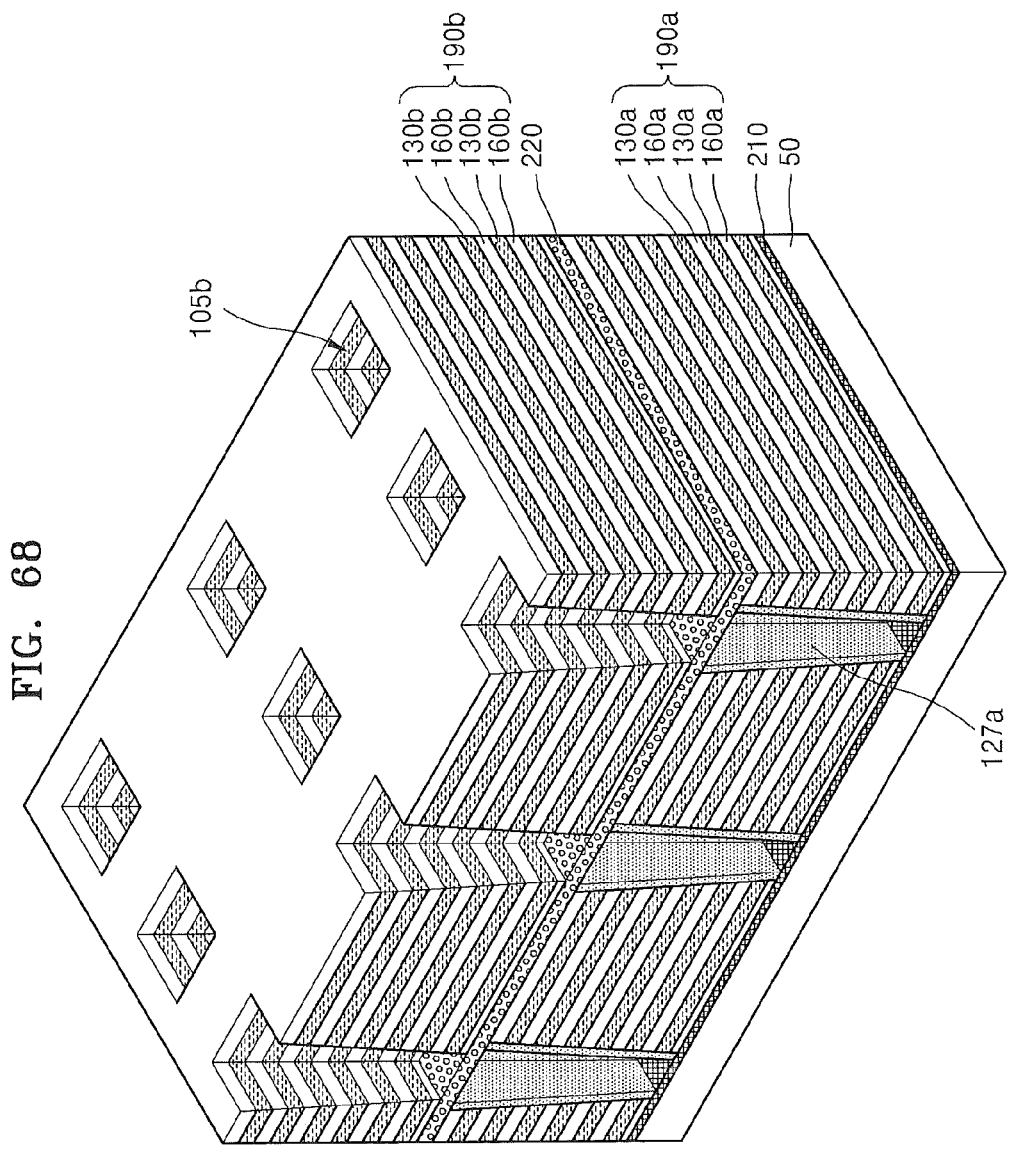

Referring to FIG. 67, an upper mold stack 190*b* including an upper gate conductive layer 130*b* and the upper insulating layer 160*b* is formed on the mask layer 220. Then, referring to FIG. 68, the upper channel holes 105*b* penetrating through the upper mold stack 190*b* are formed. The upper channel holes 105*b* may be 2-dimensionally arranged to expose the mask layer 220. The upper channel holes 105*b* may be disposed to overlap with the lower channel holes 105*a*.

Figure 69:
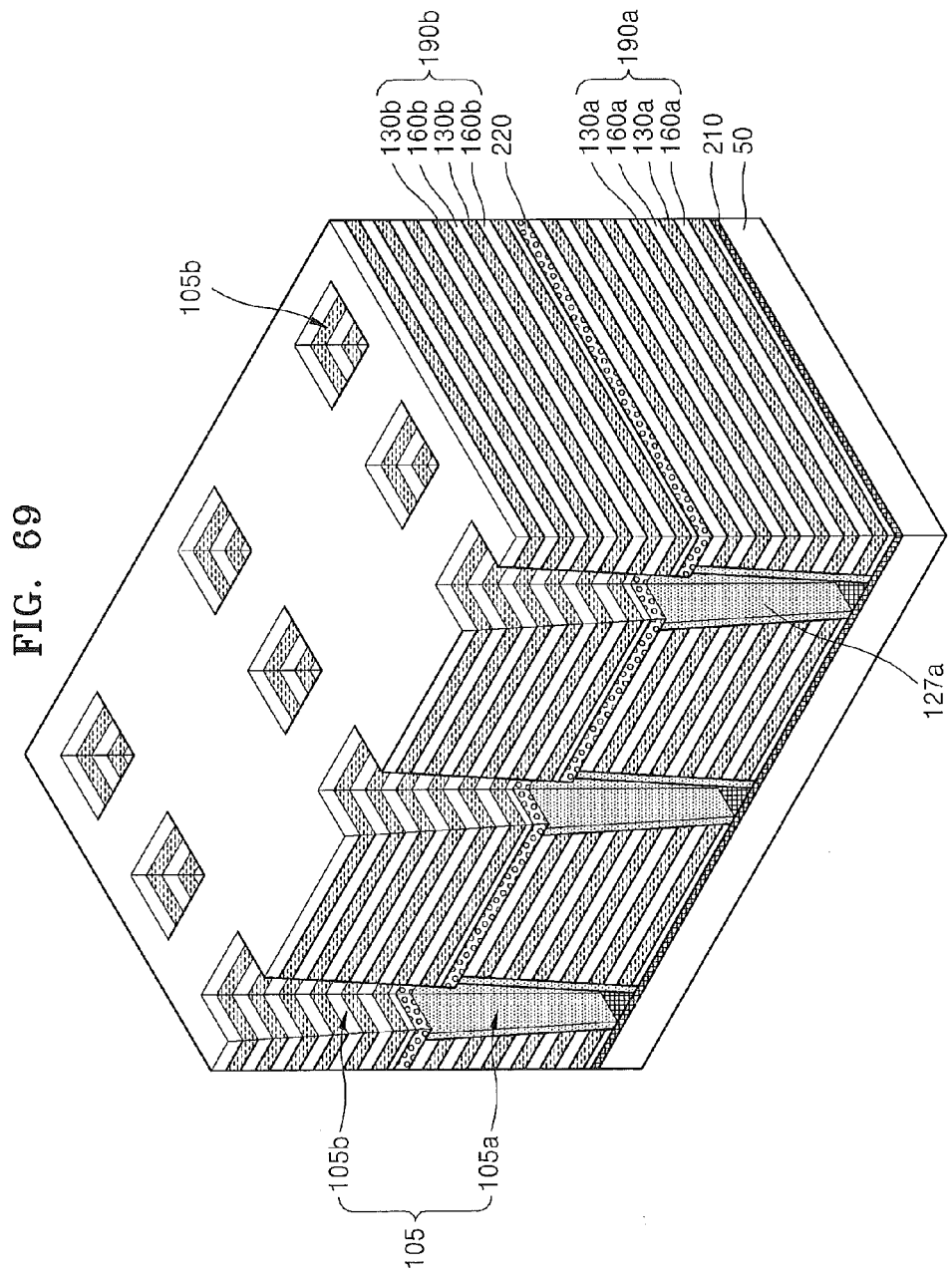

Referring to FIG. 69, the top surface of the stopping layer 210 is exposed by removing the mask layer 220. In other words, the lower channel hole 105*a* is opened again. Even when the mask layer 220 is removed, the stopping layer 210 and the lower sacrificial spacer 127*a* remain since the stopping layer 210 and the lower sacrificial spacer 127*a* have an etch selectivity with the mask layer 220.

Figure 70:
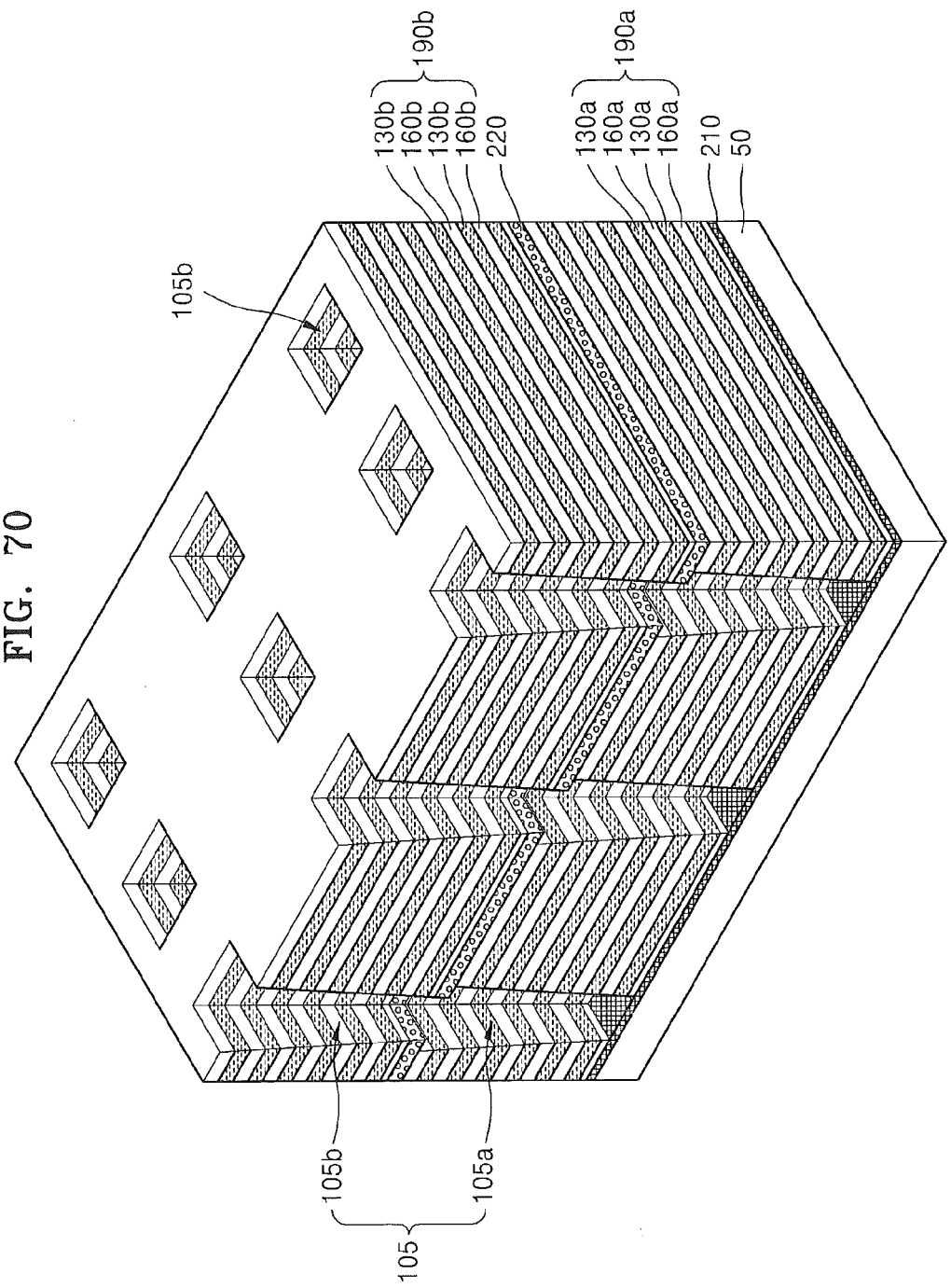
Figure 71:
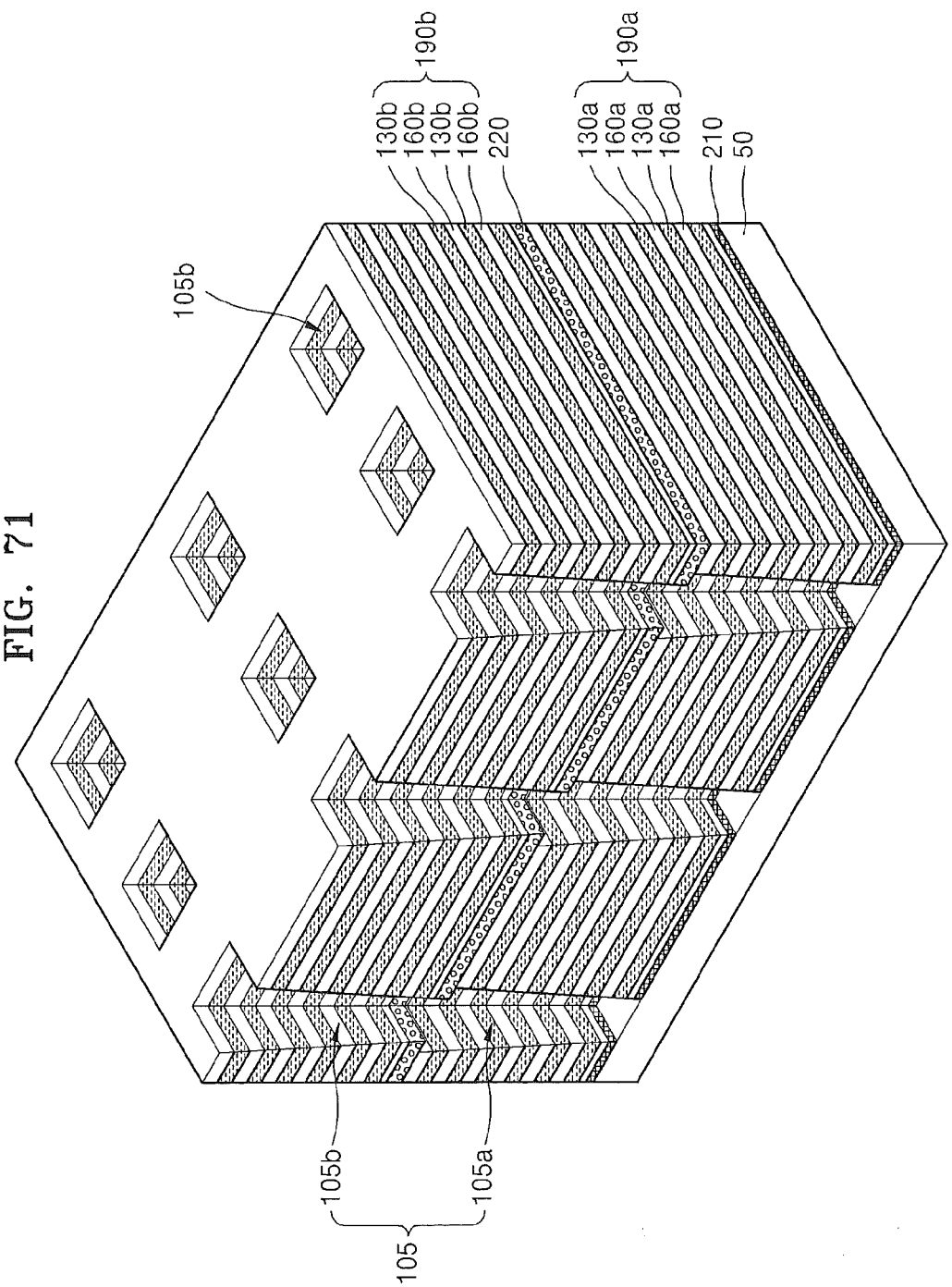

Referring to FIGS. 70 and 71, the lower sacrificial spacer 127*a* is removed to expose the side wall of the lower gate conductive layer 130*a* and the side wall of the lower insulating layer 160*a*, and then the stopping layer 210 is removed to expose the top surface of the substrate 50.

Figure 72:
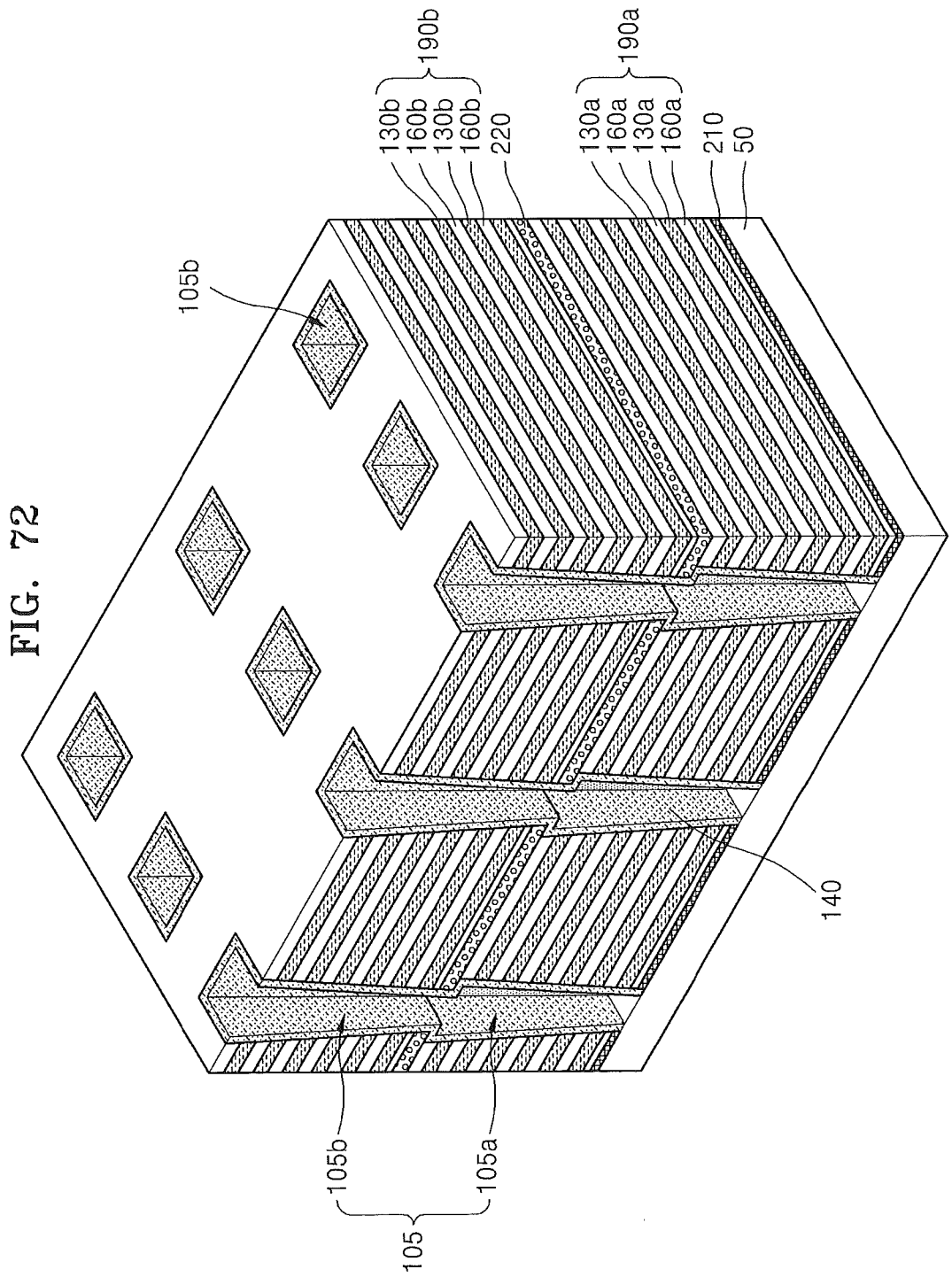

Referring to FIG. 72, the gate insulating layer 140 is deposited along the side wall of the channel hole 105. As described above, the gate insulating layer 140 may include the tunneling insulating layer 142, the charge storage layer 144, and the blocking insulating layer 146 of FIG. 2, which are sequentially stacked.

Figure 73:
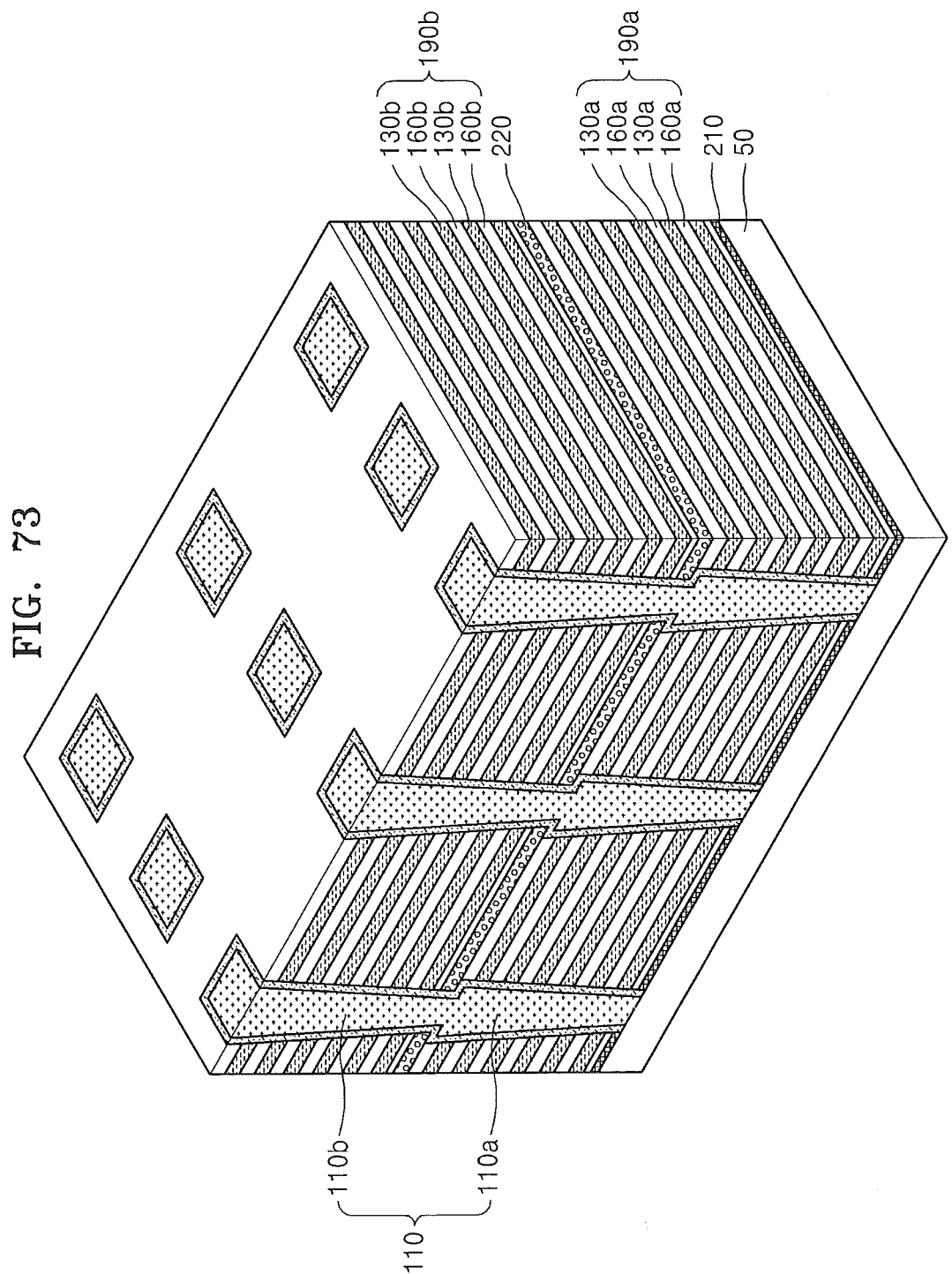

Referring to FIG. 73, the channel layer 110 filling the lower channel hole 105*a* and the upper channel hole 105*b* is formed. As described above, the lower channel layer 110*a* and the upper channel layer 110*b* respectively filling the lower channel hole 105*a* and the upper channel hole 105*b* may be simultaneously formed, and thus the lower channel layer 110*a* and the upper channel layer 110*b* may be formed as a continuously connected single body.

The mask layer 220 may be formed of a conductive material such as polysilicon. If the oxidation process described with reference to FIG. 65 is not performed on the mask layer 220, the mask layer 220 may operate as a gate conductive layer. Accordingly, the mask layer 220 may close the lower channel hole 105*a*, for forming the upper mold stack 190*b*, and at the same time, may operate as a memory cell after the gate insulating layer 140 and the channel layer 110 are formed.

Figure 74:
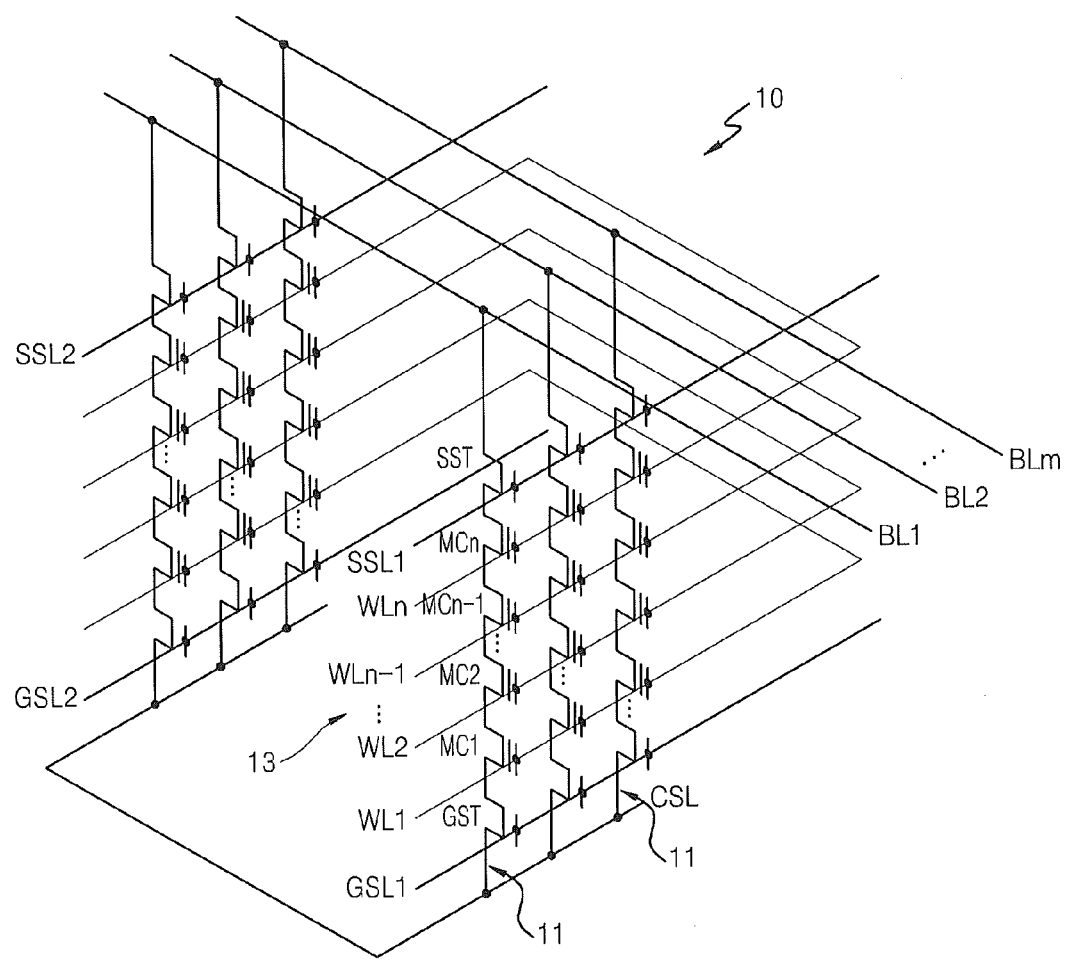
FIG. 74 is an equivalent circuit diagram of a memory cell array of a nonvolatile memory device, according to an exemplary embodiment of the inventive concept.

FIG. 74 is an equivalent circuit diagram of a memory cell array 10 of a nonvolatile memory device, according to an exemplary embodiment of the inventive concept.

Referring to FIG. 74, the memory cell array 10 may include a plurality of memory cell strings 11. Each of the plurality of memory cell strings 11 may have a perpendicular structure extending perpendicular to an extending direction of a main surface of a substrate (not shown). The memory cell strings 11 may form a memory cell block 13.

The memory cell string 11 may include a plurality of memory cells MC1 through MCn, a string selection transistor SST, and a ground selection transistor GST. The ground selection transistor GST, the memory cells MC1 through MCn, and the string selection transistor SST may be perpendicularly disposed to the extending direction of the main surface of the substrate in series. Here, the memory cells MC1 through MCn may store data. A plurality of wordlines WL1 through WLn may be respectively connected to the memory cells MC1 through MCn to control the memory cells MC1 through MCn. The number of the memory cells MC1 through MCn may be suitably determined according to capacity of the nonvolatile memory device.

A plurality of bitlines BL1 through BLm may be respectively connected to sides of the memory cell strings 11 on first through m columns of the memory cell block 13, for example, to drains of the string selection transistors SST. Also, common source lines CSL may be respectively connected to other sides of the memory cell strings 11, for example, to sources of the ground selection transistors GST.

The wordlines WL1 through WLn may be commonly connected to each gate of memory cells arranged on the same layer from among the memory cells MC1 through MCn of each of the memory cell strings 11. Data may be written to, read from, or erased from the memory cells MC1 through MCn according to operations of the wordlines WL1 through WLn.

In the memory cell string 11, the string selection transistor SST may be disposed between the bitlines BL1 through BLm and the memory cells MC1 through MCn. In the memory cell block 13, each string selection transistor SST may control data transmission between the bitlines BL1 through BLm and the memory cells MC1 through MCn via a string selection line SSL connected to a gate of the string selection transistor SST.

The ground selection transistor GST may be disposed between the memory cells MC1 through MCn and the common source line CSL. In the memory cell block 13, each ground selection transistor GST may control data transmission between the memory cells MC1 through MCn and the common source line CSL via a ground selection line GSL connected to a gate of the ground selection transistor GST.

Figure 75:
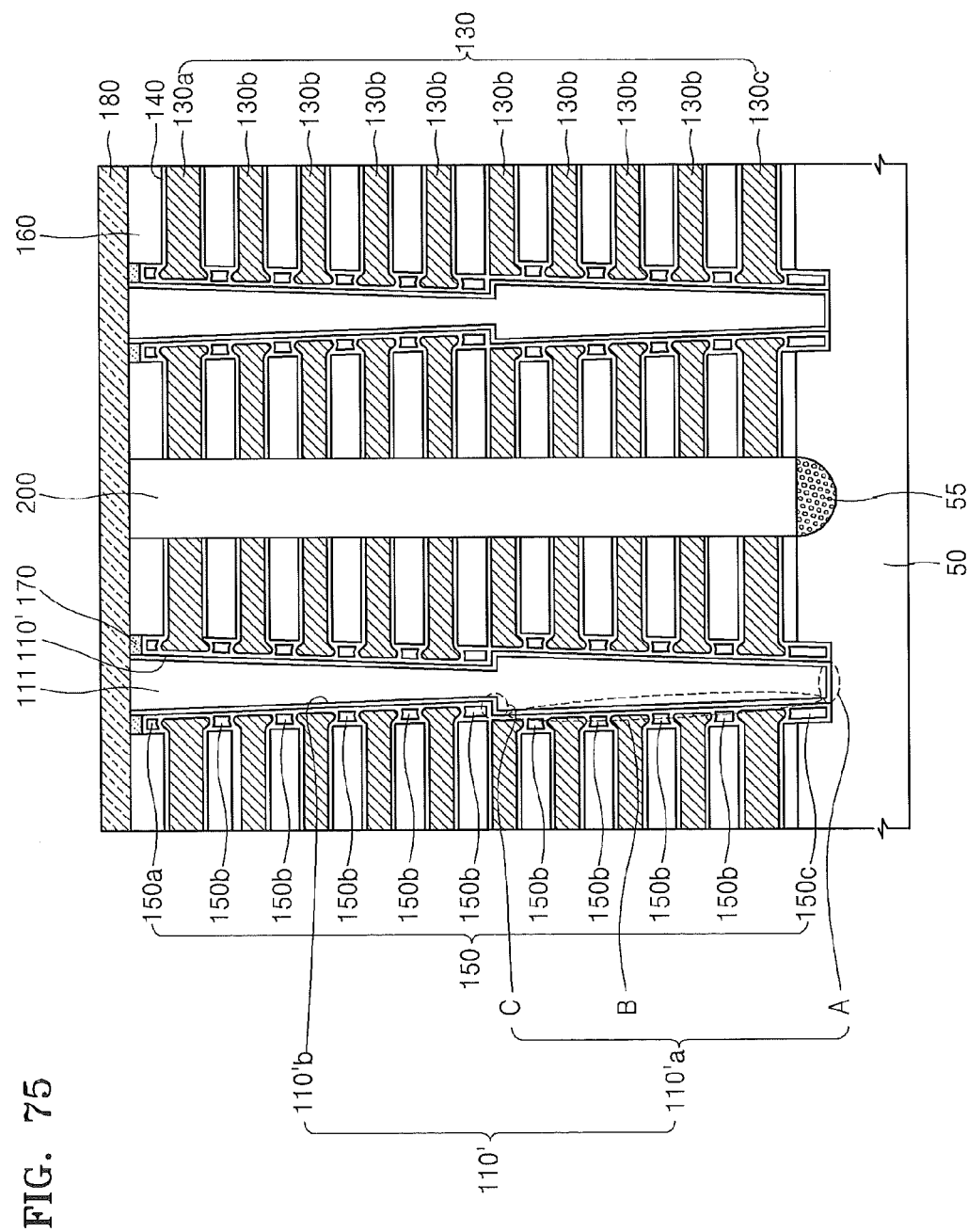
FIG. 75 is a cross-sectional view of a nonvolatile memory device according to an exemplary embodiment of the inventive concept.

FIG. 75 is a cross-sectional view of a nonvolatile memory device according to an exemplary embodiment of the inventive concept. In FIGS. 2 and 75, like reference numerals denote like elements, and thus descriptions about overlapping elements are not repeated.

Referring to FIG. 75, as described with reference to FIG. 1, a channel layer 110' may have a macaroni shape. Here, the nonvolatile memory device may further include a pillar insulating layer 111 filling inside the channel layer 110'. The channel layer 110' includes a lower channel layer 110'*a* and an upper channel layer 110'*b*, and specifically, the lower channel layer 110'*a* may include a bottom portion A, a side wall portion B, and a ring type lid portion C. As described above, the lower channel layer 110'*a* and the upper channel layer 110'*b* may be a continuously connected single body.

When the method of FIGS. 5 through 14B are used to manufacture the nonvolatile memory device, a topmost gate conductive layer 130*a* and a bottommost gate conductive layer 130*c* may be thicker than other gate conductive layers 130*b*. The topmost gate conductive layer 130*a* performs functions of the string selection transistor SST of FIG. 74. Also, the bottommost gate conductive layer 130*c* performs functions of the ground selection transistor GST of FIG. 74.

One end of the gate conductive layer 130 may have a dogbone shape. In detail, the gate conductive layer 130 extending in a direction parallel to the substrate 50 may have an end portion partially extending in a direction perpendicular to the substrate 50, and thus the end portion of the gate conductive layer 130 may have a dogbone or triangular flask shape.

As described above, the air gap 150 may be formed between the gate conductive layers 130, and thus coupling between gates may be improved. The air gap 150 also has a profile according to a shape of the end portion of the gate conductive layer 130. In other words, when the end portion of the gate conductive layer 130 has a dogbone shape, the air gap 150 may have a rounded profile corresponding to the dogbone shape.

In a direction parallel to the substrate 50, a value of the thickness of the air gap 150 may be a difference between a value of the thickness of the sacrificial spacer 127 of FIG. 6 and a value obtained by doubling the thickness of the gate insulating layer 140. Accordingly, as described with reference to FIGS. 11A and 11B, formation of the air gap 150 may be determined based on whether the thickness of the sacrificial spacer 127 is above or below about double the thickness of the gate insulating layer 140.

Meanwhile, in a direction perpendicular to the substrate 50, a size of the air gap 150 may be proportional to the thickness of the first insulating layer 160 and may decrease as the thickness of the gate insulating layer 140 increases. Specifically, in the direction perpendicular to the substrate 50, a size of a topmost air gap 150a of the air gaps 150 may decrease as the thickness of the second insulating layer 170 increases.

Also, in the direction perpendicular to the substrate 50, a size of a bottommost air gap 150c may be proportional to an over-etching degree according to an anisotropy etching process for forming the channel hole 105 of FIG. 5. In other words, the size of the bottommost air gap 150c may be increased as an overlapping degree of the substrate 50 and the channel layer 110 increases.

Figure 76:
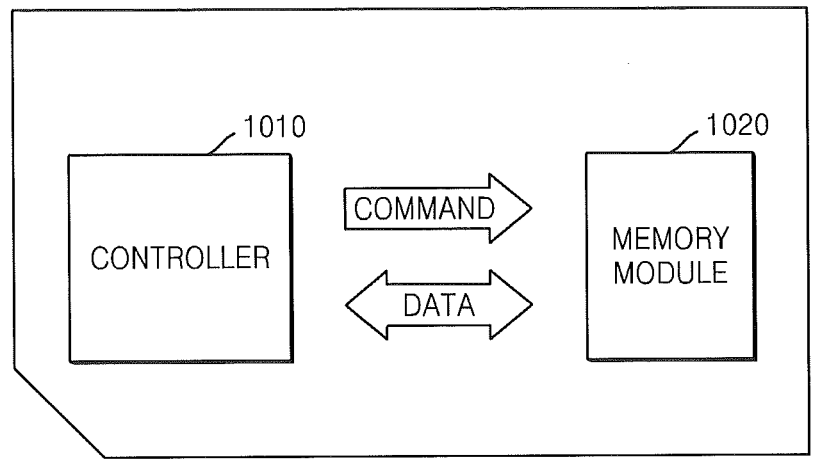
FIG. 76 is a schematic diagram of a memory card including a nonvolatile memory device, according to an exemplary embodiment of the inventive concept.

FIG. 76 is a schematic diagram of a memory card 1000 including a nonvolatile memory device, according to an exemplary embodiment of the inventive concept.

Referring to FIG. 76, a controller 1010 and a memory module 1020 may be disposed to exchange an electric signal. For example, when the controller 1010 transmits a command, the memory module 1020 may transmit data. The memory module 1020 may include the nonvolatile memory device having a perpendicular structure according to any one of the above exemplary embodiments. Each of the nonvolatile memory devices according to the above exemplary embodiments may be arranged in a "NAND" and "NOR" architecture memory array (not shown) according to a corresponding logic gate design, as well known to one of ordinary skill in the art. A memory array arranged in a plurality of columns and rows may include at least one memory array bank (not shown). The memory module 1020 may include such a memory array or memory array bank. In order to drive the memory array bank, the memory card 1000 may further include a well known column decoder (not shown), row decoder (not shown), input/output buffers (not shown), and/or a control register (not shown). The memory card 1000 may be used for any one of various cards, such as a memory stick card, a smart media (SM) card, a secure digital (SD) card, a mini SD card, and a multi media card (MMC).

Figure 77:
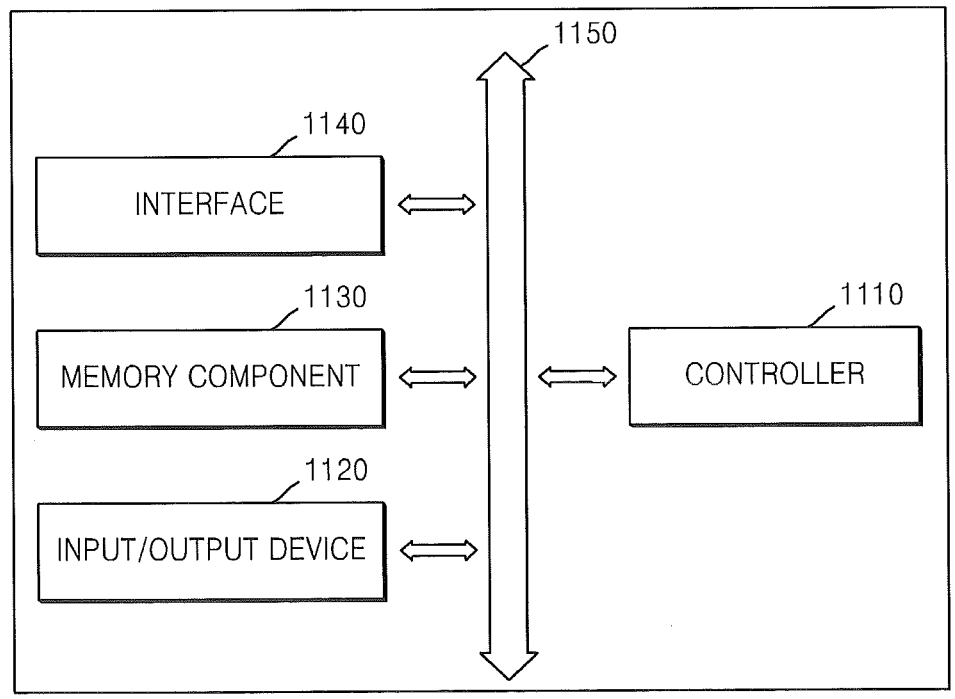
FIG. 77 is a schematic diagram of a system including a nonvolatile memory device, according to an exemplary embodiment of the inventive concept.

FIG. 77 is a schematic diagram of a system 1100 including a nonvolatile memory device, according to an exemplary embodiment of the inventive concept.

Referring to FIG. 77, the system 1100 includes a controller 1110, an input/output device 1120, a memory component 1130, and an interface 1140. The system 1100 may be a mobile system or a system for transmitting or receiving information. The mobile system may be a personal digital assistant (PDA), a portable computer, a web tablet, a wireless phone, a mobile phone, a digital music player, or a memory card. The controller 1110 may execute a program, and control the system 1100. In detail, the controller 1110 may be configured to control the input/output device 1120, the memory component 1130, and the interface 1140. The controller 1110 may be a microprocessor, a digital signal processor, a microcontroller or a device similar thereto. The input/output device 1120 may be used to input or output data of the system 1100. The system 1100 may be connected to an external device, such as a personal computer or a network, so as to exchange data with the external device by using the input/output device. The input/output device 1120 may be a keypad, a keyboard, or a display. The memory component 1130 may store code and/or data for operating the controller 1110 and/or data processed by the controller 1110. The memory component 1130 may include the nonvolatile memory device according to any one of the above exemplary embodiments. The interface 1140 may be a data transmission path between the system 1100 and the external device. The controller 1110, the input/output device 1120, the memory component 1130, and the interface 1140 may communicate with each other through a bus 1150. For example, the system 1100 may be used in a mobile phone, an MP3 player, navigation, a portable multimedia player (PMP), a solid state disk (SSD), or household appliances.

While the inventive concept has been particularly shown and described with reference to exemplary embodiments thereof, it will be understood that various changes in form and details may be made therein without departing from the spirit and scope of the following claims.

What is claimed is:

1. A method of manufacturing a nonvolatile memory device, the method comprising:
   forming a channel hole penetrating through a stacked structure of a plurality of sacrificial insulating layers and a plurality of first insulating layers, the stacked structure disposed on a substrate;
   forming a sacrificial spacer on a side wall of the channel hole;
   forming a semiconductor channel layer on a sidewall of the sacrificial spacer;
   partially etching the sacrificial spacer to expose a first portion of a sidewall of the semiconductor channel layer;
   forming a second insulating layer on the first portion of the sidewall of the semiconductor channel layer;
   after forming the second insulating layer, etching the plurality of sacrificial insulating layers in the stacked structure and the sacrificial spacer so that a second portion of the sidewall of the semiconductor channel layer is exposed; and
   forming a gate conductive layer on the exposed second portion of the sidewall of the semiconductor channel layer,
   wherein said forming the gate conductive layer is preceded by forming a gate insulating layer directly on the exposed second portion of the sidewall of the semiconductor channel layer, and
   wherein the gate insulating layer extends between the gate conductive layer and the plurality of first insulating layers.

2. A method of manufacturing a nonvolatile memory device, the method comprising:
   forming a channel hole penetrating through a stacked structure of a plurality of sacrificial insulating layers and a plurality of first insulating layers, the stacked structure disposed on a substrate;
   forming a sacrificial spacer on a side wall of the channel hole;
   forming a semiconductor channel layer on a sidewall of the sacrificial spacer;
   etching the plurality of sacrificial insulating layers in the stacked structure and the sacrificial spacer so that a sidewall of the semiconductor channel layer is exposed;

forming a gate insulating layer on the exposed sidewall of the semiconductor channel layer; and forming a gate conductive layer on the gate insulating layer, wherein an air gap is formed within the gate insulating layer and between the plurality of first insulating layers and the semiconductor channel layer.

3. A method of manufacturing a nonvolatile memory device, the method comprising:

alternately stacking a plurality of sacrificial insulating layers and a plurality of first insulating layers on a substrate;

forming a channel hole by selectively etching the plurality of sacrificial insulating layers and the plurality of first insulating layers;

forming a sacrificial spacer on a side wall of the channel hole;

forming a semiconductor channel layer contacting the sacrificial spacer;

forming a wordline recess by etching the plurality of sacrificial insulating layers and the plurality of first insulating layers;

etching the plurality of sacrificial insulating layers and the sacrificial spacer so that a sidewall of the semiconductor channel layer is exposed;

forming a gate insulating layer on the sidewall of the semiconductor channel layer;

forming a gate conductive layer on the gate insulating layer; and forming a separating insulating layer filling the wordline recess, wherein the semiconductor channel layer is disposed in a zigzag pattern, and wherein a supporting insulating layer is in an inverse zigzag pattern, in a space between the semiconductor channel layer and the separating insulating layer.

4. The method of claim 3, further comprising:

partially etching the sacrificial spacer to expose a first portion of the sidewall of the semiconductor channel layer; and forming a second insulating layer on the first portion of the sidewall of the semiconductor channel layer, wherein etching the plurality of sacrificial insulating layers and the sacrificial spacer comprises, after forming the second insulating layer, etching the plurality of sacrificial insulating layers and the sacrificial spacer so that a second portion of the sidewall of the semiconductor channel layer is exposed, and wherein forming the gate conductive layer comprises forming the gate conductive layer on the exposed second portion of the sidewall of the semiconductor channel layer.

5. The method of claim 4, wherein partially etching the sacrificial spacer further comprises partially etching the sacrificial spacer to expose a portion of a sidewall of an uppermost one of the plurality of first insulating layers relative to a surface of the substrate.

6. The method of claim 5, wherein forming the second insulating layer further comprises forming the second insulating layer on the portion of the sidewall of the uppermost one of the plurality of first insulating layers.

7. The method of claim 1, wherein partially etching the sacrificial spacer further comprises partially etching the sacrificial spacer to expose a portion of a sidewall of an uppermost one of the plurality of first insulating layers relative to a surface of the substrate.

8. The method of claim 7, wherein forming the second insulating layer further comprises forming the second insulating layer on the portion of the sidewall of the uppermost one of the plurality of first insulating layers.

9. The method of claim 2, further comprising:

partially etching the sacrificial spacer to expose a portion of a sidewall of an uppermost one of the plurality of first insulating layers relative to a surface of the substrate; and forming a second insulating layer on the sidewall of the semiconductor channel layer.

10. The method of claim 9, wherein forming the second insulating layer further comprises forming the second insulating layer on the portion of the sidewall of the uppermost one of the plurality of first insulating layers.

* * * * *